US008252669B2

(12) United States Patent
Toriumi et al.

(10) Patent No.: US 8,252,669 B2
(45) Date of Patent: Aug. 28, 2012

(54) METHOD FOR MANUFACTURING MICROCRYSTALLINE SEMICONDUCTOR FILM BY PLASMA CVD APPARATUS

(75) Inventors: Satoshi Toriumi, Kanagawa (JP); Ryota Tajima, Kanagawa (JP); Takashi Ohtsuki, Kanagawa (JP); Tetsuhiro Tanaka, Kanagawa (JP); Ryo Tokumaru, Kanagawa (JP); Mitsuhiro Ichijo, Kanagawa (JP); Kazutaka Kuriki, Kanagawa (JP); Tomokazu Yokoi, Kanagawa (JP); Toshiya Endo, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 18 days.

(21) Appl. No.: 12/860,175

(22) Filed: Aug. 20, 2010

(65) Prior Publication Data
US 2011/0053358 A1    Mar. 3, 2011

(30) Foreign Application Priority Data

Aug. 25, 2009 (JP) ................................. 2009-194801
Aug. 25, 2009 (JP) ................................. 2009-194849
Aug. 25, 2009 (JP) ................................. 2009-194852

(51) Int. Cl.
*H01L 21/20* (2006.01)
*H01L 21/36* (2006.01)

(52) U.S. Cl. ............ 438/488; 438/96; 438/97; 136/255; 136/258

(58) Field of Classification Search ................... 438/96, 438/97, 488; 136/255, 258
See application file for complete search history.

(56) References Cited

U.S. PATENT DOCUMENTS

| 4,409,134 | A | 10/1983 | Yamazaki |
| 4,854,263 | A | 8/1989 | Chang et al. |
| 5,314,724 | A * | 5/1994 | Tsukune et al. ............... 427/489 |
| 6,162,667 | A * | 12/2000 | Funai et al. ................... 438/166 |
| 7,125,758 | B2 | 10/2006 | Choi et al. |
| 7,754,294 | B2 | 7/2010 | Choi et al. |
| 2005/0103377 | A1 * | 5/2005 | Saneyuki et al. ............. 136/258 |
| 2005/0233092 | A1 | 10/2005 | Choi et al. |
| 2005/0251990 | A1 | 11/2005 | Choi et al. |
| 2005/0255257 | A1 | 11/2005 | Choi et al. |
| 2006/0005771 | A1 | 1/2006 | White et al. |
| 2006/0228496 | A1 | 10/2006 | Choi et al. |

(Continued)

FOREIGN PATENT DOCUMENTS
EP    1 595 974 A2    11/2005
(Continued)

*Primary Examiner* — Phuc Dang
(74) *Attorney, Agent, or Firm* — Nixon Peabody LLP; Jeffrey L. Costellia

(57) ABSTRACT

An object of one embodiment of the present invention is to provide a technique for manufacturing a dense crystalline semiconductor film (e.g., a microcrystalline semiconductor film) without a cavity between crystal grains. A plasma region is formed between a first electrode and a second electrode by supplying high-frequency power of 60 MHz or less to the first electrode under a condition where a pressure of a reactive gas in a reaction chamber of a plasma CVD apparatus is set to 450 Pa to 13332 Pa, and a distance between the first electrode and the second electrode of the plasma CVD apparatus is set to 1 mm to 20 mm; crystalline deposition precursors are formed in a gas phase including the plasma region; a crystal nucleus of 5 nm to 15 nm is formed by depositing the deposition precursors; and a microcrystalline semiconductor film is formed by growing a crystal from the crystal nucleus.

11 Claims, 28 Drawing Sheets

U.S. PATENT DOCUMENTS

| | | |
|---|---|---|
| 2006/0236934 A1 | 10/2006 | Choi et al. |
| 2007/0227666 A1* | 10/2007 | Matsumoto et al. ..... 156/345.47 |
| 2008/0020146 A1 | 1/2008 | Choi et al. |
| 2009/0072237 A1 | 3/2009 | Yamazaki et al. |
| 2010/0307573 A1* | 12/2010 | Matsumoto et al. .......... 136/255 |
| 2011/0053311 A1 | 3/2011 | Hiura et al. |
| 2011/0053357 A1 | 3/2011 | Yamazaki |

FOREIGN PATENT DOCUMENTS

| | | |
|---|---|---|
| JP | 60-037118 | 2/1985 |
| JP | 7-193017 | 7/1995 |
| JP | 2000-252218 | 9/2000 |
| JP | 2002-237459 | 8/2002 |
| JP | 2002-237460 | 8/2002 |
| JP | 2002-237461 | 8/2002 |
| JP | 2003-318000 | 11/2003 |
| JP | 2004-296526 | 10/2004 |
| JP | 2005-259853 | 9/2005 |
| JP | 2005-328021 | 11/2005 |
| JP | 2006-032720 | 2/2006 |
| JP | 2007-129009 | 5/2007 |

* cited by examiner 143  144  141

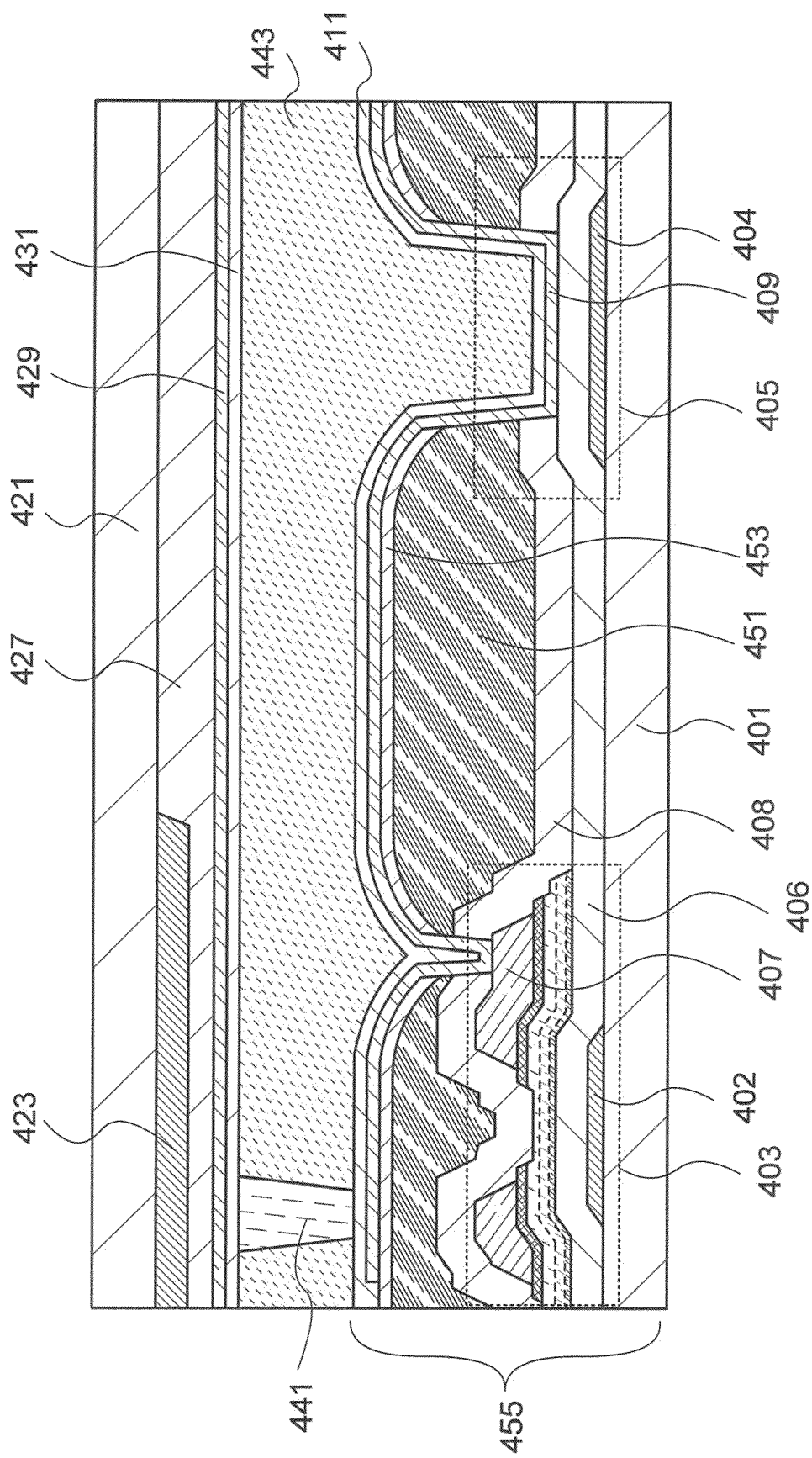

FIG. 25
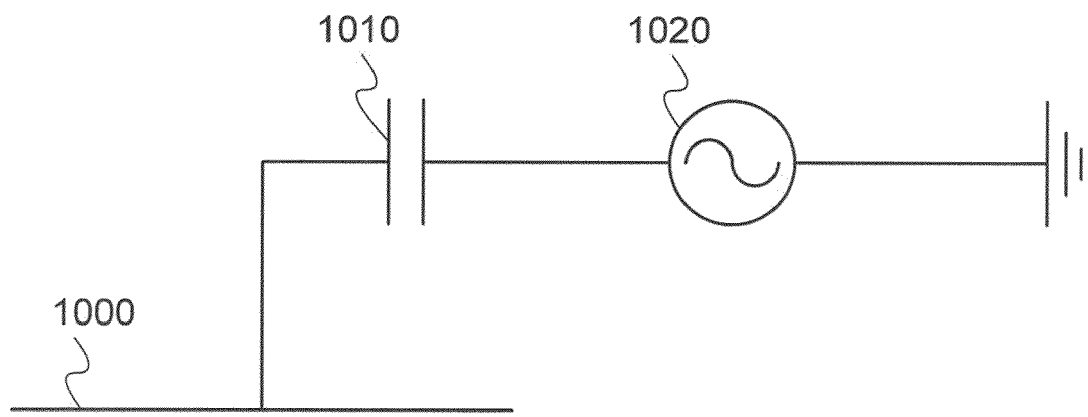
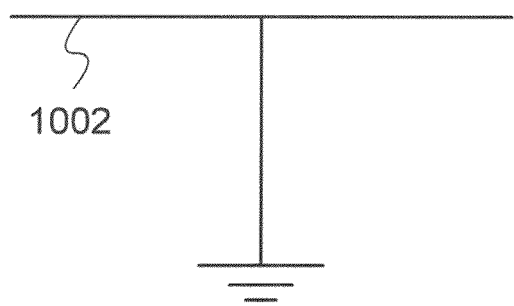

METHOD FOR MANUFACTURING MICROCRYSTALLINE SEMICONDUCTOR FILM BY PLASMA CVD APPARATUS

BACKGROUND OF THE INVENTION

1. Field of the Invention

An embodiment of the present invention relates to a method for manufacturing a crystalline semiconductor film using a vapor deposition method and a method for manufacturing a semiconductor device including the crystalline semiconductor film.

2. Description of the Related Art

In a technical field of thin film transistors, a plasma chemical vapor deposition (plasma CVD) method which is used for manufacture of a semiconductor film is employed, and various improvements have been attempted to manufacture products with higher yields.

For example, an electrode structure of a plasma CVD apparatus is disclosed where an electrode for generating plasma in a reaction chamber is provided with cylindrical recessed portions and the cylindrical recessed portions are connected to each other through a groove which is narrower than the diameter of the cylindrical recessed portion (see Patent Document 1).

In addition, disclosed is a gas diffuser plate (a so-called shower plate) having a gas flow path, the diameter, depth, and surface area of which gradually increase toward an edge portion from a center portion, for dispersing gas in a treatment chamber and forming films uniform in thickness and characteristics (see Patent Document 2). As another example, disclosed is a technique for forming a film under the following conditions for forming higher quality films more efficiently: a ladder-like electrode is used; an ultra high-frequency power of 100 MHz is supplied with a gas pressure of 400 Pa; and a film formation rate is set to 2 nm/second with a distance of 6 mm between the ladder-like electrode and a substrate (see Patent Document 3).

REFERENCES

[Patent Document 1] Japanese Published Patent Application No. 2004-296526
[Patent Document 2] Japanese Published Patent Application No. 2005-328021
[Patent Document 3] Japanese Published Patent Application No. 2005-259853

SUMMARY OF THE INVENTION

However, a conventional plasma CVD apparatus has a structural defect in which an electric field is locally concentrated and therefore has not been able to manufacture a dense microcrystalline semiconductor film. For example, a recessed portion or a projected portion is provided on a surface of a flat-plate electrode, whereby an electric field has been concentrated at a corner of the recessed portion or the projected portion. Therefore, a reactive gas reacts intensely in a region where an electric field is concentrated, and particles which are abnormally grown through reaction in a gas phase are included in a deposited film. Accordingly, a dense semiconductor film has not been able to be formed.

In view of the circumstances described above, an object of an embodiment of the invention disclosed in this specification is to provide the structure of a plasma CVD apparatus for manufacturing a dense semiconductor film. In addition, another object of an embodiment of the invention disclosed in this specification is to provide a technique for manufacturing a dense crystalline semiconductor film (e.g., a microcrystalline semiconductor film) without a cavity between crystal grains.

An embodiment of the present invention is a plasma CVD apparatus including an electrode supplied with electric power for generating plasma in a reaction chamber of the plasma CVD apparatus. This electrode has a common plane on a surface opposite to a substrate, and the common plane is provided with a plurality of gas supply ports for supplying a reactive gas to a reaction chamber. Projected structure bodies (projected portions) which project from the common plane, on which the gas supply ports are provided, are provided around the respective gas supply ports. These projected structure bodies are provided so as to surround the respective gas supply ports. A plurality of projected structure bodies may be provided in isolation from one another so as to surround the respective gas supply ports.

Another embodiment of the present invention is a plasma CVD apparatus including an electrode supplied with electric power for generating plasma in a reaction chamber of the plasma CVD apparatus. This electrode has a common plane on a surface opposite to a substrate, and the electrode is provided with a plurality of projected structure bodies which project from the common plane. The plurality of projected structure bodies are provided in isolation from one another. A first gas supply port is provided at the apex of the projected structure body or in the vicinity thereof. In addition, the common plane of this electrode is provided with a second gas supply port. The projected structure bodies are provided so as to surround the second gas supply port. A gas system is formed so that gas of the same kind or gases of different kinds are supplied through the first gas supply port and the second gas supply port.

The projected structure bodies which are provided so as to project from the common plane, on which the gas supply ports are provided, have the effect of increasing plasma density in the vicinity of the projected structure bodies. In this case, it is preferable that the corner of the projected structure body has a smooth curved shape without a sharp end face. In other words, the projected structure body which is provided for the electrode preferably has a shape such that a high-electric field region is not formed at the respective corners of the projected structure body, while plasma density is increased in portions where gas supply ports exist. In order to obtain such an effect, it is preferable that the projected structure body has a tapered shape and be chamfered.

A high-density plasma region is formed in the vicinity of the gas supply port of the electrode supplied with electric power for generating plasma, and the reactive gas is supplied to the region, whereby decomposition of the reactive gas is promoted, and reaction of a deposition precursor in a gas phase is increased. In order to promote such an effect, the electrode may be provided with a heating unit for encouraging the decomposition of the reactive gas.

In addition, an embodiment of the present invention is a method in which a high-density plasma region is formed in the vicinity of a gas supply port, through which a reactive gas is supplied to a reaction chamber, and in which a crystal of a semiconductor is grown in a gas phase including the high-density plasma region and depositing the crystal as a film.

It is preferable to increase a reaction pressure and reduce a distance between electrodes in order to grow a crystal of a semiconductor in a gas phase. As the reaction pressure is higher, there is an increase in the probability of collision reaction between radicals generated by glow discharge and between the radical and a reaction gas molecule. By reducing the distance between electrodes, a crystalline deposition precursor is made to reach to a deposition surface of a substrate before being enlarged, and the crystalline deposition precursor becomes a crystal nucleus on the deposition surface. Accordingly, the crystal nucleus is grown, whereby a dense microcrystalline semiconductor film having crystallinity can be formed. Then, the crystalline deposition precursor is generated in a gas phase, whereby, even in the case where a base is an insulating film, a microcrystalline semiconductor film having favorable crystallinity can be formed from the early stage of deposition.

In addition, it is preferable to add a rare gas to the reactive gas. The rare gas introduced into the reaction chamber together with the reactive gas has the effect of reducing an electron temperature and increasing electron density. Accordingly, the amount of the generated radicals is increased, a film formation rate is improved, crystallinity of a microcrystalline semiconductor film is improved, and thus the microcrystalline semiconductor film is densified. In order to obtain such an effect, it is necessary to excite the rare gas so as to be placed in a metastable state and therefore it is necessary to generate excited species of the rare gas or apply an electric field sufficient for ionization of the rare gas. For example, when argon is added as the rare gas in addition to a silane gas and a hydrogen gas which are reactive gases, a hydrogen radical increases in number and crystallinity of a microcrystalline semiconductor film can be improved.

For example, according to an embodiment of the present invention, a method for manufacturing a microcrystalline semiconductor film includes the steps of: forming a plasma region between a first electrode and a second electrode by supplying high-frequency power of 60 MHz or less to the first electrode under a condition where a pressure of a reactive gas in a reaction chamber of a plasma CVD apparatus is set to greater than or equal to 450 Pa and less than or equal to 13332 Pa, preferably, greater than or equal to 450 Pa and less than or equal to 2000 Pa, and a distance between the first electrode and the second electrode of the plasma CVD apparatus is set to greater than or equal to 1 mm and less than or equal to 20 mm, greater than or equal to 4 mm and less than or equal to 16 mm; forming crystalline deposition precursors in a gas phase including the plasma region; forming a crystal nucleus having a grain size of greater than or equal to 5 nm and less than or equal to 15 nm by depositing the deposition precursors; and forming a microcrystalline semiconductor film by growing a crystal from the crystal nucleus.

Note that in the case where the projected structure bodies are provided for the first electrode or the second electrode, a deposition precursor may be generated in such a manner that a reactive gas is supplied through a gas supply port which is provided on a common plane of the first electrode or the second electrode, or at an apex of the projected structure body or in the vicinity thereof so that the reactive gas flows into a high-density plasma region. Alternatively, a deposition precursor may be generated in such a manner that reactive gases are supplied through a first gas supply port which is provided at the apex of the projected structure body of the first electrode or the second electrode, or the vicinity thereof, and a second gas supply port which is provided on the common plane of the first electrode or the second electrode, so that the reactive gases which are supplied through their respective gas supply ports flow through the high-density plasma region.

In the above structure, the electron temperature of the high-density plasma region is reduced and electron density in the high-density plasma region is increased by adding a rare gas to the reactive gas, so that the crystallinity of the microcrystalline semiconductor film can be improved.

In addition, a thin film transistor can be manufactured in the following steps of: forming a gate electrode over a substrate; forming a gate insulating layer which covers the gate electrode; forming a microcrystalline semiconductor layer over the gate insulating layer, using the above method for manufacturing a microcrystalline semiconductor film; and forming a wiring electrically connected to the microcrystalline semiconductor layer.

The reactive gas supplied through the gas supply port is made to flow into the high-density plasma region, whereby a deposition precursor can be generated in a gas phase, and the reaction can be promoted.

In addition, a structure body is provided on a surface of a flat-plate electrode and the structure body has a shape with a curved surface at the corner, whereby a high-density plasma region can be formed without concentration of an electric field at the corner.

Moreover, collision between deposition precursors which has become nanocrystals does not occur by reducing a distance between the electrodes; thus, an amorphous component is not generated.

As described above, the number of amorphous components included in a deposited microcrystalline semiconductor film can be reduced; thus, a dense microcrystalline semiconductor film can be manufactured.

BRIEF DESCRIPTION OF THE DRAWINGS

In the accompanying drawings:

FIG. 23 illustrates a display device.

FIG. 25 illustrates a schematic structure of a film formation apparatus.

DETAILED DESCRIPTION OF THE INVENTION

Figure 1A:
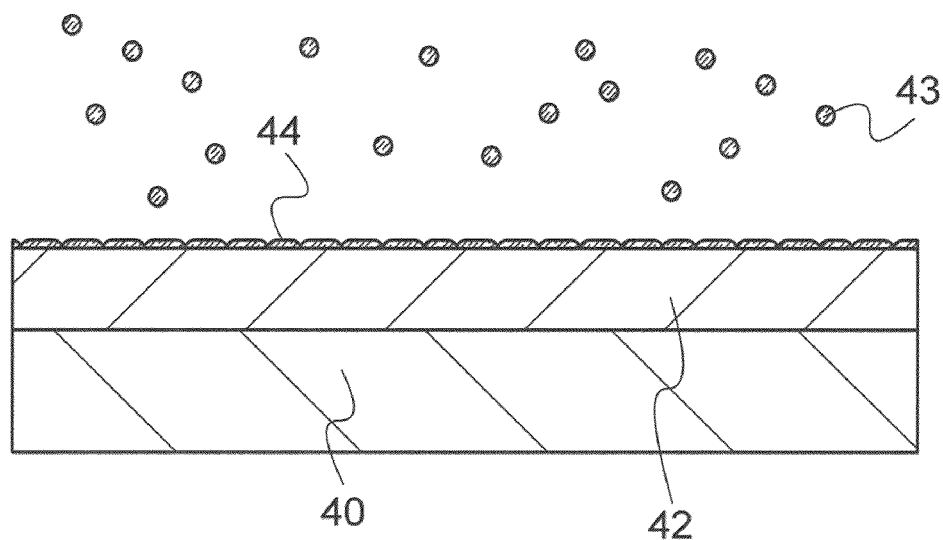
FIGS. 1A and 1B illustrate a method for manufacturing a microcrystalline semiconductor film.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in each drawing is exaggerated for clarity in some cases. Therefore, the present invention is not necessarily limited to such scales illustrated in the drawings.

Embodiment 1

In this embodiment, a method for manufacturing a microcrystalline semiconductor film having high crystallinity is described with reference to FIGS. 1A and 1B, FIG. 2, FIGS. 3A and 3B, and FIG. 4.

Figure 1B:
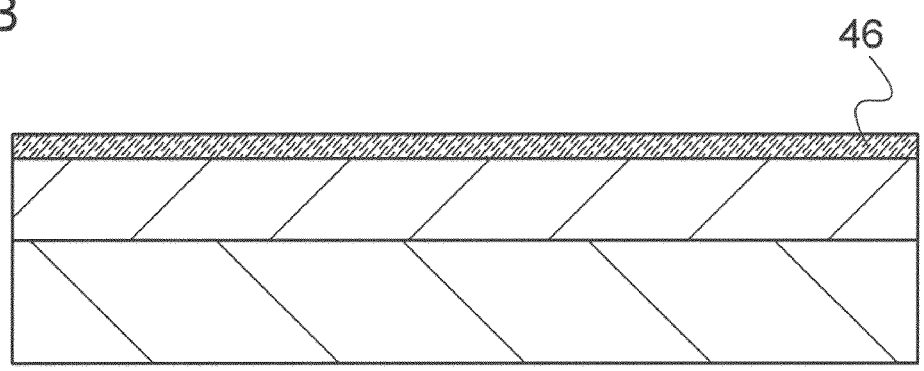

As illustrated in FIG. 1A, in a method for manufacturing a microcrystalline semiconductor film shown in this embodiment, deposition precursors 43 are formed in a gas phase, the deposition precursors 43 are deposited over a base film 42 which is formed over a substrate 40, and crystal nuclei 44 are formed. Next, as illustrated in FIG. 1B, a microcrystalline semiconductor film is formed over the crystal nuclei 44, whereby crystals are grown using the crystal nuclei 44 as nuclei so that a microcrystalline semiconductor film 46 can be formed.

The deposition precursor 43 is formed through reaction of electrons and a source gas in plasma. The pressure in a film formation chamber can be higher than a film formation pressure 300 Pa for a conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. The deposition precursor, the size of which is several nanometers, is successively reacted with a plurality of radicals; therefore, it can also be said that the deposition precursor is a higher-order radical $(SiH_n)_x$, (n=1, 2, 3) which is somewhat well ordered. In the case where the source gas is a deposition gas containing silicon or germanium, the deposition precursor 43 is formed using silicon, germanium, or silicon germanium. Therefore, the deposition precursors 43 deposited over the base film 42 become the crystal nuclei 44.

Alternatively, the deposition precursors 43 deposited over the base film 42, which are combined with an active radical which is released in plasma, become the crystal nuclei 44. The crystal nuclei 44, the size of which is 5 nm to 15 nm inclusive, are well ordered because, in a crystal grain, a crystallite which is a fine crystal that can be considered as a single crystal is included. Accordingly, when the active radicals which are released in plasma reach to the crystal nuclei 44, crystals are grown using the crystal nuclei 44 as nuclei; therefore, the microcrystalline semiconductor film 46 having high crystallinity can be formed from the interface between the base film and the crystal nuclei.

In this embodiment, the crystal nuclei 44 can be deposited densely over the base film 42 in such a manner that the pressure of a film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. That is, the adjacent crystal nuclei 44 which are in close contact can be deposited over the base film 42. Accordingly, when crystals are grown using the crystal nuclei 44 as nuclei, crystal grains become dense, and an amorphous semiconductor and a low-concentration region between the crystal grains are reduced; therefore, the microcrystalline semiconductor film 46 having high crystallinity can be formed.

Note that the base film 42 is a film having a surface over which the microcrystalline semiconductor film 46 is formed. The substrate 40 and the base film 42 can be used as appropriate.

Here, a plasma CVD apparatus capable of manufacturing the deposition precursors 43 and the crystal nuclei 44 which are features of this embodiment is described with reference to FIG. 2, FIGS. 3A and 3B, and FIG. 4.

Figure 2:
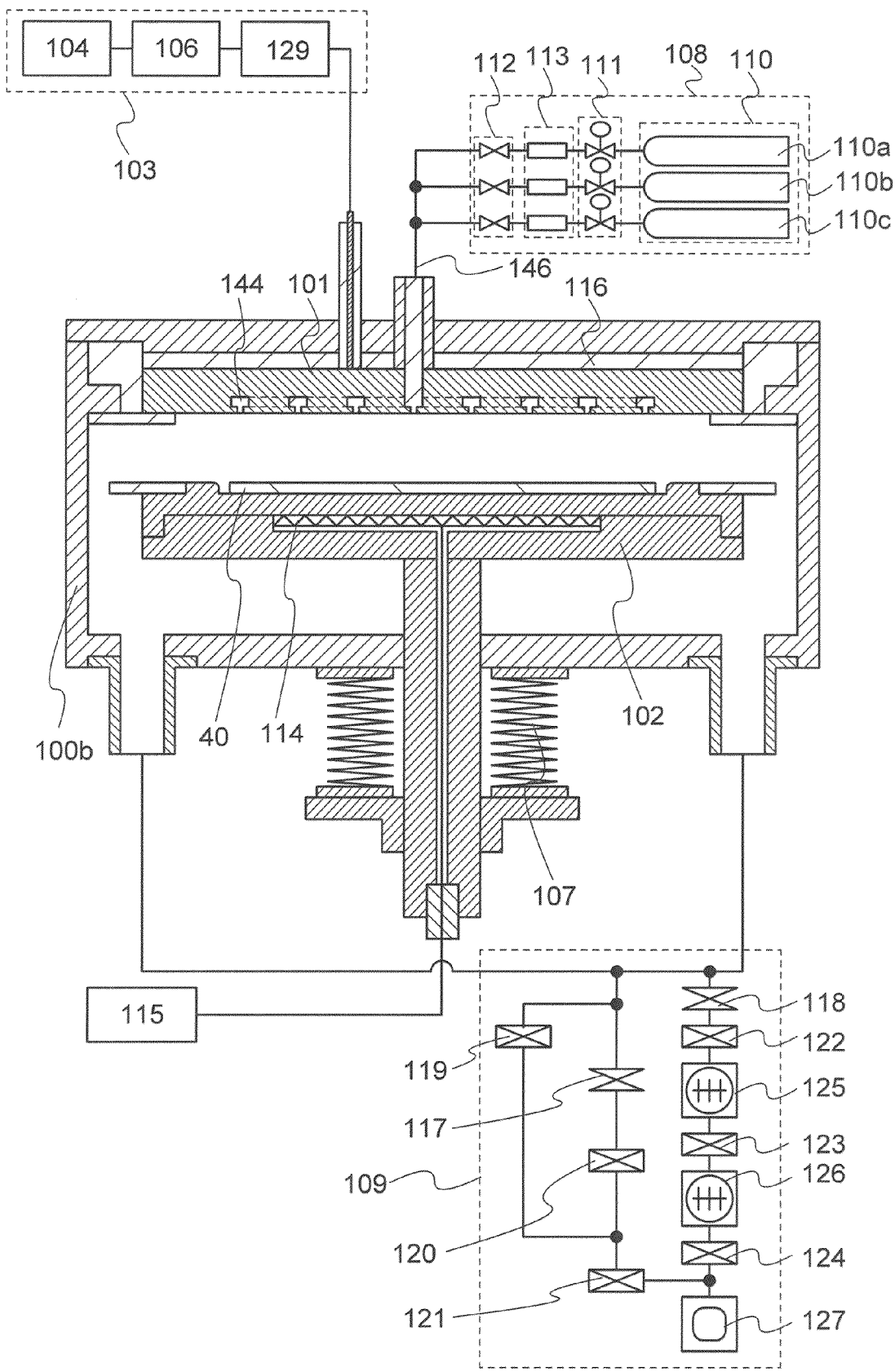
FIG. 2 illustrates an example of a plasma CVD apparatus.

FIG. 2 illustrates a structure of a plasma CVD apparatus. A reaction chamber 100b is formed using a stiff material such as aluminum or stainless steel and has a structure in which the inside of the reaction chamber 100b can be vacuum-evacuated. The reaction chamber 100b in this embodiment is formed using stainless steel in order to increase its mechanical strength, and the inside thereof is coated with aluminum by thermal spraying. In addition, it is preferable that the reaction chamber of the plasma CVD apparatus in this embodiment can be disassembled for maintenance and that the inside of the reaction chamber 100b be regularly recoated with aluminum by thermal spraying. The reaction chamber 100b is provided with a first electrode 101 (also referred to as an upper electrode) and a second electrode 102 (also referred to as a lower electrode) which is opposite to the first electrode 101.

A high-frequency power supply unit 103 is connected to the first electrode 101. The second electrode 102 is grounded, and the substrate 40 can be placed on the second electrode 102. The first electrode 101 is insulated from the reaction chamber 100b by an insulating material 116 so that high-frequency power does not leak. In the case where, for example, a ceramic material is used for the insulating material 116, it is difficult to use a knife-edge-type metal-seal flange for sealing of the upper electrode and thus, an O-ring seal is preferably used.

Although the first electrode 101 and the second electrode 102 have a is capacitively coupled (parallel plate) structure in FIG. 2, an embodiment of the present invention is not limited thereto. Another structure such as an inductively coupled structure or the like may be employed as long as the structure can generate glow discharge plasma in the reaction chamber 100b by supplying high-frequency power.

The first electrode 101 and the second electrode 102 are provided so that each surface is substantially parallel to each other. The first electrode 101 is provided with hollow portions 144 which are connected to a gas supply unit 108. The hollow portions 144 are connected to a cylinder 110a of the gas supply unit 108, which is filled with a deposition gas containing silicon or germanium, via a gas line 146. Thus, the deposition gas containing silicon or germanium is supplied to the reaction chamber 100b from the gas supply ports of the hollow portions 144.

The gas supply unit 108 includes a cylinder 110 filled with gases, a pressure adjusting valve 111, a stop valve 112, a mass flow controller 113, and the like. The gas supply unit 108 includes the cylinder 110a filled with the deposition gas containing silicon or germanium, a cylinder 110b filled with hydrogen, and a cylinder 110c filled with a dilution gas. Note that the cylinder 110c filled with the dilution gas is provided here; however, it is not necessarily required.

As examples of the deposition gas containing silicon or germanium, which fills the cylinder 110a, a silane ($SiH_4$) gas, a disilane ($Si_2H_6$) gas, a germane ($GeH_4$) gas, a digermane ($Ge_2H_6$) gas, and the like are given; however, any other deposition gas may be used.

As examples of the dilution gas which fills the cylinder 110c, rare gases such as argon, xenon, and krypton are given.

A substrate heater 114, a temperature of which is controlled by a heater controller 115, is provided in the second electrode 102. In the case where the substrate heater 114 is provided in the second electrode 102, a thermal conduction heating method is employed. For example, the substrate heater 114 may include a sheathed heater.

The high-frequency power supply unit 103 includes a high-frequency power source 104, a matching box 106, and a high-frequency cut filter 129. High-frequency power supplied from the high-frequency power source 104 is supplied to the first electrode 101.

The high-frequency power source 104 supplies high-frequency power at a frequency of 60 MHz or less. In the case where a large substrate of the seventh or later generation is used as a substrate placed on the second electrode 102, the high-frequency power source 104 preferably supplies high-frequency power at a wavelength of approximately 10 m or more. Typically, high-frequency power at a frequency of 13.56 MHz or less, for example, from 3 MHz to 13.56 MHz inclusive, is preferably supplied. When the high-frequency power source 104 supplies high-frequency power at a frequency in the above range, even if a large substrate of the seventh or later generation is placed on the second electrode 102 and glow discharging is performed, plasma can be generated uniformly without the adverse effect of a surface standing wave; therefore, a film which is uniform and has good film quality can be formed over an entire surface even in the case of the large substrate.

In addition, when high-frequency power source with a frequency of 13.56 MHz is used for the high-frequency power source 104, a variable capacitor with a capacitance of 10 pF to 100 pF is used for the high-frequency cut filter 129.

By further using a coil for the high-frequency cut filter 129, a parallel resonance circuit using a coil and a variable capacitor may be formed.

An evacuation unit 109 connected to the reaction chamber 100b has a function of vacuum evacuation and a function of controlling the inside of the reaction chamber 100b to be kept at a predetermined pressure in the case where a reactive gas is supplied. The evacuation unit 109 includes butterfly valves 117 and 118, stop valves 119 to 124, turbo molecular pumps 125 and 126, a dry pump 127, and the like. The turbo molecular pump 126 is connected to the dry pump 127 through the stop valve 124.

In the case where the reaction chamber 100b is vacuum evacuated, first, the stop valve 119 and the stop valve 121 for rough vacuum are opened and the reaction chamber 100b is evacuated with the dry pump 127. Then, the stop valve 119 is closed and the butterfly valve 117 and the stop valve 120 are opened for vacuum evacuation. In the case where ultrahigh vacuum evacuation is performed to obtain a pressure lower than $10^{-5}$ Pa in the reaction chamber 100b, the reaction chamber 100b is evacuated with the dry pump, the butterfly valve 117 and the stop valves 120 and 121 are closed, the butterfly valve 118 and the stop valves 122 to 124 are opened, and then vacuum evacuation is performed using the turbo molecular pumps 125 and 126 and the dry pump 127 which are connected in series. In addition, after the vacuum evacuation is performed, the reaction chamber 100b is preferably subjected to heat treatment so that degassing of the inner wall is performed.

A distance (also referred to as a gap) between the first electrode 101 and the second electrode 102 can be adjusted as appropriate. The gap between the electrodes can be adjusted in such a manner that the height of the second electrode 102 is changed in the reaction chamber 100b. By using a bellows 107, the gap between the electrodes can be adjusted with the reaction chamber 100b maintained in a vacuum.

Figure 3A:
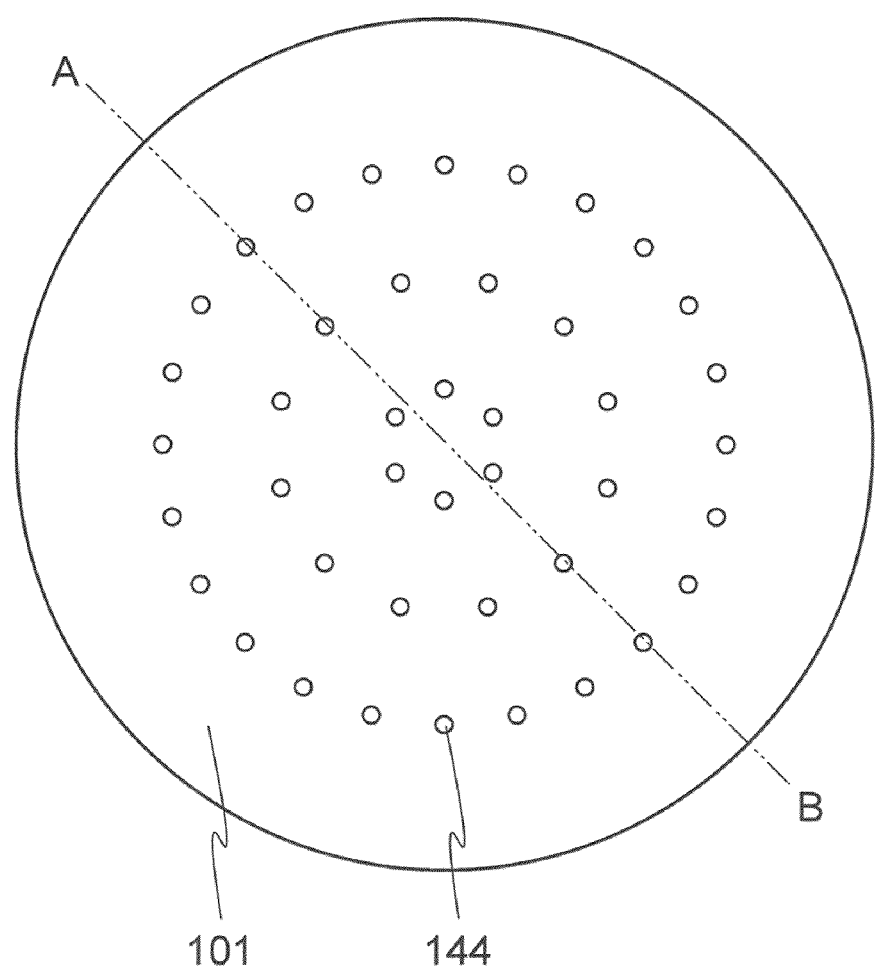
FIGS. 3A and 3B illustrate a shape of an upper electrode of the plasma CVD apparatus.

Here, one mode of the shape of the first electrode 101 is described with reference to FIGS. 3A and 3B. FIG. 3A is a plan view of the first electrode 101 seen from the second electrode 102 side, and FIG. 3B is a cross-sectional view taken along A-B in FIG. 3A.

Figure 3B:
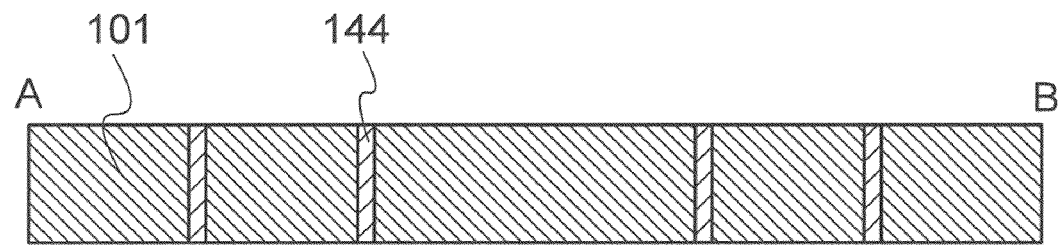

As illustrated in FIGS. 3A and 3B, the gas supply ports of the hollow portions 144 are arranged regularly, preferably, at regular intervals in the first electrode 101. The diameter of the gas supply port may be uniform or different in the entire surface of the first electrode 101. Note that the arrangements of the gas supply ports in the figures are merely an example, and one embodiment of the disclosed invention should not be construed as being limited to this example. For example, the gas supply ports may be provided only in the center of the first electrode 101.

Figure 4:
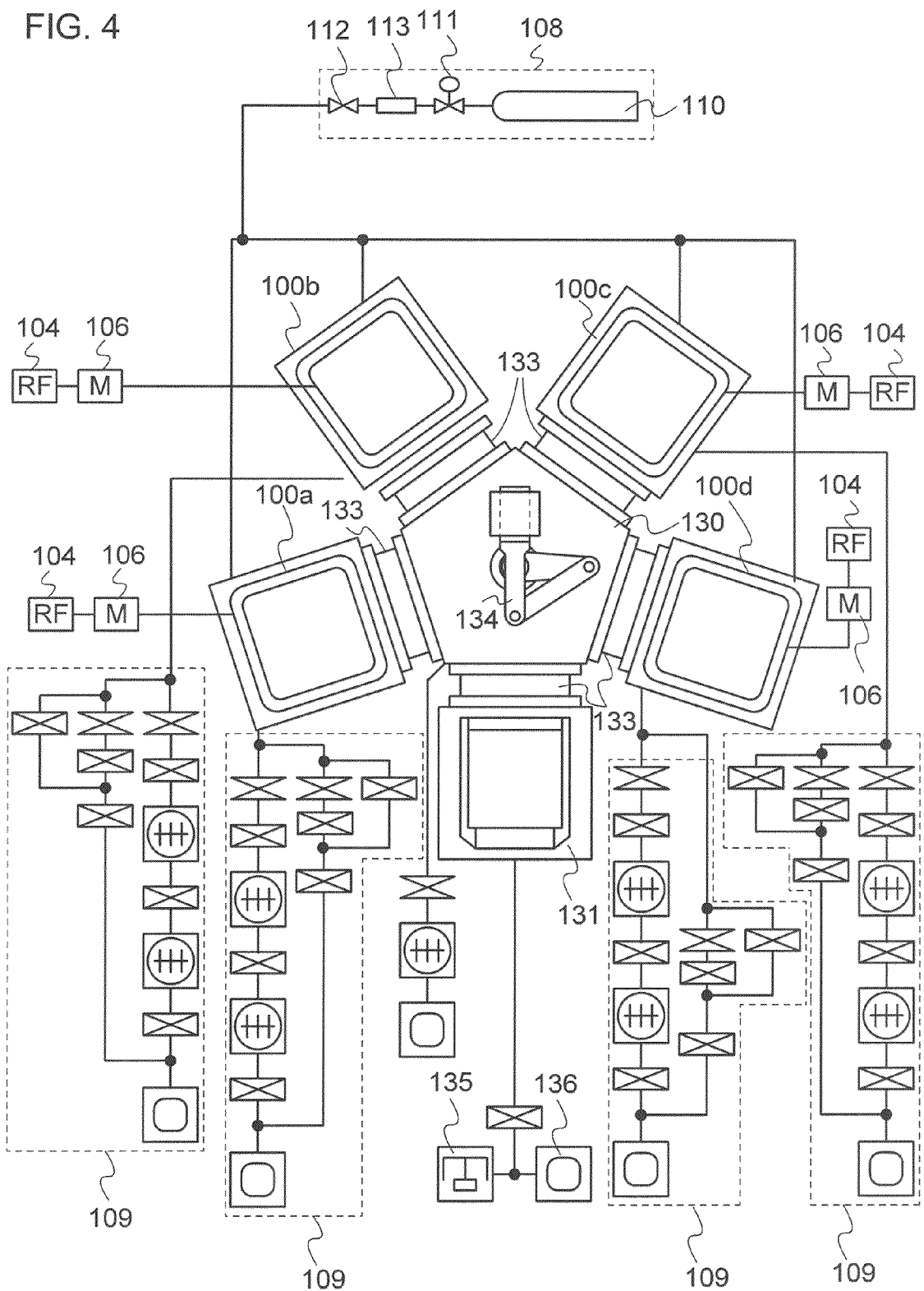
FIG. 4 illustrates an example of a film formation apparatus.

FIG. 4 is a schematic diagram illustrating one mode of a multi-chamber plasma CVD apparatus provided with a plurality of reaction chambers. This apparatus is provided with a common chamber 130, a load/unload chamber 131, a first reaction chamber 100a, the second reaction chamber 100b, a third reaction chamber 100c, and a fourth reaction chamber 100d. This multi-chamber plasma CVD apparatus is a single-wafer processing type in which a substrate set in a cassette in the load/unload chamber 131 is carried in and out of each reaction chamber by a transport mechanism 134 of the common chamber 130. A gate valve 133 is provided between the common chamber 130 and each reaction chamber so that treatments conducted in the reaction chambers do not interfere with each other.

The reaction chambers are separately used for forming different kinds of thin films. Needless to say, the number of the reaction chambers is not limited to four and can be increased or decreased as needed. One film may be formed in one reaction chamber, or a plurality of films may be fainted in one reaction chamber.

The evacuation unit 109 is connected to each reaction chamber. The evacuation unit is not limited to a combination of the vacuum pumps illustrated in FIG. 2 and FIG. 4, and another vacuum pump can be used as long as the vacuum pump can perform evacuation to a degree of vacuum within the range of approximately $10^{-5}$ Pa to $10^{-1}$ Pa.

In addition to a dry pump 136, a cryopump 135 that can perform ultra-high vacuum evacuation may be connected to the load/unload chamber 131. By using the cryopump 135, the load/unload chamber 131 can be evacuated to an ultra-high vacuum of a pressure lower than $10^{-5}$ Pa in the load/unload chamber 131 can be obtained, and the concentration of impurities contained in a film deposited on a substrate in the reaction chamber can be reduced. Further, the pumping speed of the cryopump 135 is higher than that of either the turbo molecular pump or the dry pump; therefore, by connecting the cryopump 135 to the load/unload chamber 131 that is opened and closed frequently, the throughput can be increased.

The gas supply unit 108 includes the cylinders 110 filled with gases, the pressure adjusting valve 111, the stop valve 112, the mass flow controller 113, and the like. Although not illustrated here, the cylinders filled with gases includes a cylinder filled with a deposition gas containing silicon or germanium, a cylinder filled with hydrogen, the cylinder filled with a dilution gas, a cylinder filled with a reactive gas (e.g., an oxidizing gas, a nitriding gas, or a hydrogen gas), a cylinder filled with gases containing an impurity element imparting one conductivity type, and the like.

A high-frequency power supply unit for generating plasma is connected to each reaction chamber. The high-frequency power supply unit includes at least the high-frequency power source 104 and the matching box 106.

The reaction chambers can be separately used for forming different kinds of thin films. Since the optimal deposition temperatures vary between thin films, the reaction chambers are separately used so that the deposition temperatures of films to be formed can be separately controlled easily. In addition, the same kind of films can be deposited repeatedly; therefore, the influence of residual impurities due to a film which has been formed can be eliminated.

In the reaction chamber 100b of the plasma CVD apparatus illustrated in FIG. 2, a mean free path of a molecule becomes short, a probability that an electron collides with a gas molecule in plasma is increased, and a reaction probability is increased in the following manner: the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa; and hydrogen and a deposition gas containing silicon or germanium is introduced into the reaction chamber as a source gas to supply high-frequency power to the first electrode 101 so that glow discharge is generated. Therefore, an active radical is easily generated in plasma. In particular, short-life active radicals are generated in a region where plasma density is high and are reacted in a gas phase, whereby nuclei are formed. When nuclei are formed, successive reaction proceeds in a gas phase, which promotes a deposition precursor of nanometer size. Such discharge at a pressure higher than the film formation pressure of the conventional microcrystalline semiconductor film is easily generated in the case where a distance between the first electrode 101 and the second electrode 102 is short, which is typically greater than or equal to 1 mm and less than or equal to 20 mm, preferably greater than or equal to 4 mm and less than or equal to 16 mm, and more preferably, greater than or equal to 5 mm and less than or equal to 10 mm. Note that, here, the distance between the first electrode 101 and the second electrode 102 refers to an interval between the first electrode 101 and the second electrode 102.

When the nucleus of the deposition precursor is generated, an active radical adheres to the nucleus and the deposition precursor is grown. A radical necessary for generation of a nucleus is consumed when the nucleus is grown; therefore, generation of another nucleus is suppressed. Thus, as well as the pressure of the to reaction chamber, time of supplying electric power (e.g., a pulse width and a pulse repetition rate in pulse wave power) to the first electrode 101, a gas flow rate, and exhaust velocity of gas are controlled, whereby the size and the generation amount of the deposition precursors can be controlled.

The composition of a deposition precursor can be controlled by selecting the gas to be supplied because radicals generated in plasma are different depending on kinds of gas. Therefore, a deposition precursor having a multilayer structure can also be generated by changing the kind of deposition gas during growth of a deposition precursor. Note that in the case of a deposition gas containing silicon or germanium as a source gas, a deposition precursor is formed using silicon, germanium, or silicon germanium.

Since the deposition precursor is likely to be charged negatively in plasma, the deposition precursor has a property in which cohesion of the deposition precursors are suppressed by Coulomb force. Therefore, in accordance with this embodiment, a deposition precursor which is substantially monodispersed can be obtained with high density.

In the deposition precursor, temperature as well as kinds of radical that contributes to growth is important for the structure thereof. The temperature of the deposition precursor is determined under the influence of the following; release or absorption of incident ions on a surface thereof (a surface of the deposition precursor), kinetic energy of electrons, or energy due to chemical reaction on the surface; heating or cooling due to collision of molecules of a neutral gas; or the like.

For example, in the case where a deposition precursor of silicon is generated, a crystalline structure can be obtained by diluting silane ($SiH_4$) with hydrogen. It is considered that this mechanism is similar to that of surface reaction that occurs in the case where a microcrystalline silicon film is deposited, and that reaction between hydrogen and a radical which is generated after dissociation of silane is mainly contributed to generation of the deposition precursor of silicon, which has a crystalline structure.

Accordingly, well-ordered deposition precursors which are formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Therefore, a microcrystalline semiconductor film having high crystallinity can be formed from the interface between the base film and the crystal nuclei. Furthermore, generation rate of a deposition precursor is increased when the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be improved.

Embodiment 2

In this embodiment is described a structure applicable to the first electrode of the plasma CVD apparatus shown in Embodiment 1, with reference to FIG. 5, FIGS. 6A and 6B, FIGS. 7A and 7B, FIGS. 8A and 8B, FIGS. 9A and 9B, and FIGS. 10A to 10D.

Figure 5:
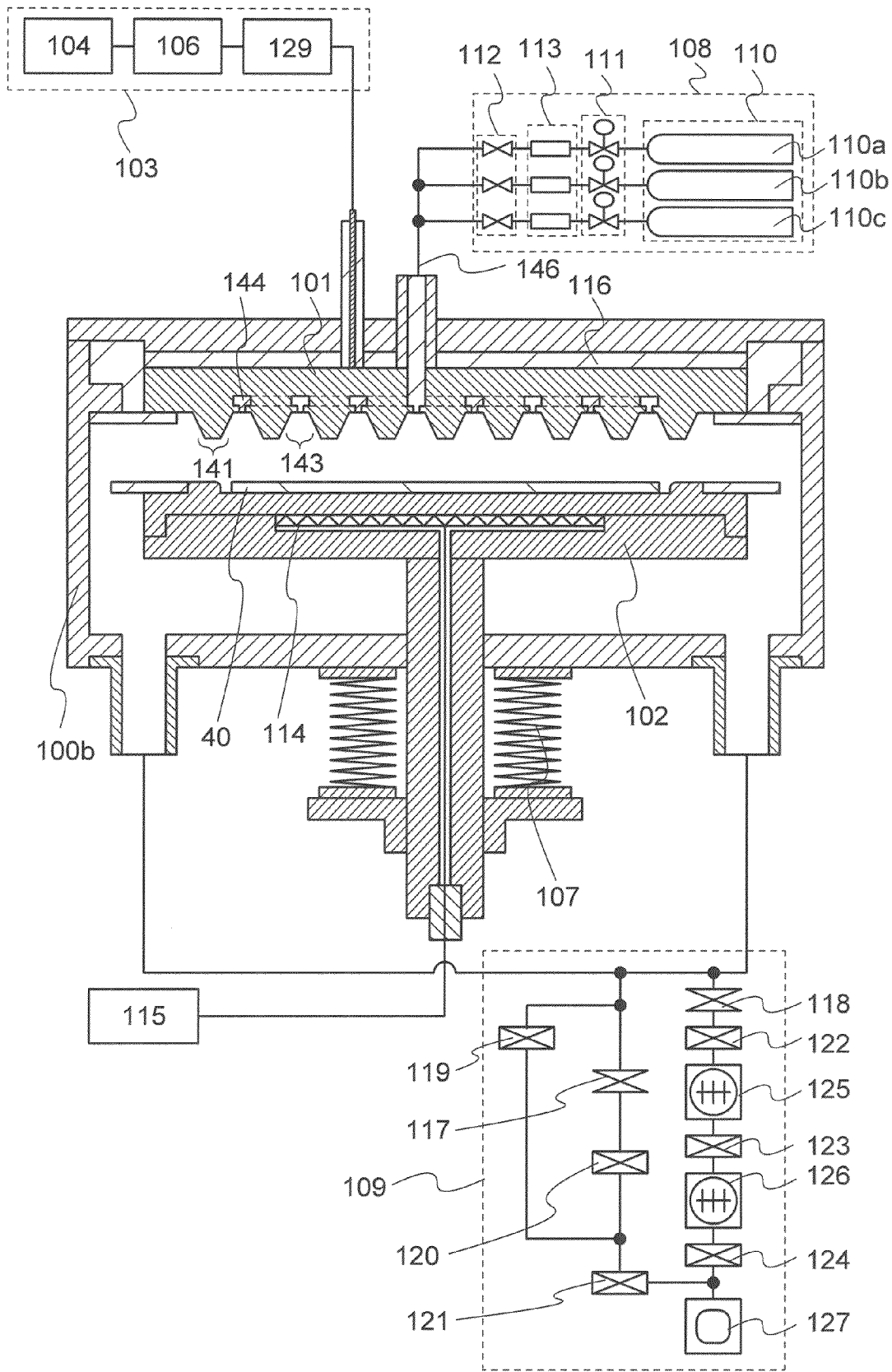
FIG. 5 illustrates an example of a plasma CVD apparatus.

In a structure of the reaction chamber of the plasma CVD apparatus illustrated in FIG. 5, the first electrode 101 is an electrode that is projected and depressed by having projected portions 141 and depressed portions 143 arranged regularly, preferably at regular intervals. In other words, the projected portions 141 formed using projected structure bodies are arranged regularly, preferably at regular intervals. The hollow portions 144 connected to the gas supply unit 108 are provided in the depressed portions 143 of the first electrode 101. In other words, the depressed portions 143 form a common plane where gas supply ports are provided. Here, the region having the gas supply port near a surface of the second electrode 102 is regarded as the projected portion 141, and the region having the gas supply port distant from the surface of the second electrode 102 is regarded as the depressed portion 143.

The hollow portions 144 are connected to the cylinder 110*a* of the gas supply unit 108 via the gas line 146, which is filled with a deposition gas containing silicon or germanium. Therefore, the deposition gas containing silicon or germanium is supplied to the reaction chamber 100*b* through the gas supply ports of the hollow portions 144 provided in the depressed portions 143.

Figure 6A:
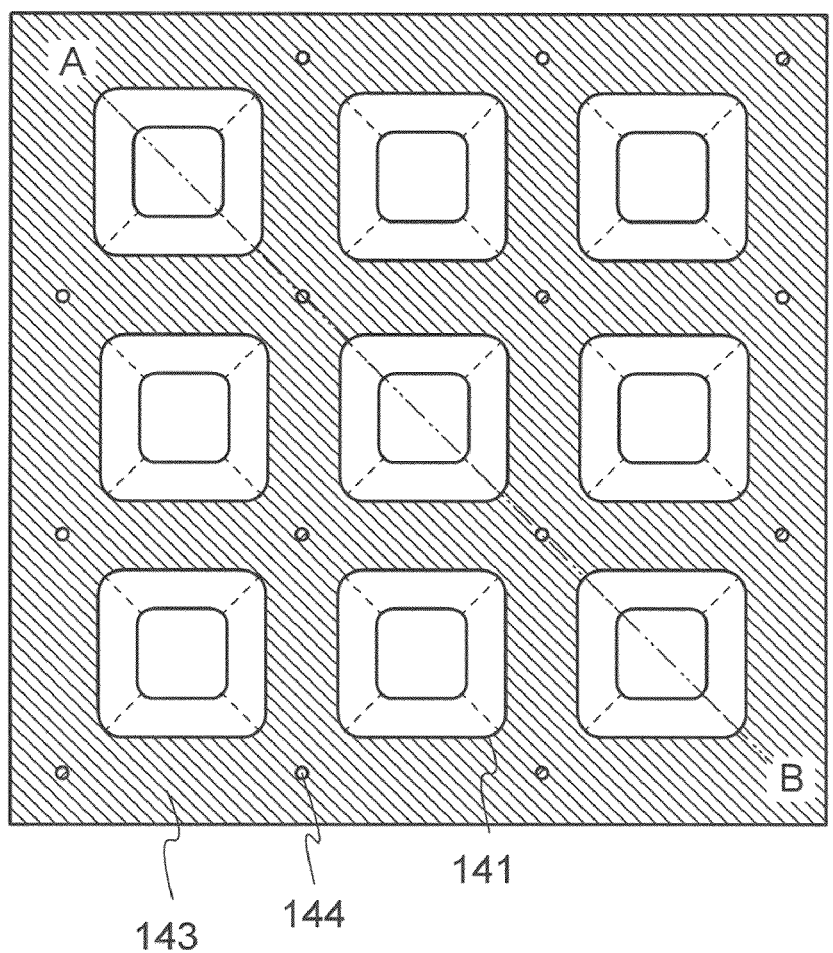
FIGS. 6A and 6B illustrate a shape of an upper electrode of the plasma CVD apparatus.
Figure 6B:
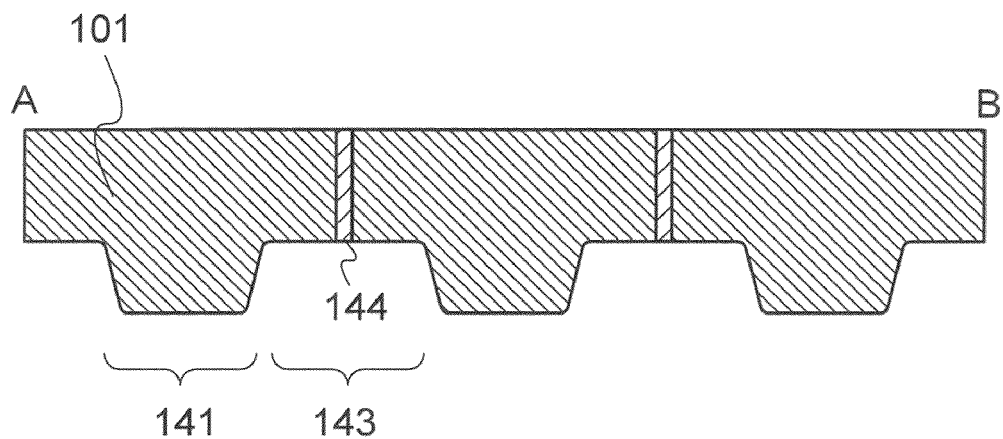
Figure 7A:
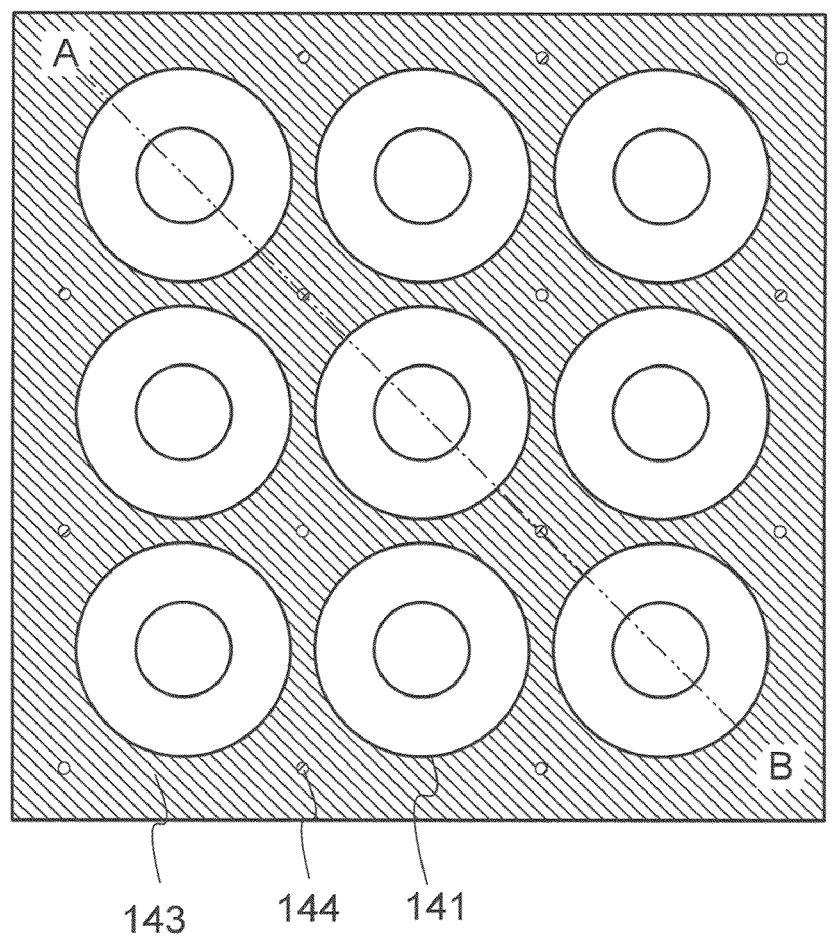
FIGS. 7A and 7B illustrate a shape of an upper electrode of the plasma CVD apparatus.
Figure 7B:
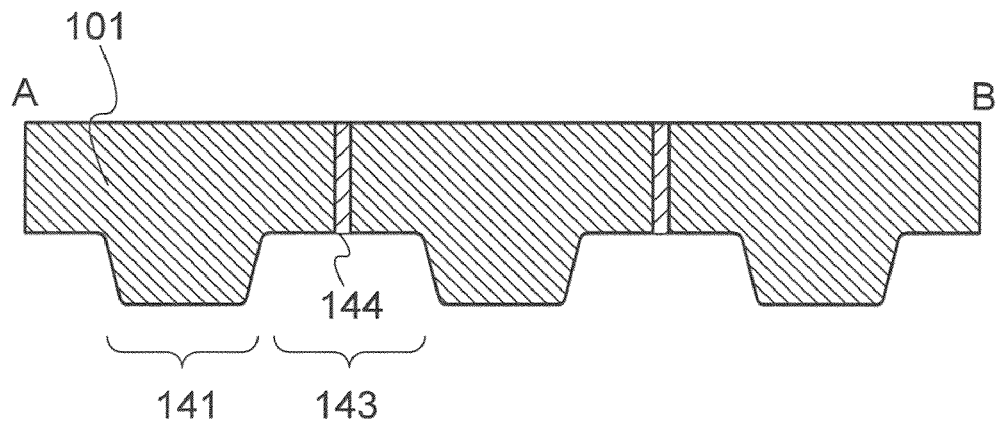

Here, examples of the shape of the first electrode 101 are described with reference to FIGS. 6A and 6B and FIGS. 7A and 7B. FIGS. 6A and 7A are plan views of the first electrode 101 seen from the second electrode 102 side. FIGS. 6B and 7B are cross-sectional views taken along line A-B in FIGS. 6A and 7A. Note that in FIGS. 6A and 7A, regions which are depressed (that is, depressed portions) are shown in fine hatching for clear illustration of the state of the projection and depression.

As illustrated in FIGS. 6A and 6B, the gas supply ports of the hollow portions 144 formed in the depressed portions 143 are provided regularly, preferably at regular intervals. The gas supply ports of the hollow portions 144 are provided in the depressed portions 143. The plurality of projected portions 141 are separated from one another, and the depressed portions 143 form a continuous plane (common plane). In other words, there are projected structure bodies provided so as to project over the common plane where the gas supply ports are provided, and the projected structure bodies are each isolated. Here, the projected portions 141 each have the shape of a truncated quadrangular pyramid. Note that the shape of the projected portions 141 is not limited thereto and may be of a truncated triangular pyramid, a truncated pentagonal pyramid, a truncated hexagonal pyramid, or any other truncated polygonal pyramid as appropriate. Preferably, an edge and a corner of the projected portion 141 are roundly chamfered to form a truncated polygonal pyramid with the corners rounded. When the rounded portions of the edges and corners of the projected portion 141 and the depressed portions 143 are chamfered, overconcentration of an electric field can be reduced. Accordingly, local arc discharge can be suppressed, leading to less generation of particles.

As illustrated in FIGS. 7A and 7B, the projected portions 141 may alternatively each have the shape of a truncated cone. Further, the gas supply ports of the hollow portions 144 are provided in the depressed portions 143. Note that the rounded portion of the edge of the projected portion 141 is preferably chamfered to form a truncated cone with the corners rounded. When the projected portions 141 each have the shape of a truncated cone and the rounded portions of the edges of the projected portions 141 and the depressed portions 143 are chamfered, overconcentration of an electric field can be reduced. Accordingly, local arc discharge can be suppressed, leading to less generation of particles.

Figure 8A:
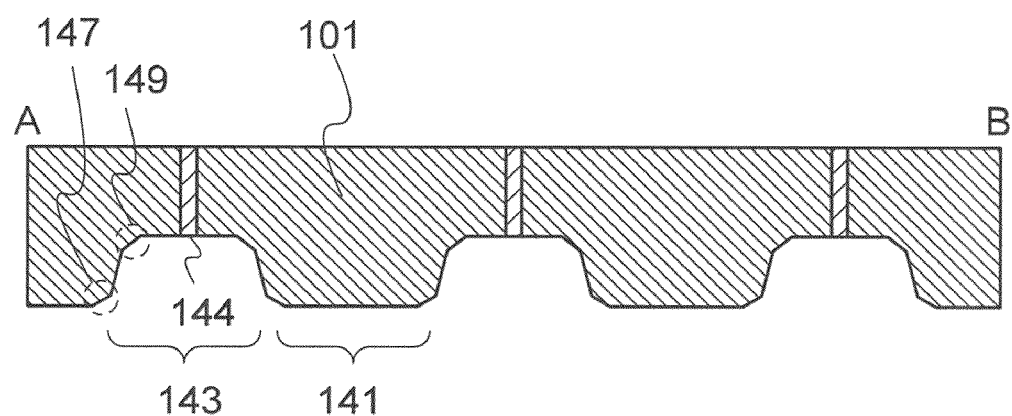
FIGS. 8A and 8B each illustrate a shape of an upper electrode of the plasma CVD apparatus.

Although the projected portions 141 each have the shape of a polygonal pyramid or a truncated cone with the corners rounded in FIGS. 6A and 6B and FIGS. 7A and 7B, the edge and corner of the truncated polygonal pyramid or truncated cone can be chamfered without being rounded as illustrated in FIG. 8A. Typically, the projected portion 141 can be tapered so that a corner 147 can be chamfered. Further, the depressed portion 143 can be tapered so that a corner 149 can be chamfered. When the corners 147 and 149 are chamfered in the projected portion 141 and the depressed portion 143, concentration of an electric field at these portions can be reduced, leading to less generation of particles.

Figure 8B:
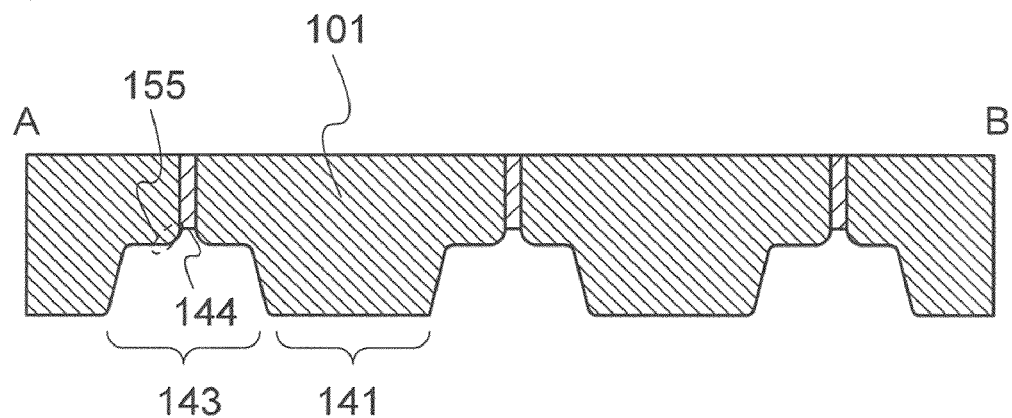

Further, in the depressed portion 143 illustrated in FIGS. 6A and 6B and FIGS. 7A and 7B, an edge and a corner 155 in the periphery of the gas supply port of the hollow portion 144 may be rounded as illustrated in FIG. 8B. The periphery of the gas supply port of the hollow portion 144 may be chamfered without being rounded, although not illustrated. Accordingly, concentration of an electric field in the periphery of the gas supply port can be reduced, leading to less generation of particles.

Figure 10A:
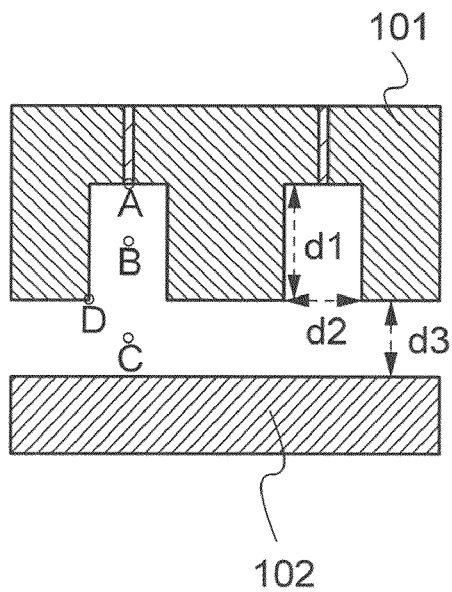
FIGS. 10A to 10D each illustrate the intensity of plasma in the plasma CVD apparatus.
Figure 10B:
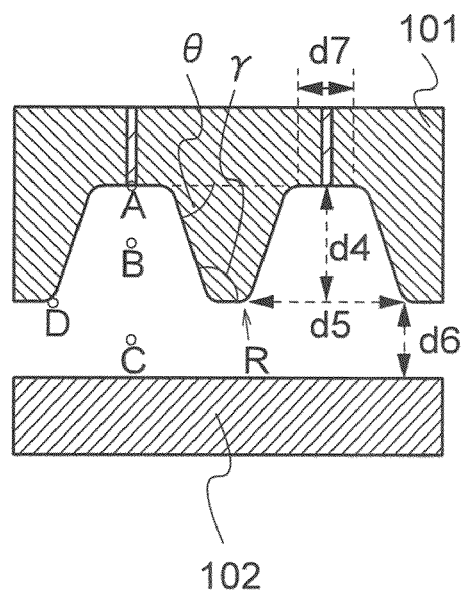
Figure 10C:
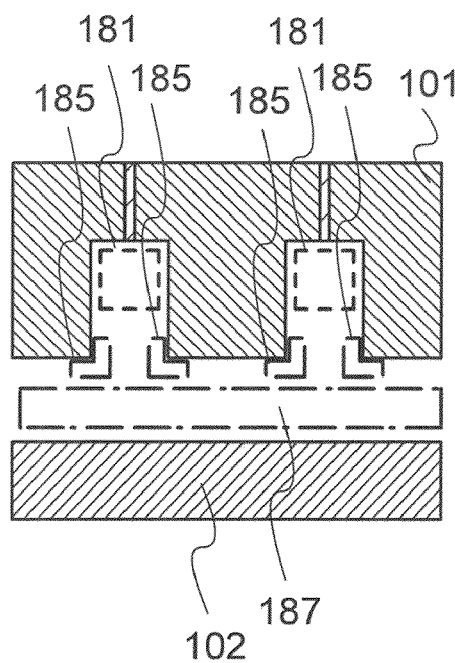
Figure 10D:
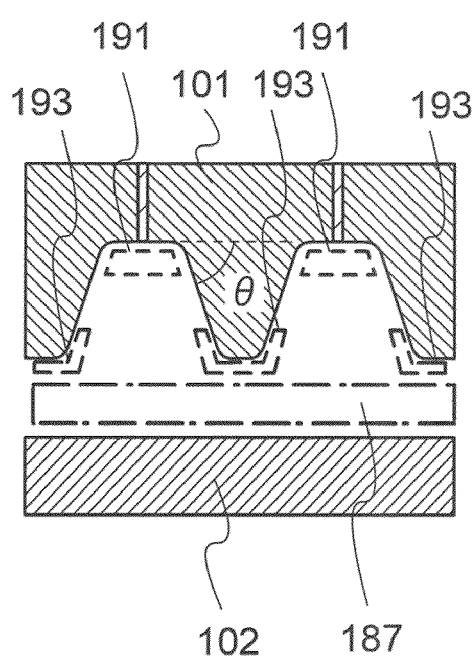

Here, a cross-sectional shape of the first electrode 101 and electric field intensity are described using FIGS. 10A to 10D. FIGS. 10A and 10B each show the cross-sectional shape of first electrode 101 used for calculation. FIGS. 10C and 10D each show the electric field intensity calculated with an electric field simulator.

FIG. 10A illustrates the shape (first shape) in which a side surface of the projected portion of the first electrode 101 is perpendicular to a surface of the depressed portion. FIG. 10B illustrates the shape (second shape) in which the cross-sectional shape of the projected portion of the first electrode 101 is tapered: when the angle between the side surface of the projected portion of the first electrode 101 and the surface of the depressed portion in the projected portion is θ and the angle between a surface of an apex and side surface of the projected portion is γ, θ is less than 90° and γ is more than 90°. In the case where the cross section of the projected portion is tapered (in the case of FIG. 10B), the cross-sectional area monotonically decreases toward the apex.

In FIG. 10A, the depth of the depressed portion, d1, is 40 mm, the distance between adjacent projected portions, d2, is 20 mm, and the distance between the first electrode 101 and the second electrode 102, d3, is 20 mm.

In FIG. 10B, the depth of the depressed portion, d4, is 40 mm, the distance between the apexes of adjacent projected portions on the second electrode 102 side, d5, is 60 mm, and the distance between the first electrode 101 and the second electrode 102, d6, is 20 mm. Note that the diameter of the plane on the depressed portion where the gas supply ports are formed, d7, is 20 mm. Further, the curvature radius of the edge and corner of the projected portion, R, is 10 mm.

Table 1 shows the results of calculation of the electric field intensities in the vicinity of the gas supply port, A, the vicinity of the center of the depressed portion, B, the vicinity of the second electrode 102 on the depressed portion side, C, and the close vicinity of the projected portion in the first electrode 101, D, which are illustrated in each of FIGS. 10A and 10B. In Table 1, the electric field intensity in the vicinity of the projected portion in the first electrode 101 illustrated in FIG. 10A, which is denoted by D, is set to 1, and the electric field intensities in the other regions are normalized. At this time, the frequency of power supplied to the first electrode 101 is 13.56 MHz.

TABLE 1

|  | A | B | C | D |
|---|---|---|---|---|
| First Shape | 0.0006 | 0.01 | 0.6 | 1 |
| Second Shape | 0.01 | 0.1 | 0.6 | 0.9 |

FIG. 10C shows distribution of the electric field intensities calculated from FIG. 10A. FIG. 10D shows distribution of the electric field intensities calculated from FIG. 10B.

In FIG. 10C, regions 181 having an extremely low electric field are formed in the vicinity of the surfaces of the depressed portion between the adjacent projected portions (the vicinity of A), while regions 185 having a high electric field are formed between the projected portion and plasma 187 (the vicinity of the projected portion of the first electrode 101 (the vicinity of D)).

In contrast, regions 191 having a low electric field are formed in the depressed portions and regions 193 having a moderate electric field are formed in the vicinity of the side surfaces of the apexes of the adjacent projected portions in FIG. 10D, because the more electric fields pass through up to the surface of the depressed portion as the taper angle θ decreases.

Comparison between FIGS. 10C and 10D indicate that the shape illustrated in FIG. 10B allows a decrease in the electric field at the apex of the projected portion, especially at the edge and corner of the projected portion, thereby reducing plasma damage to the surface of the substrate 40 and reducing generation of particles which is caused by arc discharge. Further, as the region of the surface of the apex of the projected portion is decreased more in size, a region in which the density of plasma is higher can be formed in the vicinity of the apex of the projected portion.

Since the first electrode shown in this embodiment has the projected portions 141 and the depressed portions 143, a high-density plasma region can be formed at the apex of the projected portion 141. Thus, in the high-density plasma region, reactivity can be increased to promote generation of nuclei and deposition precursors. Accordingly, as in Embodiment 1, well-ordered deposition precursors which are formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Therefore, a microcrystalline semiconductor film having high crystallinity can be formed from the interface between the base film and the crystal nuclei. Furthermore, generation rate of a deposition precursor is increased in such a manner that a high-density plasma region is formed in the vicinity of the projected portions, and the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be increased.

Embodiment 3

Figure 9A:
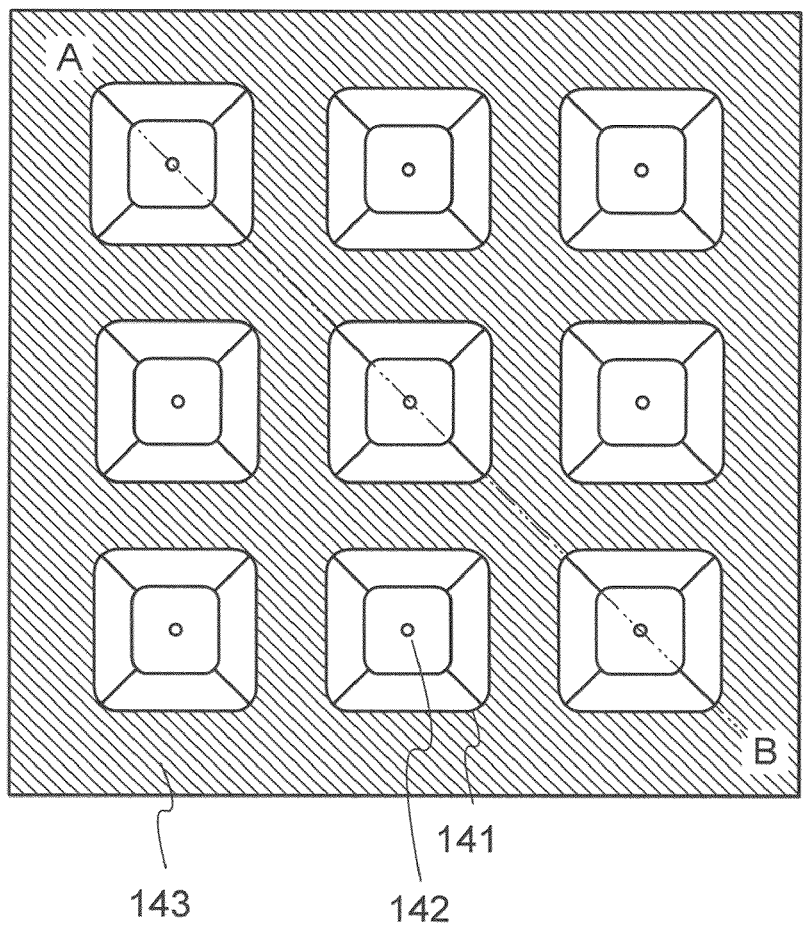
FIGS. 9A and 9B illustrate a shape of an upper electrode of the plasma CVD apparatus.
Figure 9B:
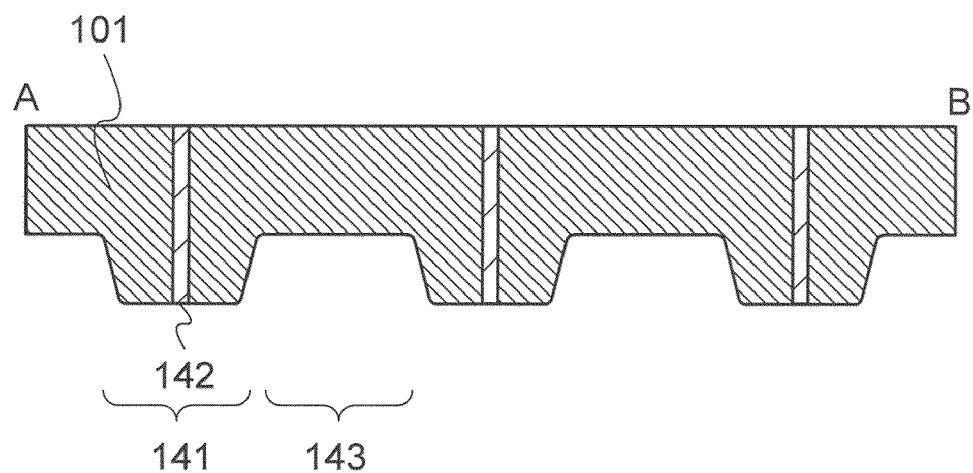

In this embodiment is described a structure applicable to the first electrode of the plasma CVD apparatus shown in Embodiment 1, with reference to FIGS. 9A and 9B. FIG. 9A is a plan view of the first electrode 101 seen from the second electrode 102 side. FIG. 9B is a cross-sectional view taken along A-B in FIG. 9A. Note that in FIG. 9A, regions which are depressed (that is, depressed portions) are shown in fine hatching for clear illustration of the state that is projected and depressed.

As illustrated in FIGS. 9A and 9B, gas supply ports of hollow portions 142 formed in the projected portions 141 are provided regularly, preferably at regular intervals. Further, as illustrated in FIG. 9B, the gas supply ports of the hollow portions 142 are provided in the projected portions 141. The plurality of projected portions 141 are separated from one another, and the depressed portions 143 form a continuous plane (common plane). Here, the projected portions 141 each have the shape of a truncated quadrangular pyramid. Note that the shape of the projected portions 141 is not limited thereto and may be of a truncated triangular pyramid, a truncated pentagonal pyramid, a truncated hexagonal pyramid, or any other truncated polygonal pyramid as appropriate. Preferably, rounded portions of the edge and corner of the projected portion 141 are chamfered to form a truncated polygonal pyramid with the corners rounded. The projected portions 141 may alternatively each have the shape of a truncated cone. The rounded portion of the edge of the projected portion 141 is preferably chamfered to form a truncated cone with the corners rounded.

Since the high-density plasma region is formed in the apex of the projected portion 141 by glow discharge, reaction of a source gas introduced into a reaction chamber through the gas supply port of the projected portion 141 is further promoted. Accordingly, generation of the deposition precursor 43 proceeds, whereby a larger number of crystal nuclei 44 can be densely deposited over the base film.

Embodiment 4

In this embodiment is described a structure applicable to the first electrode of the plasma CVD apparatus shown in Embodiment 1, with reference to FIG. 11, FIG. 12, FIGS. 13A and 13B, FIGS. 14A and 14B, and FIGS. 15A and 15B.

Figure 11:
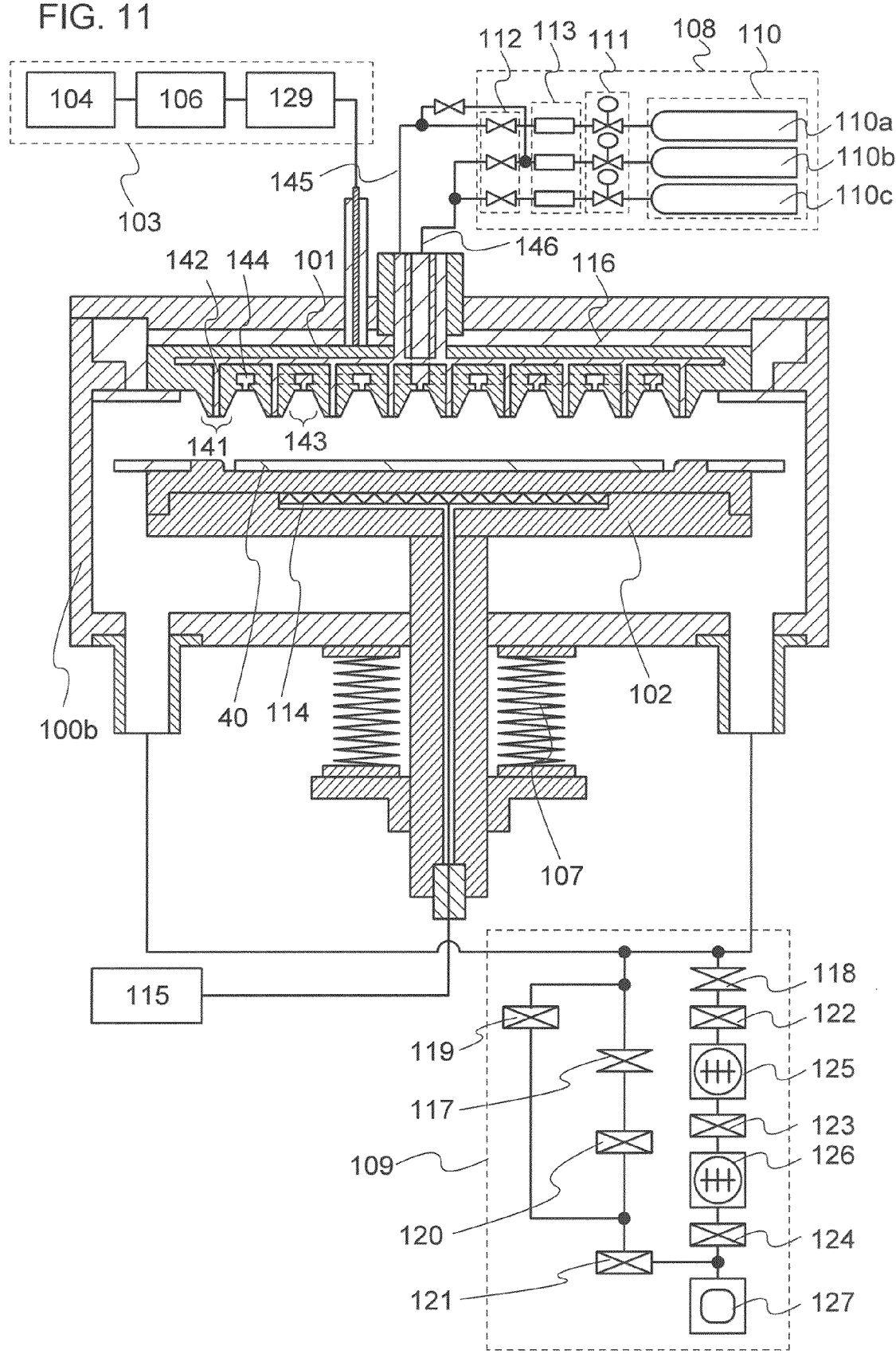
FIG. 11 illustrates an example of a plasma CVD apparatus.

In a structure of the reaction chamber of the plasma CVD apparatus illustrated in FIG. 11, the first electrode 101 is an electrode that is projected and depressed by having the projected portions 141 and the depressed portions 143 arranged regularly, preferably at regular intervals. In other words, the projected portions 141 formed using projected structure bodies are arranged regularly, preferably at regular intervals. Further, the hollow portions 142 connected to the gas supply unit 108 are provided in the projected portions 141 of the first electrode 101, and the hollow portions 144 connected to the gas supply unit 108 are provided in the depressed portion 143 of the first electrode 101. In other words, the depressed portions 143 form a common plane where the gas supply ports are provided. In such a structure, the kind of gas supplied to the reaction chamber 100b through the projected portion 141 can be different from the kind of gas supplied to the reaction chamber 100b through the depressed portion 143. Here, the region having the gas supply port near a surface of the second electrode 102 is regarded as the projected portion 141, and the region having the gas supply port distant from the surface of the second electrode 102 is regarded as the depressed portion 143.

Here, the kinds of gas supplied through the hollow portions 142 and 144 may be determined as appropriate. A structure in which a deposition gas is supplied through the hollow portion 142 and a hydrogen gas is supplied through the hollow portion 144 may be employed, for example. Alternatively, a structure in which a hydrogen gas is supplied through the hollow portion 142 and a deposition gas is supplied through the hollow portion 144 may be employed. Further alternatively, a structure in which a mixed gas of a deposition gas and a hydrogen gas is supplied through the hollow portion 142 and a deposition gas is supplied through the hollow portion 144 may be employed. Alternatively, a structure in which a deposition gas is supplied through the hollow portion 142 and a mixed gas of a deposition gas and a hydrogen gas is supplied through the hollow portion 144 may be employed. Still alternatively, a structure in which a mixed gas of a deposition gas and a hydrogen gas is supplied through the hollow portion 142 and a hydrogen gas is supplied through the hollow portion 144 may be employed. It is the most preferable that a hydrogen gas is supplied through the hollow portion 142 and a mixed gas of a deposition gas and a hydrogen gas be supplied through the hollow portion 144. By supplying a hydrogen gas through the hollow portion 142 and a mixed gas of a deposition gas and a hydrogen gas through the hollow portion 144, crystallinity of a microcrystalline semiconductor film to be formed can be improved.

Note that the flow rate of a gas may be varied during film formation. For instance, the flow rate of a deposition gas is increased at the initial stage of film formation and the dilution rate is raised at the later stage of the film formation, whereby the crystallinity can be improved.

Figure 12:
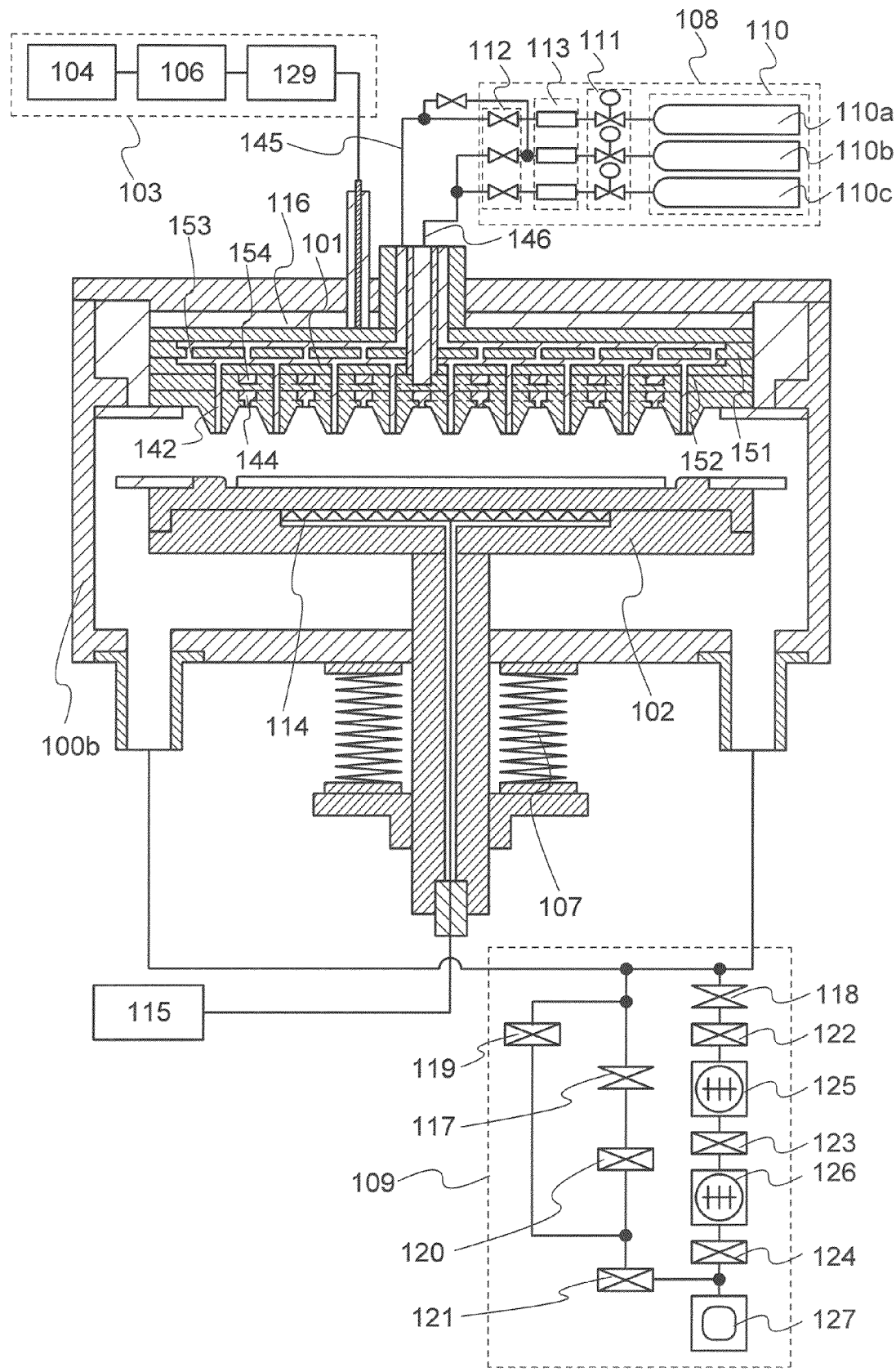
FIG. 12 is illustrates an example of a plasma CVD apparatus.

Further, the first electrode 101 may include a plurality of diffusing plates (see FIG. 12). In FIG. 12, a gas supplied through a gas line 145 is diffused by a diffusing plate 151, passes through a through hole 153 of the diffusing plate 151, and then supplied to the reaction chamber 100b through an introduction port of the hollow portion 142 provided in the projected portion 141. Further, a gas supplied through the gas line 146 is diffused by a diffusing plate 152, passes through a through hole 154 of the diffusing plate 152, and then supplied to the reaction chamber 100b through an introduction port of the hollow portion 144 provided on the depressed portion 143. As illustrated in FIG. 12, when the first electrode 101 includes the diffusing plates 151 and 152, the gases introduced through the gas lines 145 and 146 are sufficiently diffused into the first electrode 101 and therefore a homogeneous gas can be supplied to the reaction chamber 100b, whereby a high quality uniform film can be formed over a substrate.

Figure 13A:
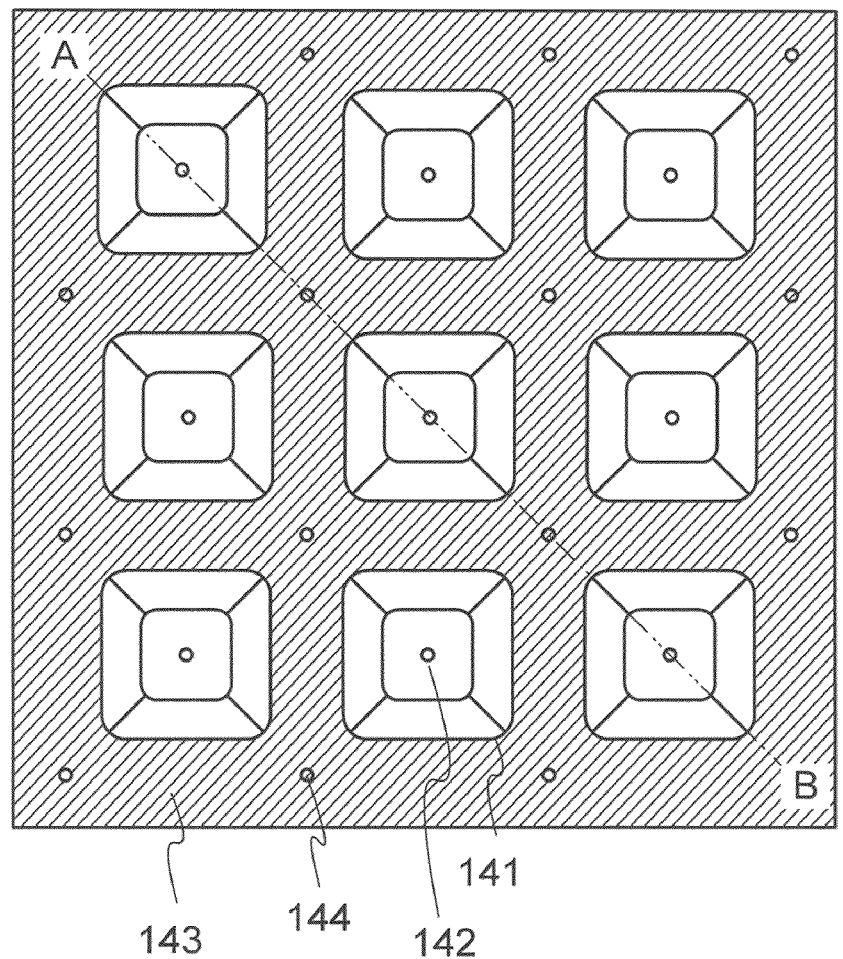
FIGS. 13A and 13B illustrate a shape of an upper electrode of the plasma CVD apparatus.
Figure 13B:
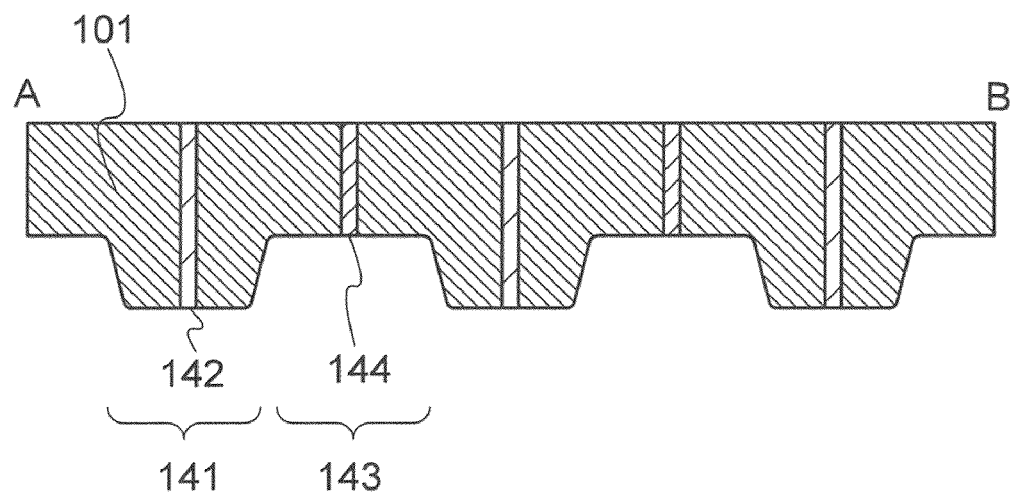
Figure 14A:
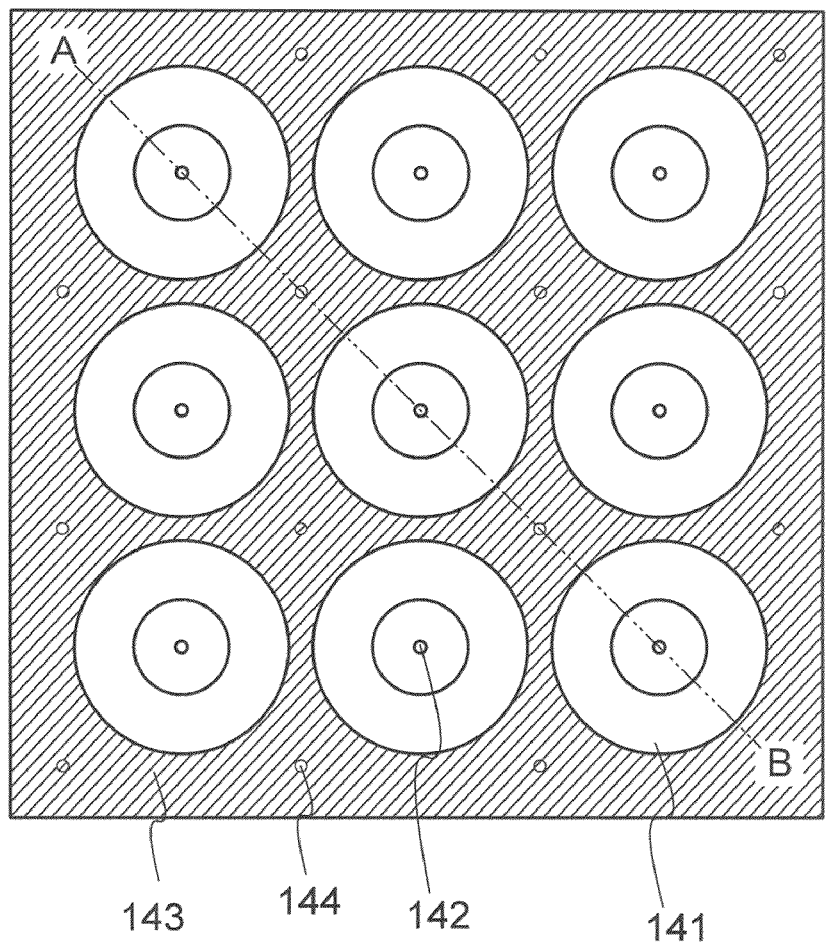
FIGS. 14A and 14B illustrate a shape of an upper electrode of the plasma CVD apparatus.
Figure 14B:
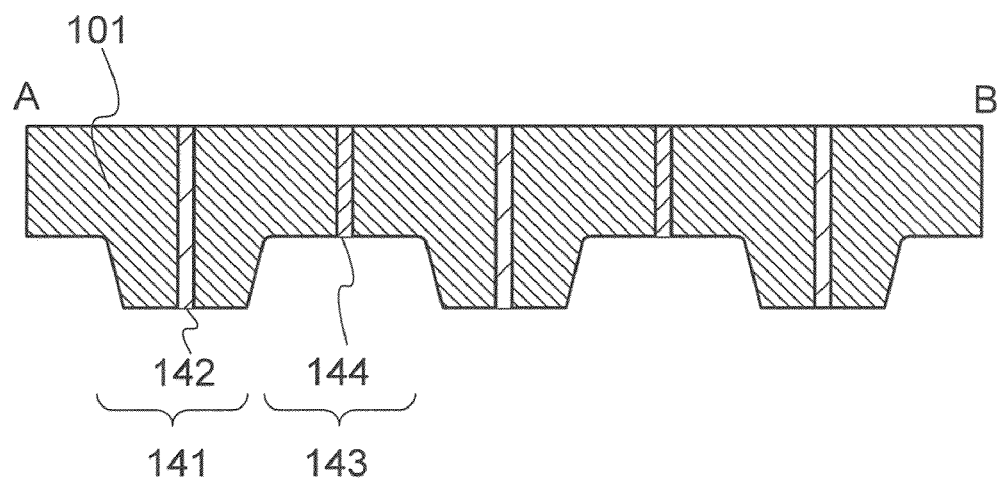

Here, examples of the shape of the first electrode 101 are described with reference to FIGS. 13A and 13B and FIGS. 14A and 14B. FIGS. 13A and 14A are plan views of the first electrode 101 seen from the second electrode 102 side. FIGS. 13B and 14B are cross-sectional views taken along line A-B in FIGS. 13A and 14A. Note that in FIGS. 13A and 14A, regions which are depressed (that is, depressed portions) are shown in fine hatching for clear illustration of the state that is projected and depressed.

As illustrated in FIGS. 13A and 13B, the gas supply ports of the hollow portions 142 formed in the projected portion 141 and the gas supply ports of the hollow portions 144 formed in the depressed portion 143 are provided regularly, preferably at regular intervals. Further, the gas supply ports of the hollow portions 142 are provided in the projected portion 141, and the gas supply ports of the hollow portions 144 are provided in the depressed portions 143. The plurality of projected portions 141 are separated from one another, and the depressed portions 143 form a continuous plane (common plane). In other words, there are projected structure bodies provided so as to project over the common plane where the gas supply ports are provided, and the projected structure bodies are each isolated. Here, the projected portions 141 each have the shape of a truncated quadrangular pyramid. Note that the shape of the projected portions 141 is not limited thereto and may be of a truncated triangular pyramid, a truncated pentagonal pyramid, a truncated hexagonal pyramid, or any other truncated polygonal pyramid as appropriate. Preferably, rounded portions of the edge and corner of the projected portion 141 are chamfered to form a truncated polygonal pyramid with the corners rounded. By chamfering the rounded portions of the edges and corners of the projected portions 141 and the depressed portions 143, overconcentration of an electric field can be reduced. Accordingly, local arc discharge can be suppressed, leading to less generation of particles.

Alternatively, as illustrated in FIGS. 14A and 14B, the projected portions 141 may each have the shape of a truncated cone. Further, the gas supply ports of the hollow portions 142 are provided in the projected portions 141, and the gas supply ports of the hollow portions 144 are provided in the depressed portions 143. Note that the rounded portion of the edge of the projected portion 141 is preferably chamfered to form a truncated cone with the corners rounded. Typically, the projected portion 141 can be tapered so that corners 156 and 158 can be chamfered. Further, the depressed portion 143 can be tapered. By tapering the projected portion 141 and the depressed portion 143 and chamfering the corners 156 and 158, concentration of an electric field at these portions can be reduced, leading to less generation of particles (see FIG. 15A). When the projected portions 141 each have the shape of a truncated cone and the rounded portions of the edges of the projected portions 141 and the depressed portions 143 are chamfered, overconcentration of an electric field can be reduced. Accordingly, local arc discharge can be suppressed, leading to less generation of particles.

Although the projected portions 141 each have the shape of a truncated polygonal pyramid or a truncated cone with the corners rounded in FIGS. 13A and 13B and FIGS. 14A and 14B, the edge and corner of the truncated polygonal pyramid or truncated cone may be chamfered without being rounded.

Figure 15A:
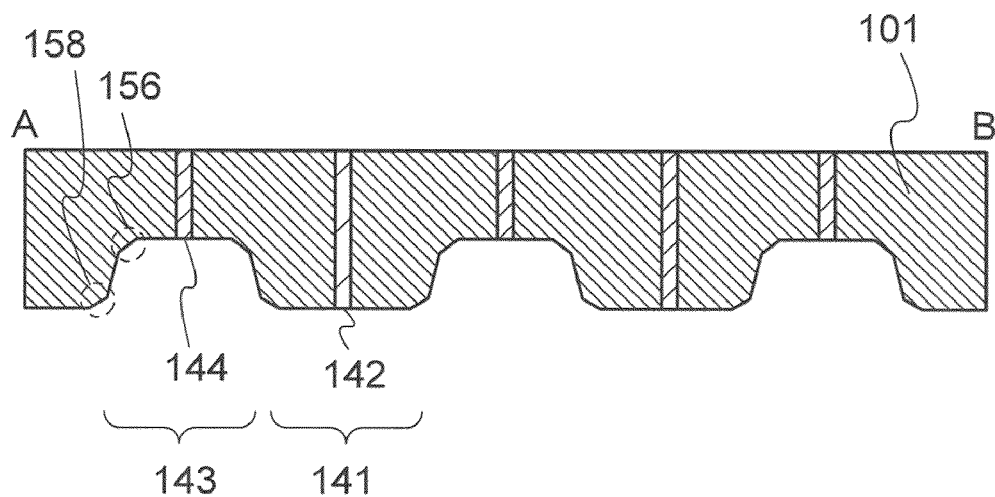
FIGS. 15A and 15B each illustrate a shape of an upper electrode of the plasma CVD apparatus.
Figure 15B:
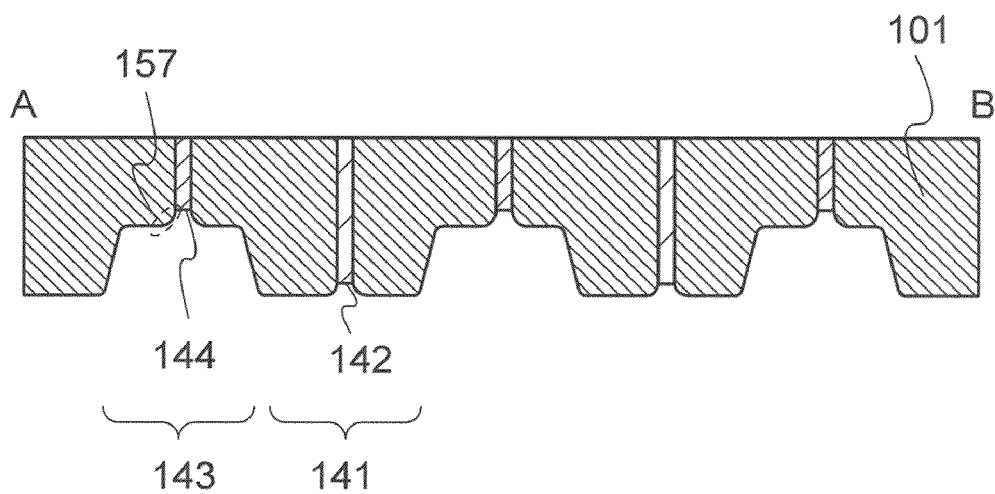

The edge and a corner 157 in the periphery of the gas supply port of the hollow portion 144 may be rounded (see FIG. 15B). The periphery of the gas supply port of the hollow portion 144 may be chamfered without being rounded, although not illustrated. Accordingly, concentration of an electric field in the periphery of the gas supply port can be reduced, leading to less generation of particles.

Note that in the case where a deposition precursor of silicon is generated, a crystalline structure can be obtained by diluting silane ($SiH_4$) with hydrogen. It is considered that this mechanism is similar to that of surface reaction that occurs in the case where a microcrystalline silicon film is deposited, and that reaction between hydrogen and a radical which is generated after dissociation of silane is mainly contributed to generation of the deposition precursor of silicon, which has a crystalline structure.

In this case, for example, when a silane gas or a silane gas diluted with hydrogen is used as the gas supplied through the gas supply port of the hollow portion 144 provided in the depressed portion, growth of the deposition precursor is promoted, whereby the deposition rate of a film deposited over the substrate 40 can be improved. When the gas supplied through the gas supply port of the hollow portion 144 provided in the depressed portion is a rare gas such as xenon, krypton, or argon, decomposition of silane is promoted by excited species of the rare gas, which contributes to generation of higher-order radicals.

Since the first electrode shown in this embodiment has the projected portions 141 and the depressed portions 143, a high-density plasma region can be formed at the apex of the projected portion 141. Thus, in the high-density plasma region, reactivity can be increased to promote generation of nuclei and deposition precursors. Accordingly, as in Embodiment 1, well-ordered deposition precursors which are formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Therefore, a microcrystalline semiconductor film having high crystallinity can be formed from the interface between the base film and the crystal nuclei. Furthermore, generation rate of a deposition precursor is increased in such a manner that a high-density plasma region is formed in the vicinity of the projected portions, and the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be increased.

Embodiment 5

In this embodiment is described a method for forming a microcrystalline semiconductor film having much higher crystallinity than the microcrystalline semiconductor films in Embodiments 1 to 4.

In this embodiment, as a source gas of the deposition precursor 43 and the microcrystalline semiconductor film 46 in FIGS. 1A and 1B, a rare gas such as argon, xenon, or krypton is used in addition to hydrogen and a deposition gas containing silicon or germanium.

Electron density and the amount of hydrogen radicals in plasma are increased by using a rare gas such as argon, xenon, or krypton, as a source gas, which has low excitation energy and has metastable energy close to dissociation energy of silane and hydrogen. Further, because electron temperature is decreased, potential difference in plasma is reduced and damage to the microcrystalline semiconductor film is reduced, whereby the microcrystalline semiconductor film 46 can be formed. By using a rare gas as the source gas, plasma is stabilized, dissociation of hydrogen and the deposition gas containing silicon or germanium is promoted, and the amount of active radicals is increased. Therefore, reaction between the active radicals is promoted and generation rate of the deposition precursor 43 and film formation rate of the microcrystalline semiconductor film 46 are increased. Further, as the deposition rate is increased, the deposition time of the microcrystalline semiconductor film 46 is shortened and the amount of impurities taken in a reaction chamber during deposition is reduced. Consequently, the amount of impurities included in the microcrystalline semiconductor film 46 is reduced, whereby crystallinity of the microcrystalline semiconductor film 46 can be improved.

Embodiment 6

Figure 16A:
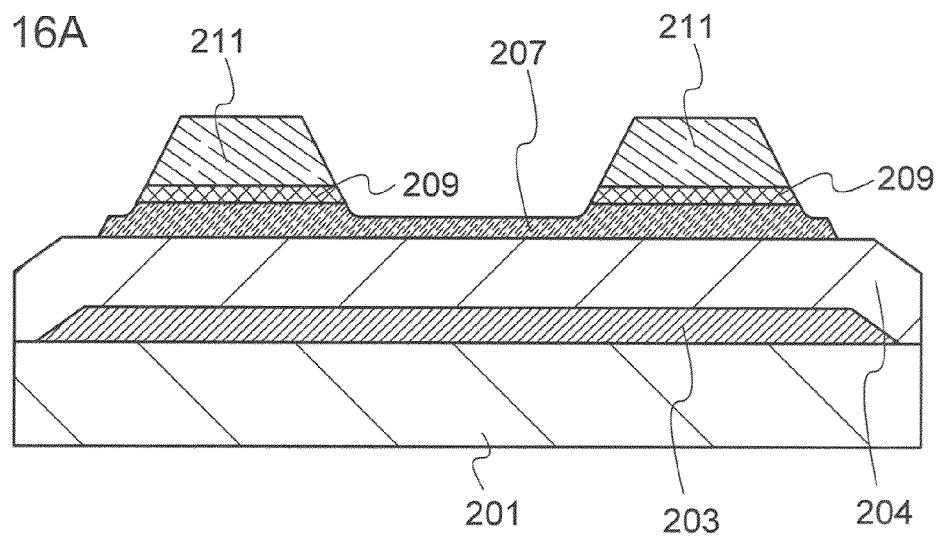
FIGS. 16A to 16C illustrate a structure of a thin film transistor.
Figure 16B:
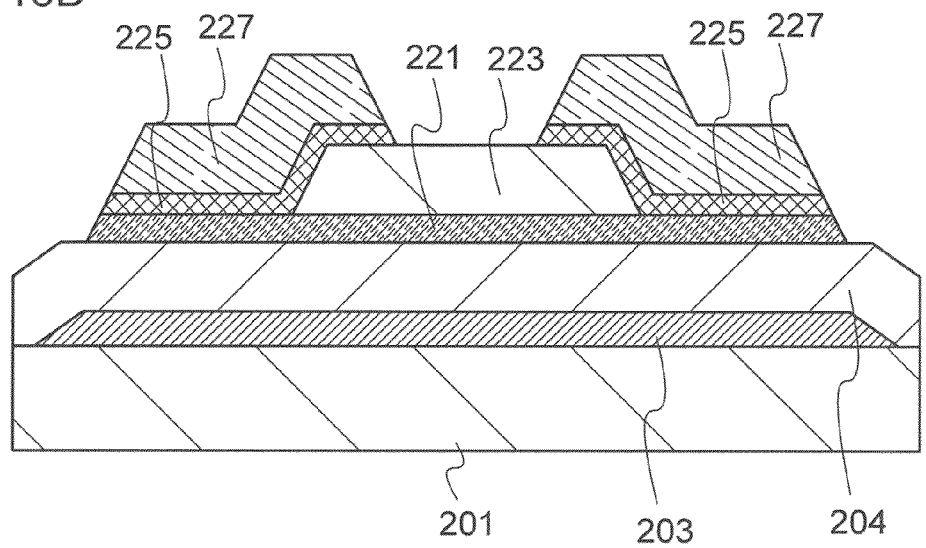
Figure 16C:
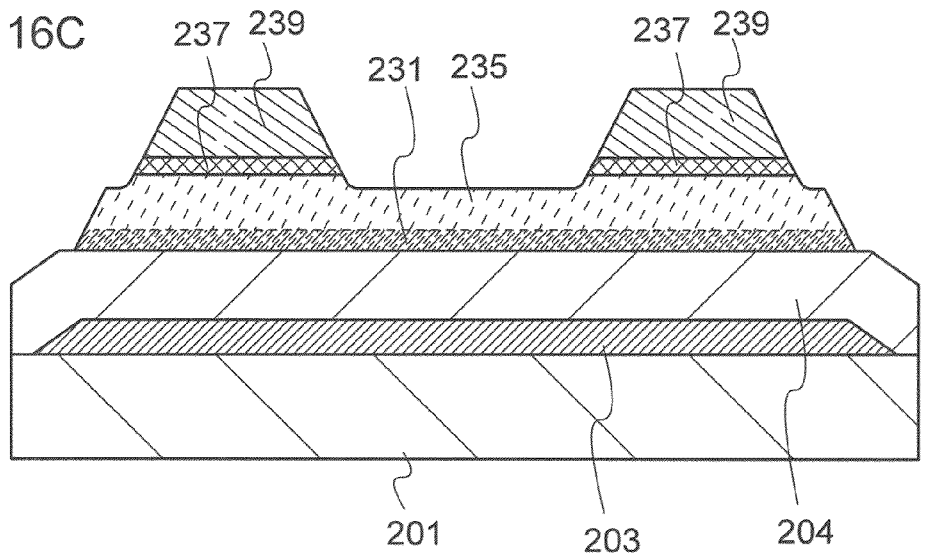

In this embodiment is described a structure of a thin film transistor having a microcrystalline semiconductor film formed with any of the methods described in Embodiments 1 to 5, with reference to FIGS. 16A to 16C.

A microcrystalline semiconductor film formed with any of the methods described in Embodiments 1 to 5 can be used as a channel formation region in a thin film transistor. Although the microcrystalline semiconductor film can be used in both a bottom gate thin film transistor and a top gate thin film transistor, the microcrystalline semiconductor film can improve characteristics of the bottom gate thin film transistor particularly. Here, a typical structure of the bottom gate thin film transistor is described with reference to FIGS. 16A to 16C.

A thin film transistor illustrated in FIG. 16A is a channel etched thin film transistor. A gate electrode 203 is formed over a substrate 201, and a gate insulating film 204 is formed to cover the substrate 201 and the gate electrode 203. A microcrystalline semiconductor film 207 is formed over the gate insulating film 204. A pair of impurity semiconductor films 209 is formed over the microcrystalline semiconductor film 207. A pair of wirings 211 is formed to be in contact with the pair of impurity semiconductor films 209. By forming the microcrystalline semiconductor film 207 using the microcrystalline semiconductor films described in any of Embodiments 1 to 5, the channel formation region can be formed using a microcrystalline semiconductor film having high crystallinity. Further, crystal grains in the microcrystalline semiconductor film manufactured according to any of Embodiments 1 to 5 are adjacent to each other and the contact area between the crystal grains is large, so that carriers in the channel formation region can easily move; thus, on current and field-effect mobility of the thin film transistor can be increased.

As the substrate 201, a glass substrate, a ceramic substrate, a plastic substrate that has high heat resistance enough to withstand a process temperature of this manufacturing process, or the like can be used. In the case where the substrate does not need a light-transmitting property, a metal substrate, such as a stainless steel alloy substrate, provided with an insulating film on its surface may be used. As a glass substrate, an alkali-free glass substrate formed using barium borosilicate glass, aluminoborosilicate glass, aluminosilicate glass, or the like may be used. Further, as the glass substrate 201, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

The gate electrode 203 can be formed with a single layer or a stacked layer using a metal material such as molybdenum, titanium, chromium, tantalum, tungsten, aluminum, copper, neodymium, or scandium or an alloy material which contains any of these metal materials as its main component. Alternatively, a semiconductor film typified by polycrystalline silicon doped with an impurity element such as phosphorus, or an AgPdCu alloy may be used.

As a two-layer structure for the gate electrode 203, a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked is preferable. As a three-layer structure for the gate electrode 203, a stack structure of a tungsten film or a tungsten nitride film, a layer of an alloy of aluminum and silicon or an alloy of aluminum and titanium, and a titanium nitride film or a titanium film is preferable. When a metal film functioning as a barrier film is stacked over a film with low electric resistance, electric resistance can be low and diffusion of a metal element from the metal film into the semiconductor film can be prevented.

In order to improve adhesion between the gate electrode 203 and the substrate 201, a film of a nitride of any of the aforementioned metal materials may be provided between the substrate 201 and the gate electrode 203.

The gate insulating film 204 can be formed with a single layer or a stacked layer using any of a silicon oxide film, a silicon nitride film, a silicon oxynitride film, and a silicon nitride oxide film.

In this specification, silicon oxynitride contains more oxygen than nitrogen, and in the case where measurements are performed using Rutherford backscattering spectrometry (RBS) and hydrogen forward scattering (HFS), silicon oxynitride preferably contains oxygen, nitrogen, silicon, and hydrogen as composition ranging from 50 atomic % to 70 atomic %, 0.5 atomic % to 15 atomic %, 25 atomic % to 35 atomic %, and 0.1 atomic % to 10 atomic %, respectively. Further, silicon nitride oxide contains more nitrogen than oxygen, and in the case where measurements are conducted using RBS and HFS, silicon nitride oxide preferably contains oxygen, nitrogen, silicon, and hydrogen as composition ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

The microcrystalline semiconductor film 207 is typically formed using a microcrystalline silicon film, a microcrystalline silicon germanium film, a microcrystalline germanium film, or the like. Alternatively, a microcrystalline silicon film containing phosphorus, arsenic, or antimony, a microcrystalline silicon germanium film containing phosphorus, arsenic, or antimony, a microcrystalline germanium film containing phosphorus, arsenic, or antimony, or the like may be used. Note that boron can be added to the microcrystalline semiconductor film 207 in order to control a threshold voltage of the thin film transistor.

A microcrystalline semiconductor included in the microcrystalline semiconductor film is a semiconductor having a crystal structure (including a single crystal and a polycrystal). A microcrystalline semiconductor is a semiconductor having a third state that is stable in terms of free energy and is a crystalline semiconductor having short-range order and lattice distortion, in which columnar, conical, or pyramidal crystals having a grain size of 2 nm to 200 nm inclusive, preferably, 10 nm to 80 nm inclusive, more preferably, 20 nm to 50 nm inclusive have grown in a normal direction with respect to a substrate surface. Therefore, a crystal grain boundary is formed at the interface of the columnar, conical, or pyramidal crystals in some cases.

Microcrystalline silicon which is a typical example of the microcrystalline semiconductor has a peak of Raman spectrum which is shifted to a lower wave number than 520 cm$^{-1}$ that represents single crystal silicon. That is, the peak of the Raman spectrum of the microcrystalline silicon exists between 520 cm$^{-1}$ which represents single crystal silicon and 480 cm$^{-1}$ which represents amorphous silicon. The microcrystalline semiconductor may contain hydrogen or halogen of at least 1 atomic % or more to terminate a dangling bond. Moreover, a rare gas element such as helium, neon, argon, krypton, or xenon may be contained to further promote lattice distortion, so that stability of the microcrystalline structure is enhanced and a favorable microcrystalline semiconductor can be obtained. Such a microcrystalline semiconductor is disclosed in, for example, U.S. Pat. No. 4,409,134.

The concentrations of oxygen and nitrogen contained in the microcrystalline semiconductor film which are measured by secondary ion mass spectrometry are set to less than $1\times10^{18}$ atoms/cm$^3$, which is preferable because the crystallinity of the microcrystalline semiconductor film 207 can be increased.

In the case of an n-channel thin film transistor, the impurity semiconductor film 209 is formed using amorphous silicon to which phosphorus is added or microcrystalline silicon to which phosphorus is added. In the case of a p-channel thin film transistor, the impurity semiconductor film 209 is formed using amorphous silicon to which boron is added or microcrystalline silicon to which boron is added.

The wirings 211 can be formed as a single layer or a stacked layer using any of aluminum, copper, titanium, neodymium, scandium, molybdenum, chromium, tantalum, tungsten, and the like. Alternatively, an aluminum alloy to which an element for preventing a hillock is added (e.g. an aluminum-neodymium alloy which can be used for the gate electrode 203) may be used. The wirings 211 may also have a stack structure in which a film that is in contact with the impurity semiconductor film 209 is formed using titanium, tantalum, molybdenum, or tungsten, or nitride of any of these elements and aluminum or an aluminum alloy is formed thereover. Furthermore, a stacked layer structure may also be employed in which upper and lower surfaces of aluminum or an aluminum alloy may each be covered with titanium, tantalum, molybdenum, tungsten, or nitride of any of these elements.

A thin film transistor illustrated in FIG. 16B is a channel stop thin film transistor. The gate electrode 203 is formed over the substrate 201, and the gate insulating film 204 is formed to cover the substrate 201 and the gate electrode 203. A microcrystalline semiconductor film 221 is formed over the gate insulating film 204. A channel protective film 223 is formed over the microcrystalline semiconductor film 221. A pair of impurity semiconductor films 225 is formed over the microcrystalline semiconductor film 221 and the channel protective film 223. A pair of wirings 227 is formed to be in contact with the pair of impurity semiconductor films 225. By forming the microcrystalline semiconductor film 221 using any of the methods for forming a microcrystalline semiconductor film described in Embodiments 1 to 5, the channel formation region can be formed using a microcrystalline semiconductor film having high crystallinity. Further, crystal grains in the microcrystalline semiconductor film manufactured according to any of Embodiments 1 to 5 are adjacent to each other and the contact area between the crystal grains is large, so that carriers in the channel formation region can easily move; thus, on current and field-effect mobility of the thin film transistor can be increased.

The channel protective film 223 can be formed in a manner the same as or similar to that of the gate insulating film 204. Alternatively, a polyimide, an epoxy resin, an acrylic resin, or another organic insulating film can be used to form the channel protective film 223.

The pair of impurity semiconductor films 225 can be formed using a material and a structure which are the same as or similar to those of the pair of impurity semiconductor films 209 illustrated in FIG. 16A.

The pair of wirings 227 can be formed using a material and a structure which are the same as or similar to those of the pair of wirings 211 illustrated in FIG. 16A.

A channel protective thin film transistor is formed using the microcrystalline semiconductor film described in any of Embodiments 1 to 5 for a channel formation region and includes the channel protective film, so that on current and field-effect mobility of the thin film transistor can be increased while off current is reduced.

A thin film transistor illustrated in FIG. 16C is a channel etched thin film transistor and includes an amorphous semiconductor film between a microcrystalline semiconductor film 231 and a pair of impurity semiconductor films 237, which is different from the structures of FIGS. 16A and 16B.

The gate electrode 203 is formed over the substrate 201, and the gate insulating film 204 is formed to cover the substrate 201 and the gate electrode 203. The microcrystalline semiconductor film 231 is formed over the gate insulating film 204. An amorphous semiconductor film 235 is formed over the microcrystalline semiconductor film 231. The pair of impurity semiconductor films 237 is formed over the amorphous semiconductor film 235. A pair of wirings 239 is formed to be in contact with the pair of the impurity semiconductor films 237. By forming the microcrystalline semiconductor film 231 using the any of the methods for forming a microcrystalline semiconductor film described in Embodiments 1 to 5, the channel formation region can be formed using a microcrystalline semiconductor film having high crystallinity. Further, crystal grains in the microcrystalline semiconductor film manufactured according to any of Embodiments 1 to 5 are adjacent to each other and the contact area between the crystal grains is large, so that carriers in the channel formation region can easily move; thus, on current and field-effect mobility of the thin film transistor can be increased.

The amorphous semiconductor film 235 can be formed using amorphous silicon, amorphous silicon containing nitrogen, amorphous silicon containing chlorine, or the like. The amorphous semiconductor film 235 is provided between the microcrystalline semiconductor film 231 and the pair of impurity semiconductor films 237, so that off current of the thin film transistor can be reduced.

As the amorphous semiconductor film 235, a semiconductor film having a peak region of a spectrum obtained by low-temperature photoluminescence spectroscopy of 1.31 eV to 1.39 eV inclusive can be used. As the amorphous semiconductor film 235, a semiconductor film which has a low energy at an urbach edge measured by a constant photocurrent method (CPM) or photoluminescence spectroscopy and a small amount of absorption spectra of defects can be formed. That is, as compared with the conventional amorphous semiconductor film, the amorphous semiconductor is a well-ordered semiconductor which has fewer defects and whose tail of a level at a band edge in the valence band is steep. Since the tail of the level at the band edge in the valence band is steep in the amorphous semiconductor film, the band gap gets wider, and tunneling current does not easily flow. Thus, when the amorphous semiconductor film is provided on the back channel side, on current and field-effect mobility can be increased while off current of the thin film transistor is reduced.

The pair of impurity semiconductor films 237 can be formed using a material and a structure which are the same as or similar to those of the pair of impurity semiconductor films 209 illustrated in FIG. 16A.

The pair of wirings 239 can be formed using a material and a structure which are the same as or similar to those of the pair of wirings 211 illustrated in FIG. 16A.

The thin film transistor illustrated in FIG. 16C is formed using the microcrystalline semiconductor film described in any of Embodiments 1 to 4 as a channel formation region and includes the amorphous semiconductor film 235, so that on current and field-effect mobility of the thin film transistor can be increased while off current is reduced.

Embodiment 7

In this embodiment will be described a method for manufacturing the thin film transistor illustrated in FIG. 16C, which is en embodiment of the thin film transistor in Embodiment 6, with reference to FIGS. 17A to 17D, FIGS. 18A to 18C, FIGS. 19A and 19B, FIG. 20, and FIGS. 21A and 21B.

Here, it is preferable that all thin film transistors formed over the same substrate have the same conductivity type because the number of manufacturing steps can be reduced. Therefore, in this embodiment, a method for manufacturing an n-channel thin film transistor is described.

Figure 17A:
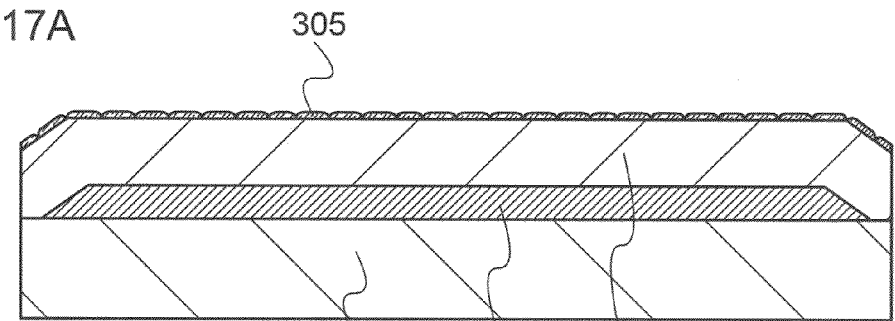
FIGS. 17A to 17D illustrate an embodiment of a method for manufacturing the thin film transistor.

As illustrated in FIG. 17A, a gate electrode 303 is formed over a substrate 301. Then, a gate insulating film 304 is formed to cover the gate electrode 303. After that, crystal nuclei 305 are formed over the gate insulating film 304 using any of the methods described in Embodiments 1 to 4.

As the substrate 301, the substrate 201 described in Embodiment 6 can be used as appropriate.

The material and the structure of the gate electrode 203 described in Embodiment 6 can be employed as appropriate for the gate electrode 303.

The gate electrode 303 can be formed in such a manner that a conductive film is formed over the substrate 301 with a sputtering method or a vacuum evaporation method, a mask is formed over the conductive film with a photolithography method, an ink-jet method, or the like, and the conductive film is etched using the mask. Alternatively, the gate electrode 303 can be formed by discharging a conductive nanopaste of silver, gold, copper, or the like over the substrate with an ink-jet method and baking the conductive nanopaste. Here, a conductive film is formed over the substrate 301 and then etched using a resist mask which is formed through a first photolithography process, whereby the gate electrode 303 is formed.

Note that, in the photolithography process, a resist may be applied to the entire surface of the substrate. Alternatively, a resist may be printed with a printing method on a region where a resist mask is to be formed, and then, the resist may be exposed to light, whereby a resist can be saved and cost can be reduced. Further alternatively, instead of exposing a resist to light by using a light-exposure machine, a laser beam direct drawing apparatus may be used to expose a resist to light.

In addition, when side surfaces of the gate electrode 303 are tapered, disconnection of a semiconductor film and a wiring film formed over the gate electrode 303 at a step portion can be reduced. In order to form the side surfaces of the gate electrode 303 to be tapered, etching may be performed while the resist mask is reduced in its size.

Through the step of forming the gate electrode 303, a gate wiring (a scan line) and a capacitor wiring can also be formed at the same time. Note that a "scan line" means a wiring which selects a pixel, while a "capacitor wiring" means a wiring which is connected to one of electrodes of a capacitor in a pixel. However, without limitation thereto, the gate electrode 303 and one or both of the gate wiring and the capacitor wiring may be formed in separate steps.

The material and the structure of the gate insulating film 204 described in Embodiment 6 can be employed as appropriate for the gate insulating film 304. The gate insulating film 304 can be formed with a sputtering method, a CVD method, a coating method, a printing method, or the like as appropriate.

Further, by forming a silicon oxide film with a CVD method using an organosilane gas as an outermost surface of the gate insulating film 304, the crystallinity of a first semiconductor film which is formed later can be improved, so that on current and field-effect mobility of the thin film transistor can be increased. As the organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The crystal nuclei 305 are formed with the method for forming the deposition precursor 43 described in Embodiments 1 to 5. The crystal nuclei 305 are formed in such a manner that a deposition gas containing silicon or germanium is introduced into a reaction chamber from the gas supply ports in the hollow portions 144 of the first electrode of the plasma CVD apparatus illustrated in FIG. 2, the high-frequency power source is turned on, and high-frequency power is supplied. Note that as the gas introduced into the reaction chamber from the gas supply ports in the hollow portions 144, hydrogen may be introduced in addition to the deposition gas containing silicon or germanium. Further, hydrogen and a rare gas may be introduced in addition to the deposition gas containing silicon or germanium.

Figure 17B:
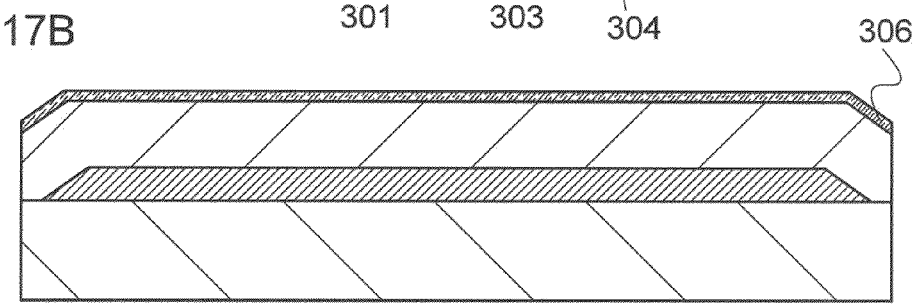

Next, as illustrated in FIG. 17B, a first semiconductor film 306 is formed by growing crystals using the crystal nuclei 305 as nuclei.

The first semiconductor film 306 is formed with the method for forming a microcrystalline semiconductor film 46 described in any of Embodiments 1 to 5.

The thickness of the first semiconductor film 306 is preferably 3 nm to 100 nm, more preferably, 5 nm to 50 nm. This is because when the first semiconductor film 306 is too thin, on current of the thin film transistor is reduced. Further, when the first semiconductor film 306 is too thick, off current of the thin film transistor is increased while the thin film transistor operates at a high temperature. The thickness of the first semiconductor film 306 is set to 3 nm to 100 nm, preferably, 5 nm to 50 nm, whereby on current and off current of the thin film transistor can be controlled.

Here, the first semiconductor film 306 is formed by glow discharge plasma introducing hydrogen and a deposition gas containing silicon or germanium into the reaction chamber from the gas supply ports in the hollow portions 144 of the first electrode 101 of the plasma CVD apparatus illustrated in FIG. 2. Alternatively, the first semiconductor film 306 is formed by glow discharge plasma introducing is hydrogen, a deposition gas containing silicon or germanium, and a rare gas such as helium, neon, argon, krypton, or xenon into the reaction chamber from the gas supply ports in the hollow portions 144 of the first electrode 101 of the plasma CVD apparatus illustrated in FIG. 2. Microcrystalline silicon, microcrystalline silicon germanium, microcrystalline germanium, or the like is formed using a mixture which is obtained by diluting the deposition gas containing silicon or germanium with hydrogen whose flow rate is 10 times to 2000 times, preferably, 10 times to 200 times that of the deposition gas. The deposition temperature at this time is preferably a room temperature to 300° C., more preferably, 200° C. to 280° C.

Typical examples of the deposition gas containing silicon or germanium include silane ($SiH_4$), disilane ($Si_2H_6$), germane ($GeH_4$), and digermane ($Ge_2H_6$).

Note that before the first semiconductor film 306 is formed, impurities in the treatment chamber of the CVD apparatus are removed by introducing the deposition gas containing silicon or germanium while exhausting the gas in the reaction chamber, so that the amount of the impurities at the interface between the gate insulating film 304 and the first semiconductor film 306 of the thin film transistor to be formed later can be reduced, and thus, electric characteristics of the thin film transistor can be improved.

Alternatively, before the first semiconductor film 306 is formed, a surface of the gate insulating film 304 may be exposed to oxygen plasma, hydrogen plasma, or the like.

Figure 17C:
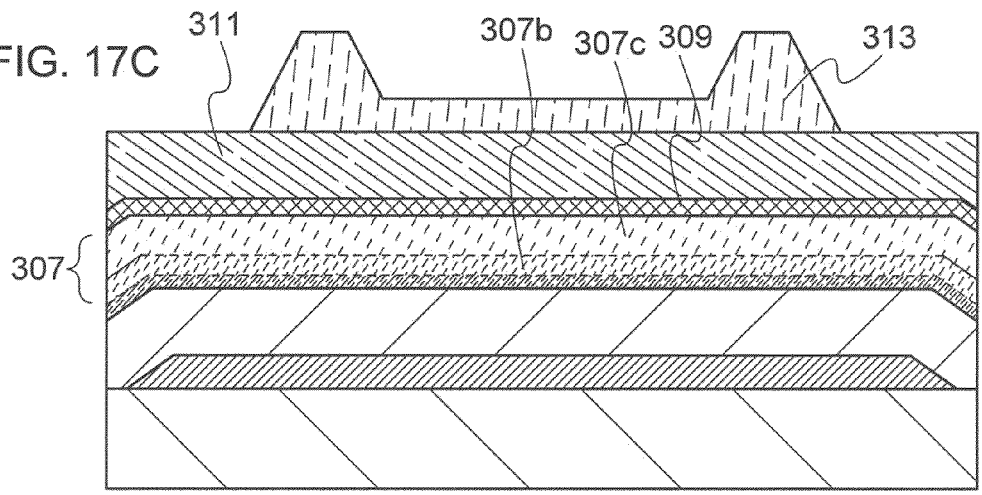
Figure 17D:
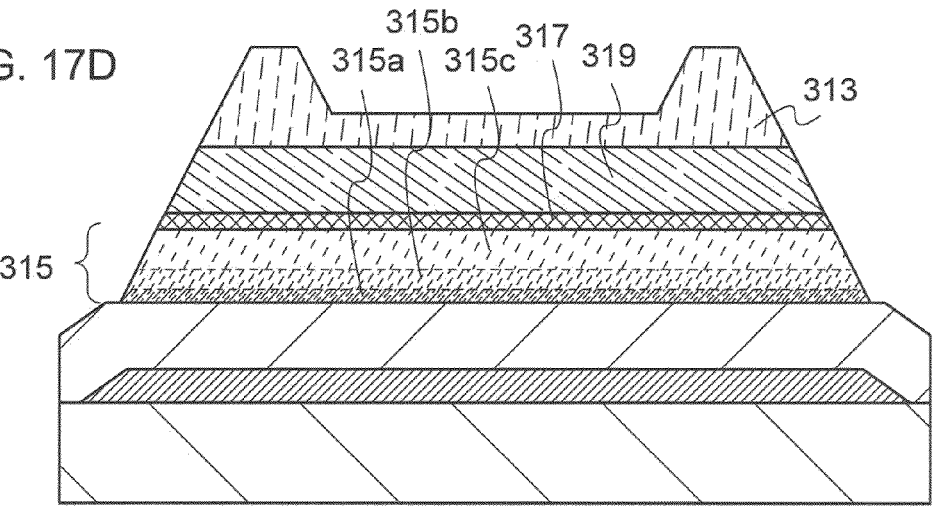

Next, as illustrated in FIG. 17C, a second semiconductor film 307 is formed over the first semiconductor film 306. Here, the second semiconductor film 307 includes a mixed region 307b and a region 307c including an amorphous semiconductor. Then, an impurity semiconductor film 309 and a conductive film 311 are formed over the second semiconductor film 307. After that, a resist mask 313 is formed over the conductive film 311.

The second semiconductor film 307 which includes the mixed region 307b and the region 307e including an amorphous semiconductor can be formed under a condition that crystals are grown partly using the first semiconductor film 306 as a seed crystal.

The second semiconductor film 307 is formed by glow discharge plasma using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, and fluoroamine. Glow discharge plasma can be generated in a manner the same as or similar to that of the first semiconductor film 306.

At this time, the deposition gas containing silicon or germanium and a gas containing nitrogen are used as the source gas, whereby crystal growth can be further suppressed as compared to the deposition condition of the first semiconductor film 306. As a result, the mixed region 307b and the region 307c including an amorphous semiconductor, which is formed using a well-ordered semiconductor film having fewer defects and a steep tail of a level at a band edge in the valence band, can be formed in the second semiconductor film 307.

Here, a typical example of a condition for forming the second semiconductor film 307 is as follows. The flow rate of hydrogen is 10 times to 2000 times, preferably, 10 times to 200 times that of the deposition gas containing silicon or germanium. Note that in a typical example of a condition for forming a normal amorphous semiconductor film, the flow rate of hydrogen is 0 to 5 times that of the deposition gas containing silicon or germanium.

A rare gas such as helium, neon, argon, xenon, or krypton is introduced into the source gas of the second semiconductor film 307, whereby the film formation rate of the second semiconductor film 307 can be increased.

The thickness of the second semiconductor film 307 is preferably 50 nm to 350 nm, more preferably, 120 nm to 250 nm.

At an early stage of deposition of the second semiconductor film 307, since a gas containing nitrogen is included in the source gas, the crystal growth is partly suppressed; therefore, while conical or pyramidal microcrystalline semiconductor regions grow, an amorphous semiconductor region filling a portion between the conical or pyramidal microcrystalline semiconductor regions is formed. A region formed in such a manner that both the microcrystalline semiconductor region and the amorphous semiconductor region coexist is referred to as the mixed region 307b. Further, crystal growth of the conical or pyramidal microcrystalline semiconductor regions is stopped, so that a region where the microcrystalline semiconductor region is not included and only the amorphous semiconductor region is included is formed. Such a region where the microcrystalline semiconductor is not included and only the amorphous semiconductor is included is referred to as the region 307c including an amorphous semiconductor. Note that before the conical or pyramidal microcrystalline semiconductor regions grow, a microcrystalline semiconductor film is formed over the entire surface of the first semiconductor film 306 using the first semiconductor film 306 as a seed crystal in some cases.

Here, the second semiconductor film 307 including the mixed region 307b and the region 307c including an amorphous semiconductor is formed using the source gas, in which a gas containing nitrogen is included, of the second semiconductor film 307. Alternatively, as another method for forming the second semiconductor film 307, the following may be performed: a surface of the first semiconductor film 306 is exposed to a gas containing nitrogen so that nitrogen is adsorbed to the surface of the first semiconductor film 306; and then the second semiconductor film 307 including the mixed region 307b and the region 307c including an amorphous semiconductor is formed using a deposition gas containing silicon or germanium and hydrogen as the source gas.

The impurity semiconductor film 309 is formed by glow discharge plasma using a mixture of hydrogen, phosphine (diluted with hydrogen or silane), and a deposition gas containing silicon in the reaction chamber of the plasma CVD apparatus. Amorphous silicon to which phosphorus is added or microcrystalline silicon to which phosphorus is added is formed by diluting the deposition gas containing silicon with hydrogen. Note that in the case where a p-channel thin film transistor is manufactured, as the impurity semiconductor film 309, amorphous silicon to which boron is added or microcrystalline silicon to which boron is added may be formed by glow discharge plasma, using diborane instead of phosphine.

Here, structures of the second semiconductor film 307 which is formed between the gate insulating film 304 and the impurity semiconductor film 309 are described with reference to FIGS. 19A and 19B, FIG. 20, and FIGS. 21A and 21B.

FIGS. 19A and 19B, FIG. 20, and FIGS. 21A and 21B are each an enlarged view between the gate insulating film 304 and the impurity semiconductor film 309.

Figure 19A:
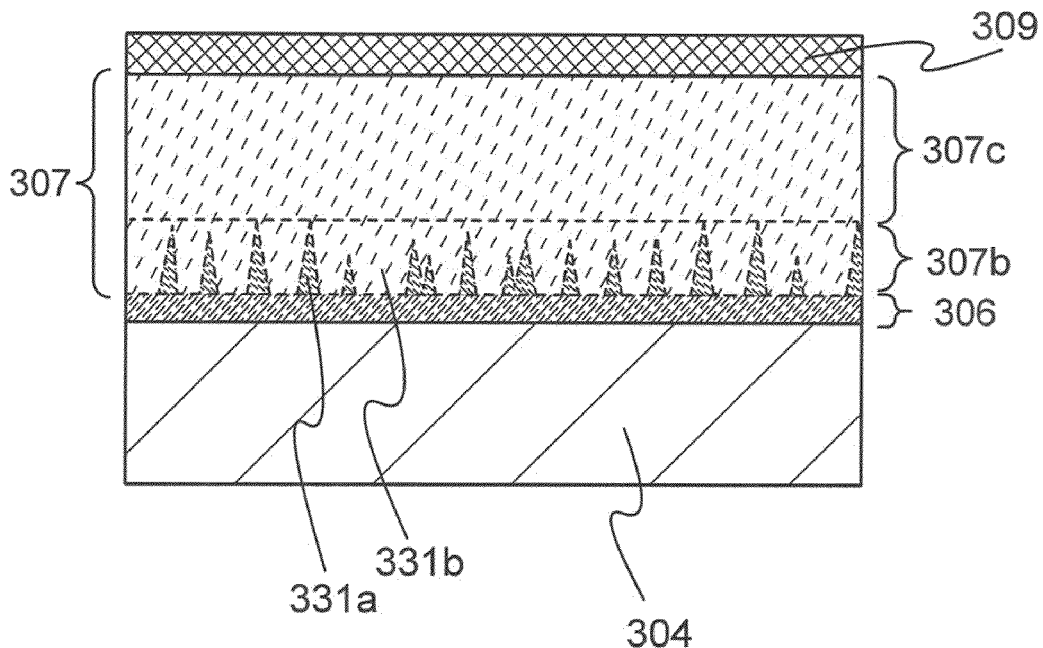
FIGS. 19A and 19B each illustrate an embodiment of the method for manufacturing the thin film transistor.

As illustrated in FIG. 19A, the mixed region 307b includes microcrystalline semiconductor regions 331a each of which grows with a projected shape from the surface of the first semiconductor film 306 and an amorphous semiconductor region 331b which fills a portion between the microcrystalline semiconductor regions 331a.

The microcrystalline semiconductor region 331a is a microcrystalline semiconductor having a projected (conical or pyramidal) shape whose tip is narrowed from the gate insulating film 304 toward the region 307c including an amorphous semiconductor. Note that the microcrystalline semiconductor region 331a may be a microcrystalline semiconductor having a projected (inverted conical or inverted pyramidal) shape whose width is increased from the gate insulating film 304 toward the region 307c including an amorphous semiconductor.

Note that the amorphous semiconductor region 331b included in the mixed region 307b may contain a semiconductor crystal grain having a grain size of 1 nm to 10 nm inclusive, preferably, 1 nm to 5 nm inclusive.

Figure 19B:
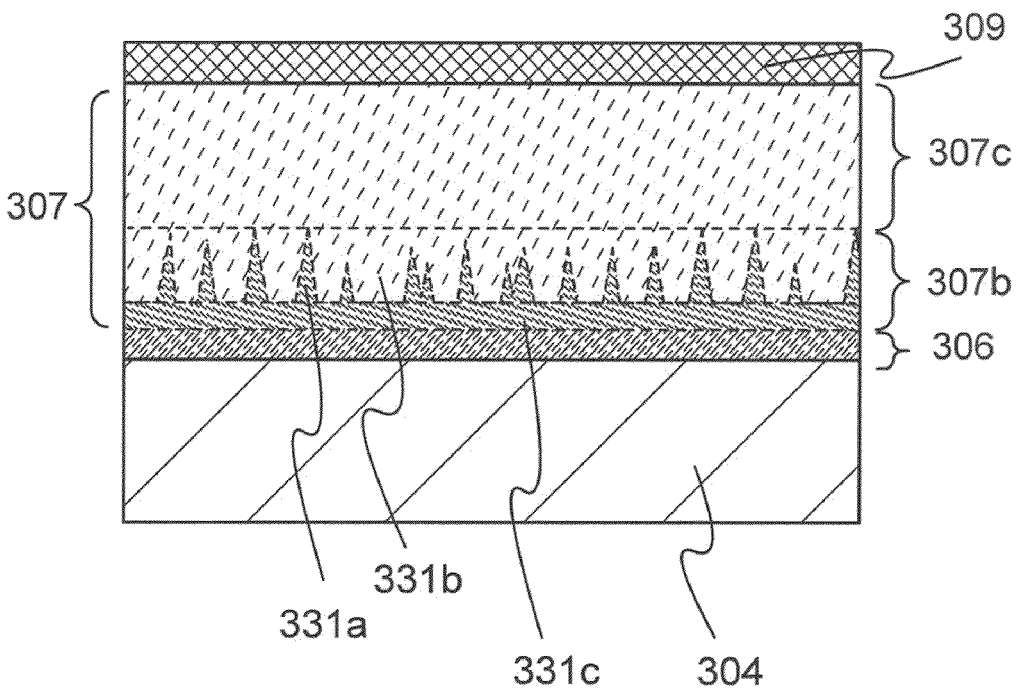

Alternatively, as illustrated in FIG. 19B, the mixed region 307b includes a microcrystalline semiconductor region 331c and the microcrystalline semiconductor region 331a which are successively formed, in some cases. The microcrystalline semiconductor region 331c is formed with a uniform thickness over the first semiconductor film 306. The microcrystalline semiconductor region 331a has a projected (conical or pyramidal) shape whose tip is narrowed from the gate insulating film 304 toward the region 307c including an amorphous semiconductor.

Note that in FIGS. 19A and 19B, the amorphous semiconductor region 331b included in the mixed region 307b is a semiconductor, the quality of which is substantially the same as the quality of the region 307c including an amorphous semiconductor.

Accordingly, an interface between a region formed using a microcrystalline semiconductor and a region formed using an amorphous semiconductor may correspond to the interface between the microcrystalline semiconductor region 331a and the amorphous semiconductor region 331b in the mixed region 307b. Therefore, the interface between the microcrystalline semiconductor and the amorphous semiconductor can be described as uneven or zigzag in a cross-sectional view.

In the mixed region 307b, in the case where the microcrystalline semiconductor region 331a includes a semiconductor crystal grain having a projected (conical or pyramidal) shape whose tip is narrowed from the gate insulating film 304 toward the region 307c including an amorphous semiconductor, the proportion of the microcrystalline semiconductor in the vicinity of the first semiconductor film 306 is higher than that in the vicinity of the region 307c including an amorphous semiconductor. The microcrystalline semiconductor region 331a grows in a thickness direction from the surface of the first semiconductor film 306. However, by adding a gas containing nitrogen to the source gas or by adding a gas containing nitrogen to the source gas and reducing the flow rate of hydrogen to silane from that under the deposition condition of the first semiconductor film 306, crystal growth of the microcrystalline semiconductor region 331a is suppressed, the semiconductor crystal grain becomes a conical or shape, and the amorphous semiconductor is gradually deposited. This is because the solid solubility of nitrogen in the microcrystalline semiconductor region is lower than the solid solubility of nitrogen in the amorphous semiconductor region.

The total thickness of the first semiconductor film 306 and the mixed region 307b, that is, the distance from the interface between the gate insulating film 304 and the first semiconductor film 306 to the tip of the projection (projected portion) of the microcrystalline semiconductor region 331a is set to 3 nm to 410 nm inclusive, preferably, 20 nm to 100 nm inclusive. The total thickness of the first semiconductor film 306 and the mixed region 307b is set to 3 nm to 410 nm inclusive, preferably, 20 nm to 100 nm inclusive, so that off current of the thin film transistor can be reduced.

As described above, the region 307c including an amorphous semiconductor is a semiconductor, the quality of which is substantially the same as the quality of the amorphous semiconductor region 331b, and contains nitrogen. Further, the region 307c including an amorphous semiconductor contains a semiconductor crystal grain having a grain size of 1 nm to 10 nm inclusive, preferably, 1 nm to 5 nm inclusive, in some cases. Here, the region 307c including an amorphous semiconductor is a semiconductor film having lower energy at an Urbach edge measured by a CPM (constant photocurrent method) or photoluminescence spectroscopy and a smaller amount of the absorption spectrum of defects as compared to a conventional amorphous semiconductor. That is, as compared to the conventional amorphous semiconductor, the region 307c including an amorphous semiconductor is a well-ordered semiconductor which has fewer defects and a steep tail of a level at a band edge in the valence band. Since the region 307e including an amorphous semiconductor has a steep tail of a level at a band edge in the valence band, the band gap gets wider and tunneling current does not easily flow. Therefore, by providing the region 307c including an amorphous semiconductor on the back channel side, off current of the thin film transistor can be reduced. In addition, by providing the region 307c including an amorphous semiconductor, on current and field-effect mobility can be increased.

Further, a peak region of a spectrum obtained by performing low-temperature photoluminescence spectroscopy on the region 307c including an amorphous semiconductor is 1.31 eV to 1.39 eV inclusive. Note that a peak region of a spectrum obtained by performing low-temperature photoluminescence spectroscopy on a microcrystalline semiconductor film, typically a microcrystalline silicon film, is 0.98 eV to 1.02 eV inclusive. Accordingly, the region 307c including an amorphous semiconductor is different from a microcrystalline semiconductor film.

Note that an amorphous semiconductor included in the region 307c including an amorphous semiconductor is typically amorphous silicon.

Note that nitrogen included in the mixed region 307b and the region 307c including an amorphous semiconductor may exist as an NH group or an $NH_2$ group, for example.

Figure 20:
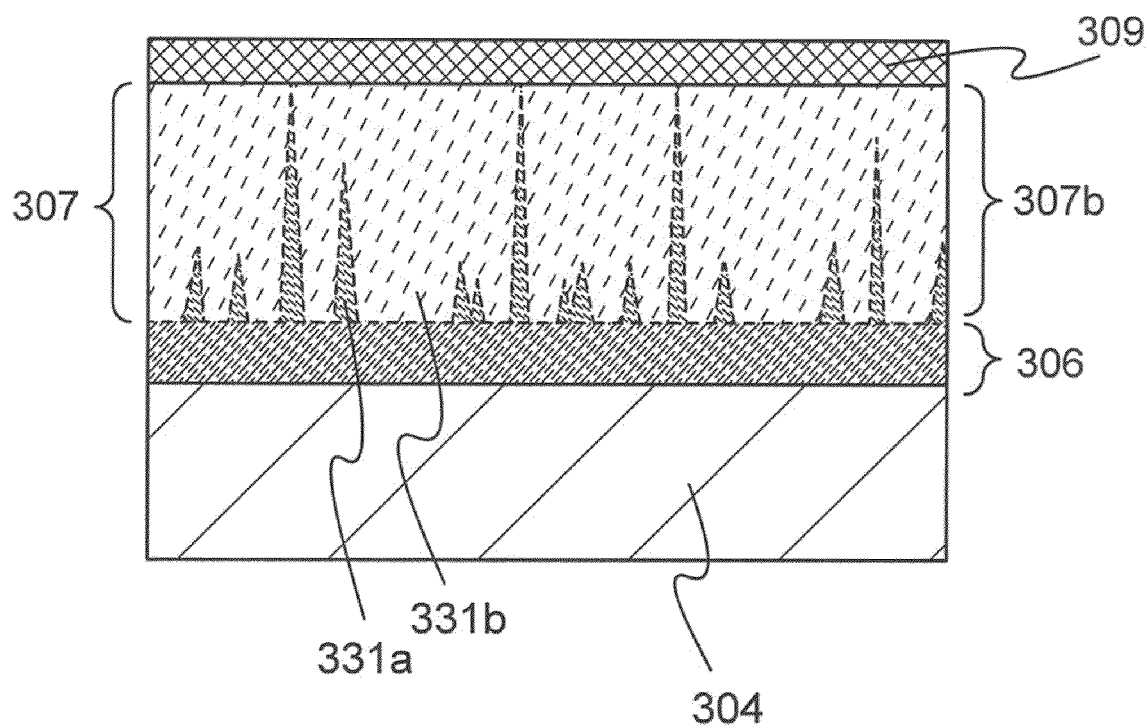
FIG. 20 illustrates an embodiment of the method for manufacturing the thin film transistor.

Alternatively, as illustrated in FIG. 20, the mixed region 307b may entirely fill a portion between the first semiconductor film 306 and the impurity semiconductor film 309. In other words, the second semiconductor film 307 may correspond to the mixed region 307b. It is preferable that, in the structure illustrated in FIG. 20, the proportion of the microcrystalline semiconductor region 331a in the mixed region 307b is lower than the structures illustrated in FIGS. 19A and 19B. Further, the proportion of the microcrystalline semiconductor region 331a in the mixed region 307b is preferably low in a region between source and drain regions, that is, a region where carriers flow. As a result, off current of the thin film transistor can be reduced. In addition, in the mixed region 307b, it is possible to reduce resistance in a vertical direction (a thickness direction), that is, resistance between the semiconductor film and the source and drain regions, when the thin film transistor is in an on state and voltage is applied between source and drain electrodes which are formed using wirings 325, and thus on current and field-effect mobility of the thin film transistor can be increased.

Note that the mixed region 307b illustrated in FIG. 20 may include the microcrystalline semiconductor region 331c as illustrated in FIG. 19B.

Figure 21A:
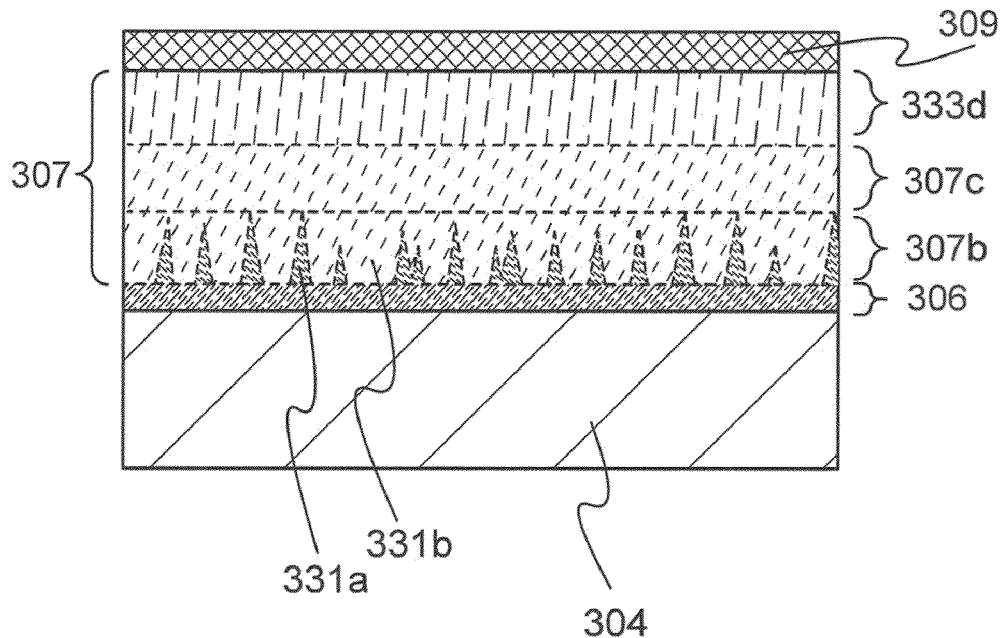
FIGS. 21A and 21B each illustrate an embodiment of the method for manufacturing a thin film transistor.
Figure 21B:
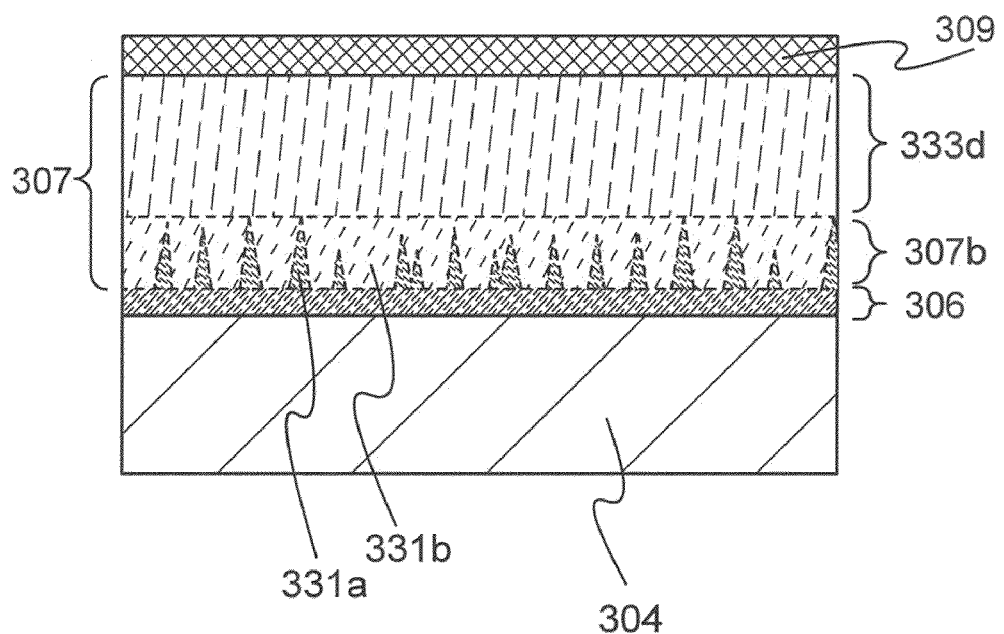

Further, a conventional amorphous semiconductor region 333d may be provided between the region 307c including an amorphous semiconductor and the impurity semiconductor film 309 as illustrated in FIG. 21A. In other words, the second semiconductor film 307 may include the mixed region 307b, the region 307c including an amorphous semiconductor, and the amorphous semiconductor region 333d. Alternatively, the conventional amorphous semiconductor region 333d may be provided between the mixed region 307b and the impurity semiconductor film 309 as illustrated in FIG. 21B. In other words, the second semiconductor film 307 may include the mixed region 307b and the amorphous semiconductor region 333d. By employing the structures illustrated in FIGS. 21A and 2113, off current of the thin film transistor can be reduced.

Note that the mixed region 307b illustrated in FIGS. 21A and 21B may include the microcrystalline semiconductor region 331c as illustrated in FIG. 19B.

Since the mixed region 307b includes the microcrystalline semiconductor region 331a having a conical or pyramidal shape, it is possible to reduce resistance in a vertical direction (a thickness direction), that is, resistance of the first semiconductor film 306, the mixed region 307b, and the region 307c including an amorphous semiconductor, when the thin film transistor is in an on state and voltage is applied between the source and drain electrodes.

As described above, nitrogen contained in the mixed region 307b may exist as an NH group or an $NH_2$ group. This is because defects are reduced when an NH group or an $NH_2$ group is bonded to dangling bonds of silicon atoms at the interface between a plurality of the microcrystalline semiconductor regions included in the microcrystalline semiconductor region 331a, the interface between the microcrystalline semiconductor region 331a and the amorphous semiconductor region 331b, or the interface between the first semiconductor film 306 and the amorphous semiconductor region 331b. Accordingly, the nitrogen concentration of the second semiconductor film 307 is set to $1 \times 10^{19}$ atoms/$cm^3$ to $1 \times 10^{21}$ atoms/$cm^3$ inclusive, preferably, $1 \times 10^{2}$© atoms/$cm^3$ to $1 \times 10^{21}$ atoms/$cm^3$, more preferably, $2 \times 10^{20}$ atoms/$cm^3$ to $1 \times 10^{21}$ atoms/$cm^3$, and thus the dangling bonds of silicon atoms can be easily cross-linked with an NH group, so that carriers can flow easily. Alternatively, the dangling bonds of the semiconductor atoms at the aforementioned interfaces are terminated with an $NH_2$ group, so that the defect level disappears. As a result, resistance in a vertical direction (a thickness direction) is reduced when the thin film transistor is in an on state and voltage is applied between the source and drain electrodes. That is, field-effect mobility and on current of the thin film transistor are increased.

By making the oxygen concentration of the mixed region 307b lower than the nitrogen concentration of the mixed region 307b, bonds which interrupt carrier transfer due to defects at the interface between the microcrystalline semiconductor region 331a and the amorphous semiconductor region 331b or defects at the interface between semiconductor crystal grains can be reduced.

Therefore, off current of the thin film transistor can be reduced when a channel formation region is formed using the first semiconductor film 306 and the region 307c including an amorphous semiconductor is provided between the channel formation region and the impurity semiconductor film 309. In addition, off current can be further reduced while on current and field-effect mobility can be increased when the mixed region 307b and the region 307c including an amorphous semiconductor are provided. This is because the mixed region 307b includes the microcrystalline semiconductor region 331a having a conical or pyramidal shape and the region 307c including an amorphous semiconductor is formed using a well-ordered semiconductor film which has few defects and a steep tail of a level at a band edge in the valence band.

The conductive film 311 can be formed using the material and the structure illustrated in Embodiment 6 as appropriate.

The conductive film 311 is formed with a CVD method, a sputtering method, or a vacuum evaporation method. Alternatively, the conductive film 311 may be formed by discharging a conductive nanopaste of silver, gold, copper, or the like with a screen printing method, an ink-jet method, or the like and baking the conductive nanopaste.

The resist mask 313 is formed by a second photolithography process. The resist mask 313 has regions with different thicknesses. Such a resist mask can be formed using a multi-tone mask. The multi-tone mask is preferably used because the number of photomasks used and the number of manufacturing steps can be reduced. In this embodiment, a resist mask formed using the multi-tone mask can be used in a process of forming patterns of the first semiconductor film 306 and the second semiconductor film 307 and a process of separating the source region and the drain region.

A multi-tone mask is a mask capable of light exposure with multi-level light quantity; typically, light exposure is performed with three levels of light quantity to provide an exposed region, a half-exposed region, and an unexposed region. By one light exposure and development step with the use of a multi-tone mask, a resist mask with plural thicknesses (typically, two kinds of thicknesses) can be formed. Therefore, with the use of a multi-tone mask, the number of photomasks can be reduced.

Next, with the use of the resist mask 313, the first semiconductor film 306, the second semiconductor film 307, the impurity semiconductor film 309, and the conductive film 311 are etched. Through this process, the first semiconductor film 306, the second semiconductor film 307, the impurity semiconductor film 309, and the conductive film 311 are divided for each element to form a third semiconductor film 315, an impurity semiconductor film 317, and a conductive film 319. Note that the third semiconductor film 315 includes a microcrystalline semiconductor film 315a obtained by etching the first semiconductor film 306, a mixed region 315b obtained by etching the mixed region 307b of the second semiconductor film 307, and a region 315c including an amorphous semiconductor obtained by etching the region 307c including an amorphous semiconductor of the second semiconductor film 307 (see FIG. 17D).

Next, the resist mask 321 is reduced in its size to form separated resist masks 323. Ashing using oxygen plasma may be performed in order to reduce the size of the resist mask. Here, ashing is performed on the resist mask 313 so that the resist mask 323 is separated over the gate electrode. Accordingly, the resist mask 323 can be formed (see FIG. 18A).

Figure 18A:
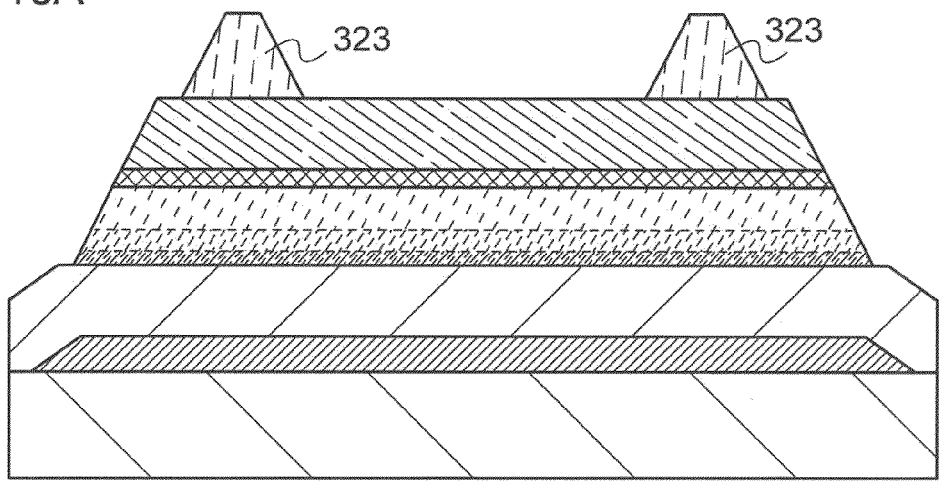
FIGS. 18A to 18C illustrate the embodiment of a method for manufacturing the thin film transistor.
Figure 18B:
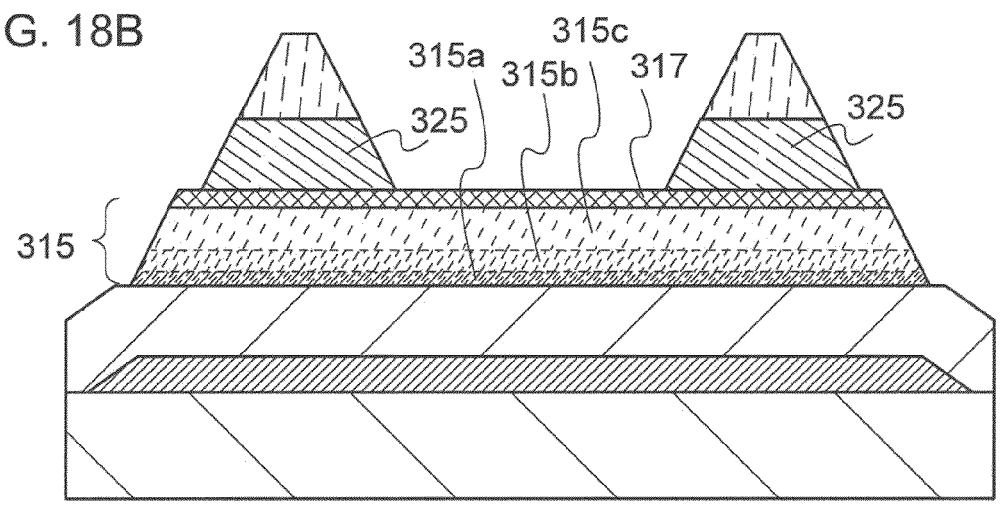
Figure 18C:
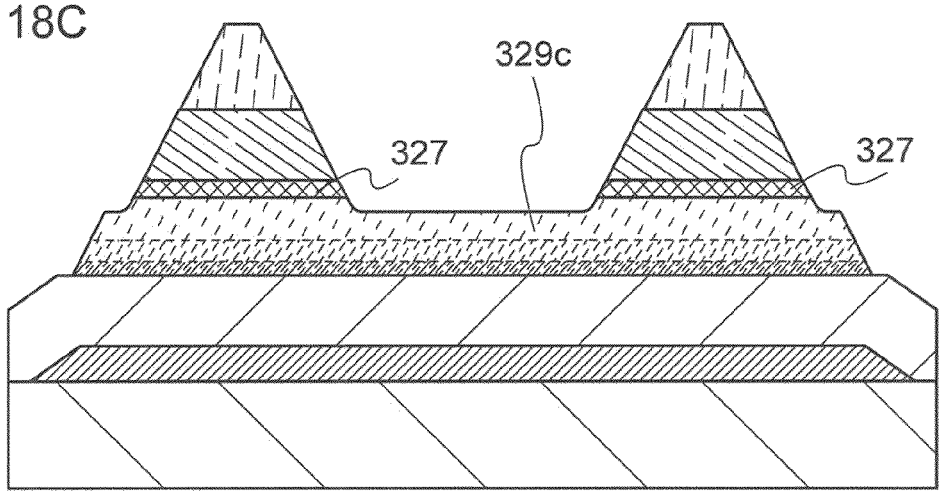

Next, the conductive film 319 is etched using the resist mask 323, whereby the wirings 325 serving as source and drain electrodes are formed (see FIG. 18B). Here, dry etching is employed. The wirings 325 serve not only as source and drain electrodes but also as a signal line. However, without limitation thereto, a signal line may be provided separately from the source and drain electrodes.

Next, with the use of the resist mask 323, the region 315c including an amorphous semiconductor of the third semiconductor film 315 and the impurity semiconductor film 317 are each partly etched. Here, dry etching is employed. Through this step, a region 329c including an amorphous semiconductor and has a depressed portion on the surface and impurity semiconductor films 327 serving as source and drain regions are formed (see FIG. 18C). After that, the resist masks 323 are removed.

Note that, here, the conductive film 319, the region 315c including an amorphous semiconductor, and the impurity semiconductor film 317 are each partly etched by dry etching, so that the conductive film 319 is isotropically etched; thus, the side surfaces of the wirings 325 are substantially aligned with the side surfaces of the impurity semiconductor films 327.

Note that the impurity semiconductor film 317 and the region 315c including an amorphous semiconductor may be partly etched after etching of the conductive film 319 and removal of the resist mask 323. In this etching, the impurity semiconductor film 317 is etched using the wirings 325, so that the side surfaces of the wirings 325 are substantially aligned with the side surfaces of the impurity semiconductor films 327.

Alternatively, the conductive film 319 may be subjected to wet etching and the region 315c including an amorphous semiconductor and the impurity semiconductor film 317 may be subjected to dry etching. The conductive film 319 is isotropically etched by the wet etching, so that the wirings 325 each side surface of which is on an inner side than the side surfaces of the resist mask 323 are formed. Then, a shape in which side surfaces of the impurity semiconductor films 327 are on the outer side of the side surfaces of the wirings 325 is formed.

Next, dry etching may be performed. A condition of dry etching is set so that a surface of an exposed portion of the region 329c including an amorphous semiconductor is not damaged and the etching rate with respect to the region 329c including an amorphous semiconductor is low. In other words, a condition which gives almost no damages to the exposed surface of the region 329c including an amorphous semiconductor and hardly reduces the thickness of the exposed region of the region 329c including an amorphous semiconductor is applied. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Next, the surface of the region 329c including an amorphous semiconductor may be subjected to plasma treatment, typified by water plasma treatment, ammonia plasma treatment, nitrogen plasma treatment, or the like.

The water plasma treatment can be performed by generating plasma using a gas containing water as its main component, typified by water vapor, which is introduced into the reaction space.

As described above, after the impurity semiconductor films 327 is formed, when dry etching is further performed under a condition which gives no damages to the region 329c including an amorphous semiconductor, an impurity such as a residue existing on the exposed surface of the region 329c including an amorphous semiconductor can be removed. By the plasma treatment, insulation between the source region and the drain region can be ensured, and thus, in a thin film transistor which is completed, off current can be reduced and variation in electric characteristics can be reduced.

Through the above steps, a thin film transistor having preferable electric characteristics can be manufactured using fewer masks with high productivity.

Embodiment 8

In this embodiment are described below an element substrate and a display device including the element substrate to which the thin film transistor described in Embodiments 6 and 7 can be applied. As examples of the display device, a liquid crystal display device, a light-emitting display device, electronic paper, and the like are given. The thin film transistor described in the above embodiment can be used for an element substrate of any other display devices. Here, a liquid crystal display device including the thin film transistor described in Embodiments 6 and 7, typically, a vertical alignment (VA) mode liquid crystal display device is described with reference to FIG. 22 and FIG. 23.

Figure 22:
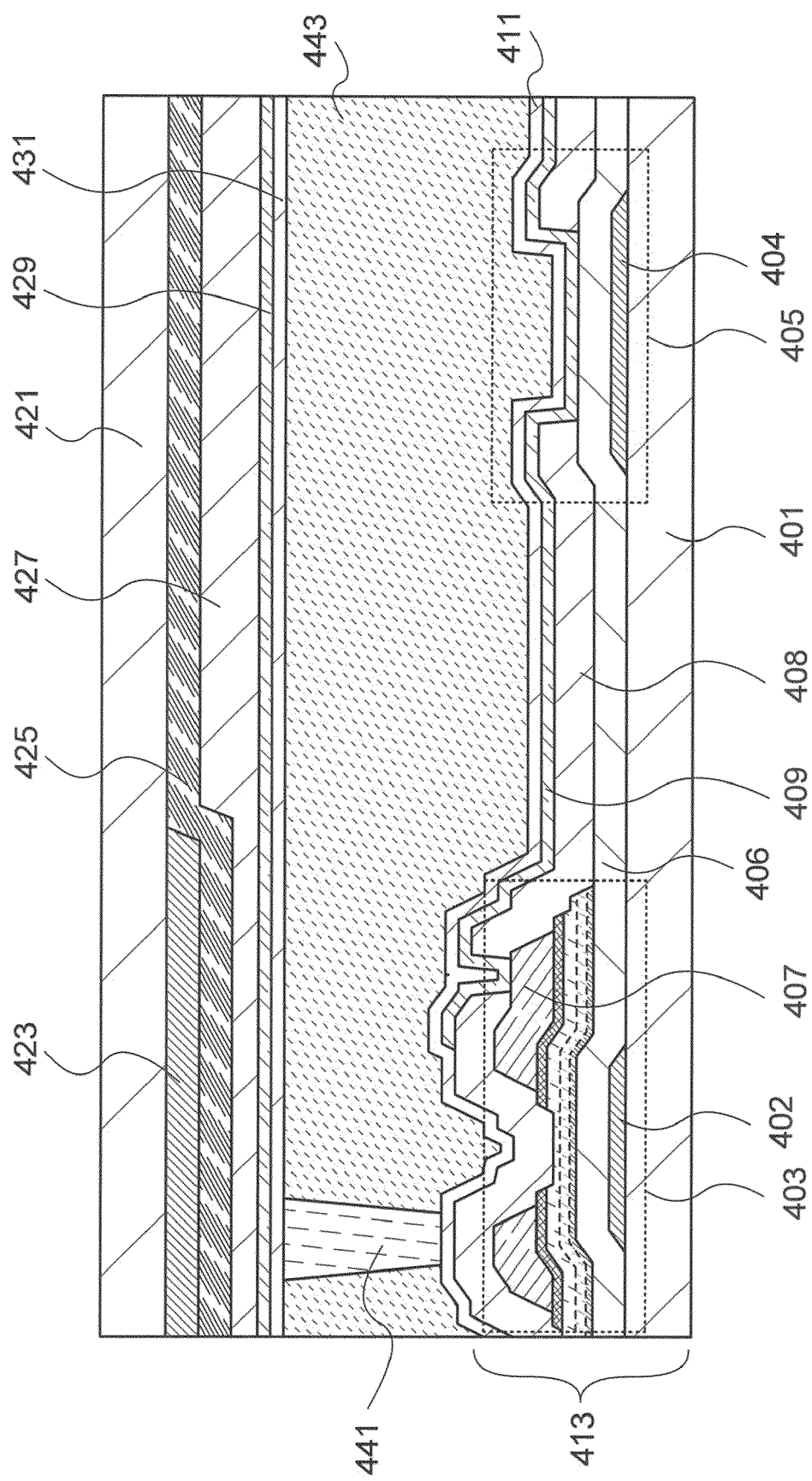
FIG. 22 illustrates a display device.

FIG. 22 illustrates a cross-sectional structure of a pixel portion of a liquid crystal display device. A thin film transistor 403 manufactured according to the above embodiment and a capacitor 405 are formed over a substrate 401. Further, a pixel electrode 409 is formed over an insulating film 408 which is formed over the thin film transistor 403. A source or drain electrode 407 of the thin film transistor 403 and the pixel electrode 409 are connected to each other in an opening formed in the insulating film 408. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 413.

A counter substrate 421 is provided with a coloring film 425 and a light-blocking film 423 for blocking incidence of light into the thin film transistor 403. In addition, a planarizing film 427 is formed on the light-blocking film 423 and the coloring film 425. A counter electrode 429 is formed on the planarizing film 427, and an alignment film 431 is formed on the counter electrode 429.

Note that the light-blocking film 423, the coloring film 425, and the planarizing film 427 on the counter substrate 421 function as a color filter. Note that one of or both the light-blocking film 423 and the planarizing film 427 are not necessarily formed on the counter substrate 421.

The coloring film has a function of preferentially transmitting light of a predetermined wavelength range, among light of a wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined for a color filter. However, the combination of the coloring films is not limited to the above combination.

The substrate 401 and the counter substrate 421 are fixed to each other by a sealing material (not illustrated), and a liquid crystal layer 443 fills a space surrounded by the substrate 401, the counter substrate 421, and the sealing material. Further, a spacer 441 is provided to keep a distance between the substrate 401 and the counter substrate 421.

The pixel electrode 409, the liquid crystal layer 443, and the counter electrode 429 are overlapped with each other, whereby a liquid crystal element is formed.

FIG. 23 illustrates a liquid crystal display device different from that in FIG. 22. Here, a coloring film is formed not on the counter substrate 421 side but over a substrate 401 provided with a thin film transistor 403.

FIG. 23 illustrates a cross-sectional structure of a pixel portion of a liquid crystal display device. The thin film transistor 403 manufactured according to the above embodiment and a capacitor 405 are formed over the substrate 401.

Further, a coloring film 451 is formed over the insulating film 408 which is formed over the thin film transistor 403. Further, a protective film 453 is formed over the coloring film 451 in order to prevent an impurity contained in the coloring film 451 from being mixed into a liquid crystal layer 443. A pixel electrode 409 is formed over the coloring film 451 and the protective film 453. As the coloring film 451, a film which preferentially transmits light of a predetermined wavelength range (red light, blue light, or green light) may be formed for each pixel. Further, since the coloring film 451 also functions as a planarizing film, uneven alignment of the liquid crystal layer 443 can be suppressed.

A source or drain electrode 407 of the thin film transistor 403 and the pixel electrode 409 are connected to each other in an opening formed in the insulating film 408, the coloring film 451, and the protective film 453. An alignment film 411 is formed over the pixel electrode 409.

The capacitor 405 includes a capacitor wiring 404 which is formed at the same time as a gate electrode 402 of the thin film transistor 403, a gate insulating film 406, and the pixel electrode 409.

A stack body including components from the substrate 401 to the alignment film 411 is referred to as an element substrate 455.

The counter substrate 421 is provided with a light-blocking film 423 for blocking incidence of light into the thin film transistor 403 and a planarizing film 427 covering the light-blocking film 423 and the counter substrate 421. A counter electrode 429 is formed on the planarizing film 427, and an alignment film 431 is formed on the counter electrode 429.

The pixel electrode 409, the liquid crystal layer 443, and the counter electrode 429 are overlapped with each other, whereby a liquid crystal element is formed.

Note that although the VA liquid crystal display device is described here as a liquid crystal display device, the present invention is not limited thereto. That is, an element substrate which is formed using the thin film transistor described in any of Embodiments 6 and 7 can also be applied to an FFS mode liquid crystal display device, an IPS mode liquid crystal display device, a TN mode liquid crystal display device, and other modes of liquid crystal display devices.

Since the thin film transistor with large on current, high field-effect mobility, and small off current is used as a pixel transistor in the liquid crystal display device of this embodiment, image quality (e.g., contrast) of the liquid crystal display device can be improved. Further, electric characteristics of the thin film transistor is not degraded even when the thin film transistor is downsized; therefore, by reducing the size of the thin film transistor, the aperture ratio of the liquid crystal display device can be increased. Alternatively, the area of a pixel can be reduced, so that resolution of the liquid crystal display device can be improved.

Further, in the liquid crystal display device illustrated in FIG. 23, the light-blocking film 423 and the coloring film 451 are not formed over the same substrate. Therefore, misalignment of a mask in formation of the coloring film 451 can be prevented. Accordingly, the area of the light-blocking film 423 is not necessarily increased, which can increase the aperture ratio of the pixel.

Embodiment 9

By being provided with a light-emitting element without formation of the alignment film 411, the element substrates 413 and 455 described in Embodiment 8 can be used for a light-emitting display device or a light-emitting device. In a light-emitting display device or a light-emitting device, a light-emitting element utilizing electroluminescence is typically used as a light-emitting element. Light-emitting elements utilizing electroluminescence are classified according to whether a light-emitting material is an organic compound or an inorganic compound. In general, the former is referred to as organic EL elements and the latter as inorganic EL elements.

In the light-emitting display device or the light-emitting device of this embodiment, a thin film transistor with large on-current, high field-effect mobility, and small off-current is used as a pixel transistor; therefore, the light-emitting display device or the light-emitting device can have favorable image quality (for example, high contrast) and low power consumption.

Embodiment 10

A display device including the thin film transistor according to any of the above embodiments can be applied to a variety of electronic devices (including an amusement machine). Examples of the electronic devices are a television device (also referred to as a television or a television receiver), a monitor of a computer or the like, electronic paper, a camera such as a digital camera or a digital video camera, a digital photo frame, a mobile phone (also referred to as a mobile telephone or a mobile phone device), a portable game console, a portable information terminal, an audio reproducing device, a large-sized game machine such as a pachinko machine, and the like. In particular, as described in Embodiments 8 and 9, the thin film transistor according to any of the above embodiments can be applied to a liquid crystal display device, a light-emitting device, an electrophoretic display device, or the like and thus can be used for a display portion of an electronic device. Specific examples will be described below.

A semiconductor device including the thin film transistor according to any of the above embodiments can be applied to electronic paper. An electronic paper can be used for electronic devices of a variety of fields as long as they can display data. For example, electronic paper can be applied to an electronic book (e-book) device, a poster, an advertisement in a vehicle such as a train, a digital signage, a public information display (PID), displays of various cards such as a credit card, and the like. Examples of such electronic devices are illustrated in FIGS. 24A to 24D.

Figure 24A:
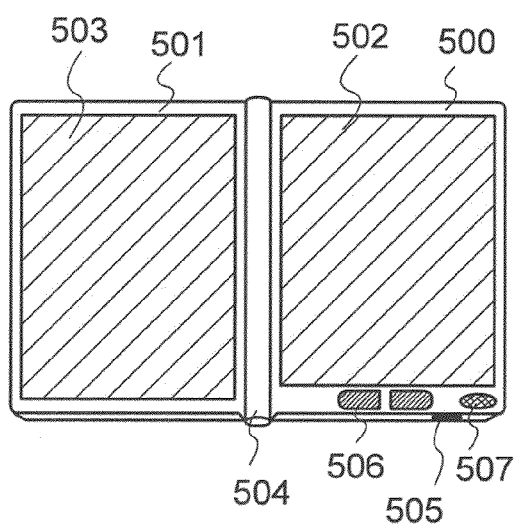
FIGS. 24A to 24D each illustrate an electronic device to which the thin film transistor is applied.

FIG. 24A illustrates an example of the electronic book device. For example, the electronic book device includes two housings, a housing 500 and a housing 501. The housing 500 and the housing 501 are combined with a hinge 504 so that the electronic book device can be opened and closed. With such a structure, the electronic book device can operate like a paper book.

A display portion 502 and a display portion 503 are incorporated in the housing 500 and the housing 501, respectively. The display portion 502 and the display portion 503 may be configured to display one image or different images. In the case where the display portion 502 and the display portion 503 display different images, for example, a display portion on the right side (the display portion 502 in FIG. 24A) can display text and a display portion on the left side (the display portion 503 in FIG. 24A) can display graphics.

FIG. 24A illustrates an example in which the housing 500 is provided with an operation portion and the like. For example, the housing 500 is provided with a power source 505, an operation key 506, a speaker 507, and the like. With the operation key 506, pages can be turned. Note that a keyboard, a pointing device, and the like may be provided on the same surface as the display portion of the housing. Furthermore, an external connection terminal (an earphone terminal, a USB terminal, a terminal that can be connected to various cables including an AC adapter and a USB cable, or the like), a recording medium insertion portion, and the like may be provided on the back surface or the side surface of the housing. Further, the electronic book device illustrated in FIG. 24A may have a function of an electronic dictionary.

The electronic book device illustrated in FIG. 24A may transmit and receive data wirelessly. Through wireless communication, desired book data or the like can be purchased and downloaded from an electronic book server.

Figure 24B:
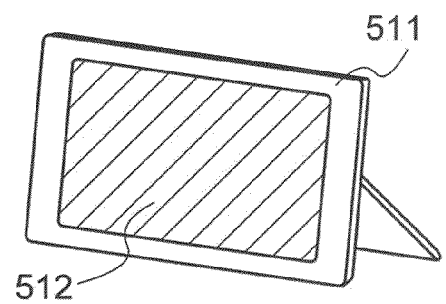

FIG. 24B illustrates an example of the digital photo frame. For example, in the digital photo frame of FIG. 24B, a display portion 512 is incorporated in a housing 511. Various images can be displayed in the display portion 512. For example, the display portion 512 can display data of an image shot by a digital camera or the like to function as a normal photo frame.

Note that the digital photo frame illustrated in FIG. 24B may be provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame. For example, a storage medium having image data taken with a digital camera is inserted into the storage medium inserting portion of the digital photo frame and the image data is imported, whereby the imported image data can be displayed on the display portion 512.

Further, the digital photo frame illustrated in FIG. 24B may transmit and receive data wirelessly. The structure may be employed in which desired image data is transferred wirelessly and displayed.

Figure 24C:
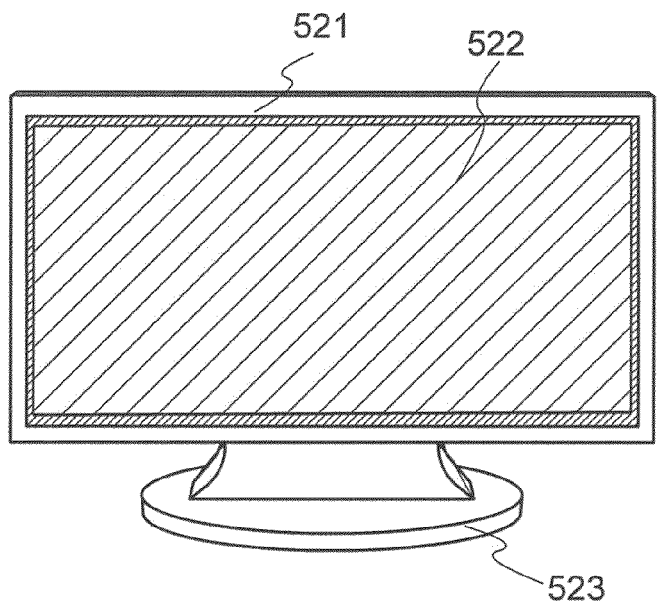

FIG. 24C illustrates an example of the television device. In the television set illustrated in FIG. 24C, a display portion 522 is incorporated in a housing 521. The display portion 522 can display an image. Further, the housing 521 is supported by a stand 523 here. The display device described in Embodiment 8 or 9 can be applied to the display portion 522.

The television device can be operated with an operation switch of the housing 521 or a separate remote controller. Channels and volume can be controlled with an operation key of the remote controller so that an image displayed in the display portion 522 can be controlled. Further, the remote controller may be provided with a display portion for displaying data outputted from the remote controller.

Note that the television device may be provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 24D:
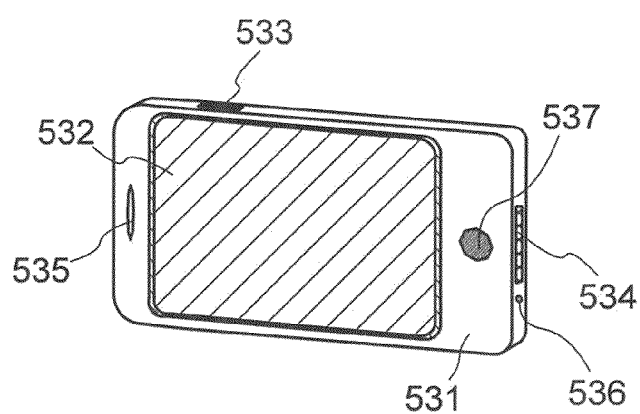

FIG. 24D illustrates an example of the mobile phone. The mobile phone is provided with a display portion 532 incorporated in a housing 531, an operation button 533, an operation button 537, an external connection port 534, a speaker 535, a microphone 536, and the like. Any of the display devices described in Embodiments 8 and 9 can be applied to the display portion 532.

The display portion 532 of the mobile phone illustrated in FIG. 24D is a touch panel. When the display portion 532 is touched with a finger or the like, contents displayed in the display portion 532 can be controlled. Further, operations such as making calls and composing mails can be performed by touching the display portion 532 with a finger or the like.

There are mainly three screen modes for the display portion 532. The first mode is a display mode mainly for displaying images. The second mode is an input mode mainly for inputting data such as text. The third mode is a display-and-input mode in which two modes of the display mode and the input mode are combined.

For example, in the case where a call is made or a mail is composed, a text input mode mainly for inputting text is selected for the display portion 532 so that characters displayed on a screen can be inputted. In that case, it is preferable to display a keyboard or number buttons on a large area of the screen of the display portion 532.

When a detection device including a sensor for detecting inclination, such as a gyroscope or an acceleration sensor, is provided inside the mobile phone, the mode (display data) of the display portion 532 can be automatically switched by determining the orientation of the mobile phone (whether the mobile phone is placed horizontally or vertically).

The screen modes are switched by touching the display portion 532 or using the operation button 537 of the housing 531. Alternatively, the screen modes can be switched depending on kinds of images displayed in the display portion 532. For example, when a signal of an image displayed in the display portion is the one of moving image data, the screen mode can be switched to the display mode. When the signal is the one of text data, the screen mode can be switched to the input mode.

Further, in the input mode, when input by touching the display portion 532 is not performed for a certain period of time while a signal detected by an optical sensor in the display portion 532 is detected, the screen mode may be controlled so as to be switched from the input mode to the display mode.

The display portion 532 can also function as an image sensor. For example, an image of a palm print, a fingerprint, or the like is taken by an image sensor when the display portion 532 is touched with a palm or a finger, whereby personal authentication can be performed. Further, by providing a backlight or a sensing light source which emits near-infrared light in the display portion, an image of a finger vein, a palm vein, or the like can be taken.

This embodiment can be implemented in appropriate combination with any of the structures described in the other embodiments.

Example 1

In this example will be described results obtained using computer simulation to examine a state where crystallinity of a microcrystalline semiconductor film is improved due to a high-pressure condition or an argon doping condition. Specifically, comparison results of the densities calculated in hydrogen radical densities in different pressures and using different gas species are shown. Note that multi-physics analysis software CFD-ACE+ manufactured by CFD Research Corporation was used for the calculation.

As a model of a film formation apparatus for the calculation, a parallel plate capacitive coupling CVD apparatus was assumed. A schematic structure of the film formation apparatus is illustrated in FIG. 25. An upper electrode 1000 (may also be referred to as an RF electrode) is connected to a high-frequency power source 1020 through a capacitor 1010. A lower electrode 1002 which functions as a substrate stage is grounded.

Figure 26:
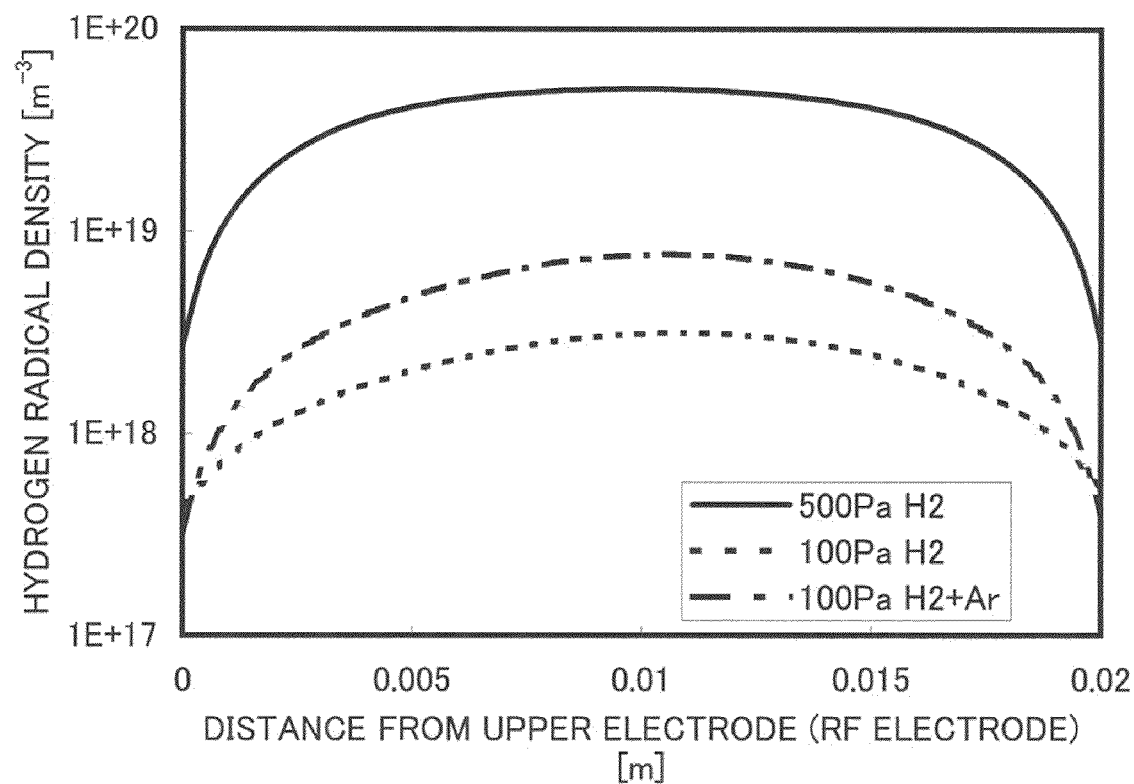
FIG. 26 shows hydrogen radical density.

The hydrogen radical densities obtained by the calculation are shown in FIG. 26. In FIG. 26, the horizontal axis represents a distance (m) from the upper electrode, and the vertical axis represents hydrogen radical density ($m^{-3}$). From FIG. 26, it is apparent that the hydrogen radical density is higher in the case where a high-pressure condition (500 Pa, $H_2$) is used than in the case where a low-pressure condition (100 Pa, $H_2$) is used. This is due to a collision dissociation rate of hydrogen which is higher in the case where the higher-pressure condition is used than in the case where the low-pressure condition is used.

In addition, it is apparent that the hydrogen radical density of a mixed gas to which argon is added (100 Pa, $H_2$+Ar) is higher than that of hydrogen alone (100 Pa, $H_2$). Since density of hydrogen molecules is reduced by adding argon, a collision dissociation rate of hydrogen is reduced; however, it is considered that decomposition of hydrogen is promoted by reactions below in a gas phase and thus the hydrogen radical density is increased.

  (1)

  (2)

  (3)

  (4)

  (5)

  (6)

  (7)

Reaction between hydrogen radicals is promoted by increasing the hydrogen radical density. Then, excess energy is released by the reaction and thus a heating effect is generated on a reaction surface. For example, in the case where the reaction is generated on a surface of a higher-order radical $(SiH_n)_x$ (n=1, 2, 3), the crystallinity of the higher-order radical is improved by the excess energy.

As described above, the hydrogen density largely affects generation of a crystal nucleus having favorable crystallinity. It is found that the results of the above calculation reveal that crystallinity of a microcrystalline semiconductor film is improved by increasing hydrogen radical density.

Example 2

Figure 27A:
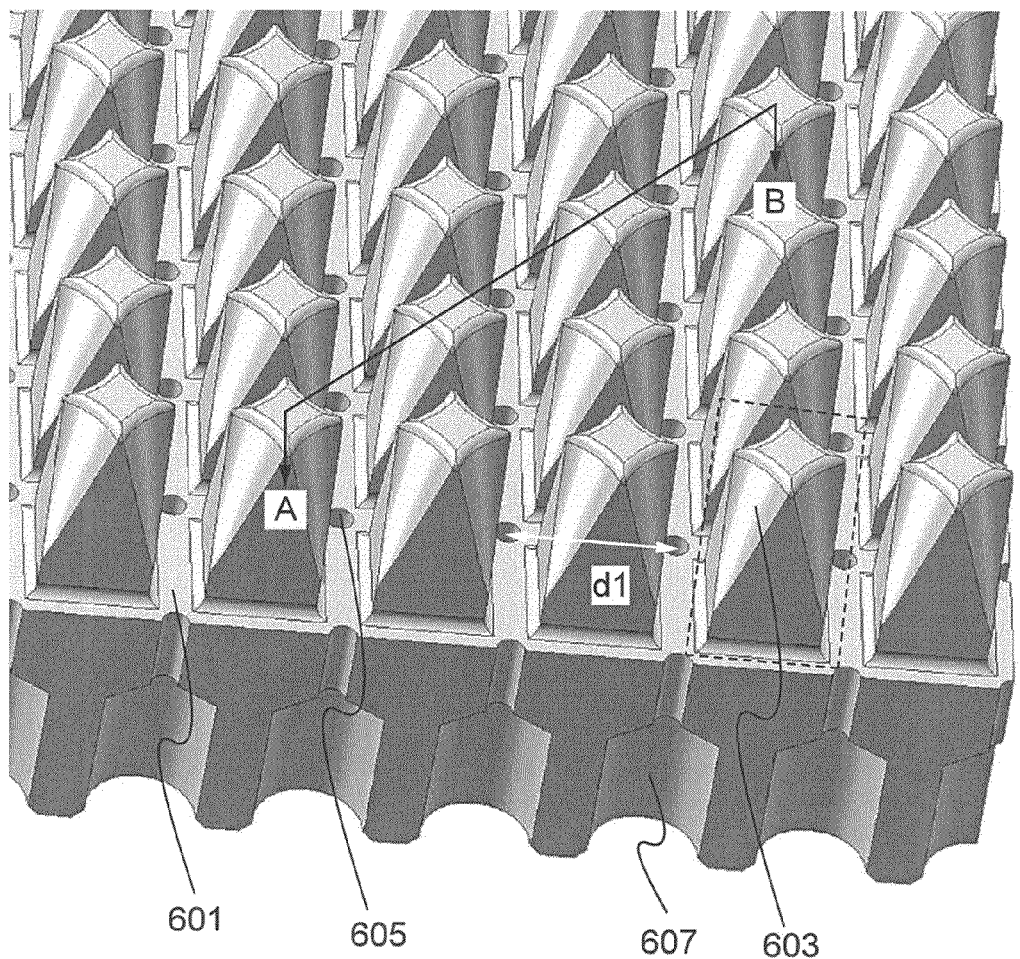
FIGS. 27A and 27B illustrate a shape of an upper electrode of the plasma CVD apparatus.
Figure 27B:
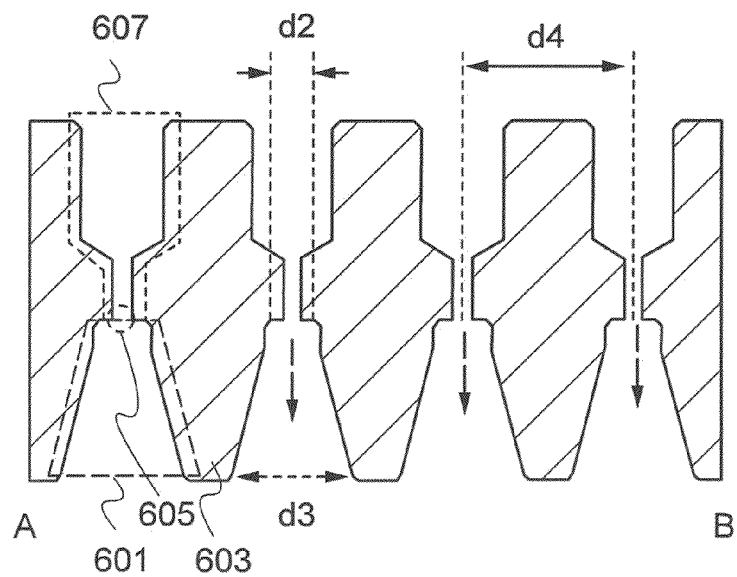
Figure 28:
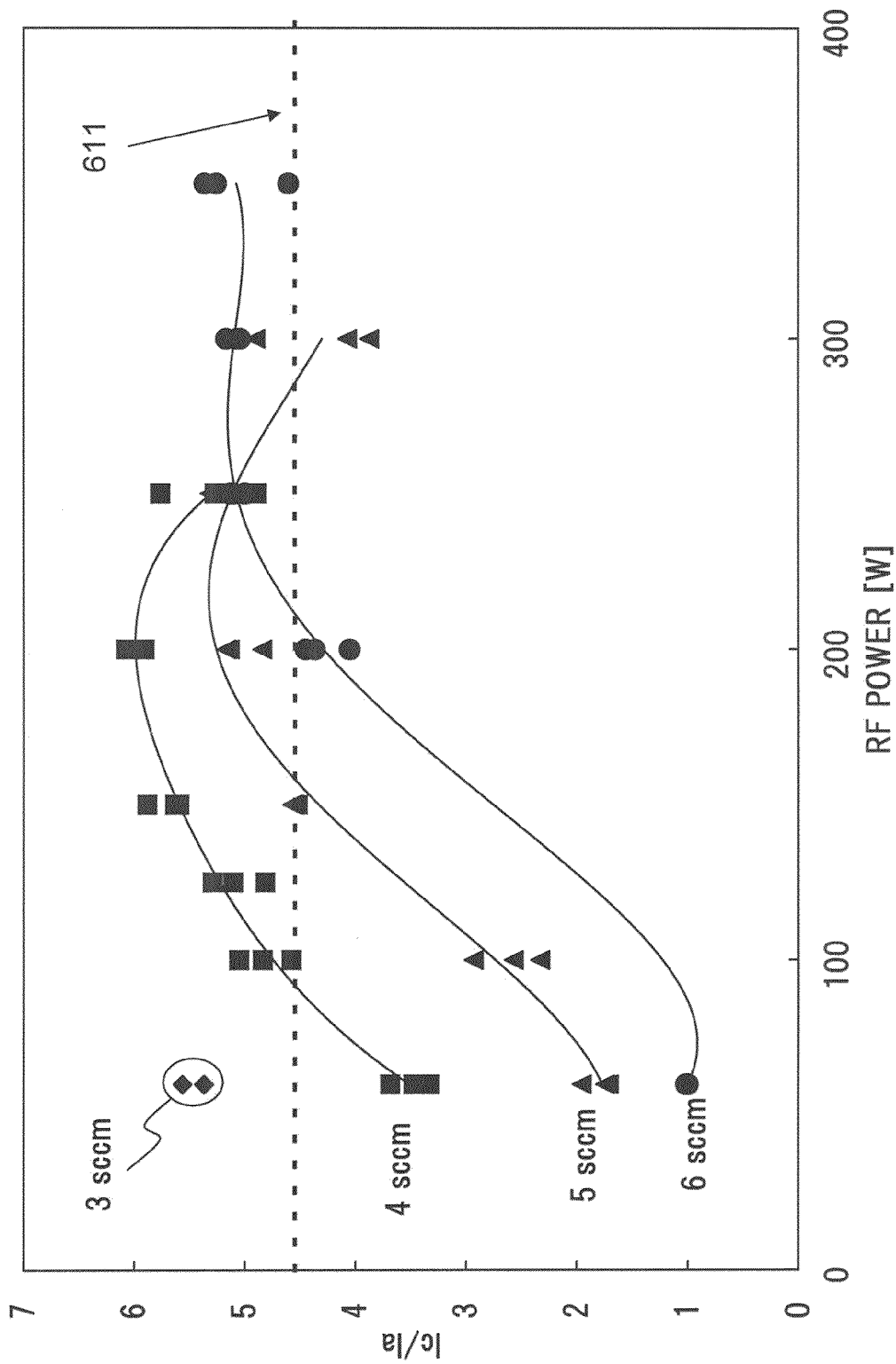
FIG. 28 shows crystallinity of a microcrystalline silicon film.

In this example is described a microcrystalline silicon film formed using a plasma CVD apparatus having the first electrode 101, the shape of which is as illustrated in FIGS. 6A and 6B of Embodiment 2, with reference to FIGS. 27A and 27B and FIG. 28.

First, the shape of the first electrode 101 which is used in this example is described in detail. FIG. 27A illustrates a perspective view of the first electrode 101 seen from the second electrode side, which is used in this example, and FIG. 27B illustrates a cross-sectional view taken along line A-B in FIG. 27A. Note that in FIG. 27A, the first electrode 101 is seen from the second electrode side; therefore, hollow portions 607 are placed on the lower side. In addition, in FIG. 27B, the hollow portions 607 are placed on the upper side, and gas flows in arrow directions.

As illustrated in FIG. 27A, projected portions 603 which are separated on a depressed portion 601 which forms a common plane are formed. In addition, the depressed portion 601 is provided with gas supply ports 605. Moreover, a distance d1 between the adjacent gas supply ports 605 in the depressed portion 601 was 3 mm.

As illustrated in FIG. 27B, in a cross section taken along line A-B where the projected portion 603 and the gas supply port 605 are arranged alternately, a width d2 of a plane where the gas supply port 605 is formed was 1.4 mm, a distance d3 between apexes of the adjacent projected portions 603 was 3.1 mm, and a distance d4 between the gas supply ports 605 was 4.2 mm.

Next, FIG. 28 illustrates relations of crystallinity of microcrystalline silicon films which were formed in a reaction chamber of a plasma CVD apparatus provided with the first electrode 101 as illustrated in FIGS. 27A and 27B.

Here, each microcrystalline silicon film was formed over a substrate under the following conditions: silane, 750 sccm of hydrogen, and 750 sccm of argon were introduced into the reaction chamber; a substrate temperature was set to 250° C.; the pressure of the reaction chamber was set to 1237 Pa; a distance between the surface of the projected portion of the first electrode 101 and the substrate was set to 7 mm; and a high frequency of 13.56 MHz was supplied to the first electrode. At this time, the flow rates of silane were set to 3 sccm, 4 sccm, 5 sccm, and 6 sccm. In addition, the electric power of the high-frequency power source varied in 50 W increments in the range of 50 W to 350 W. Moreover, the thicknesses of the microcrystalline silicon films were in the range of 21 nm to 37 nm depending on samples.

Here, film formation conditions of a conventional microcrystalline silicon film which is a comparative example are described below. The microcrystalline silicon film was formed over a substrate under the following conditions: 10 sccm of silane, 1500 sccm of hydrogen, and 1500 sccm of argon were introduced into the reaction chamber; a substrate temperature was set to 280° C.; the pressure of the reaction chamber was set to 280 Pa; a distance between a first electrode 101 (a parallel plate) and the substrate was set to 24.5 mm; and a high frequency of 13.56 MHz was supplied to the first electrode. At this time, the electric power of the high-frequency power source was set to 50 W.

Next, regarding the microcrystalline silicon film, crystallinity (Ic/Ia:a ratio of the height of a crystal peak to the height of an amorphous peak) was measured by a Raman spectroscopic analysis. As the Raman spectroscopic analysis, LabLAM HR-PL (manufactured by Horiba, Ltd.) was used. Further, as the measurement conditions, the focal length was set to 800 mm, grading was set to 600 gr/mm, YAG solid-state laser light ($\lambda$=532 nm) was used as excitation light, and a CCD detector the detection wavelength range of which at −70° C. is 200 nm to 1000 nm was used. Moreover, the spot diameter of the excited light was set to 0.75 μm.

In FIG. 28, a rhombus represents crystallinity of a microcrystalline silicon film when the flow rate of silane was set to 3 sccm, a square represents crystallinity of a microcrystalline silicon film when the flow rate of silane was set to 4 sccm, a triangle represents crystallinity of a microcrystalline silicon film when the flow rate of silane was set to 5 sccm, and a circle represents crystallinity of a microcrystalline silicon film when the flow rate of silane was set to 6 sccm.

In addition, a dashed line 611 represents the crystallinity (Ic/Ia) of the conventional microcrystalline silicon film which is a comparative example.

It is apparent from FIG. 28 that the crystallinity of the microcrystalline silicon films tends to take a maximum value with respect to the electric power of the high-frequency power source, and the peak positions thereof are different depending on the respective flow rates of silane. Under a higher dilution condition where the flow rate of silane is lower, the maximum value of Ic/Ia is shifted on a lower power side, and thus crystallinity of a microcrystalline silicon film becomes higher. Moreover, the crystallinity of each microcrystalline silicon film can be improved by increasing the pressure and increasing the electric power of the high-frequency power source as compared to the film formation conditions of the conventional microcrystalline silicon film.

This application is based on Japanese Patent Applications serial No. 2009-194801, 2009-194852, and 2009-194849 each filed with the Japan Patent Office on Aug. 25, 2009, the entire contents of which are hereby incorporated by reference.

What is claimed is:

1. A method for manufacturing a microcrystalline semiconductor film, comprising the steps of:
    forming a plasma region between a first electrode and a second electrode by supplying high-frequency power of 60 MHz or less to the first electrode under a condition where a pressure of a reactive gas in a reaction chamber of a plasma CVD apparatus is set to greater than or equal to 450 Pa and less than or equal to 13332 Pa, and a distance between the first electrode and the second electrode of the plasma CVD apparatus is set to greater than or equal to 1 mm and less than or equal to 20 mm;
    forming crystalline deposition precursors in a gas phase including the plasma region;
    forming a crystal nucleus of greater than or equal to 5 nm and less than or equal to 15 nm by depositing the crystalline deposition precursors over a substrate; and
    forming a microcrystalline semiconductor film by growing a crystal from the crystal nucleus.

2. The method for manufacturing a microcrystalline semiconductor film according to claim 1, wherein an electron temperature in the plasma region is reduced and an electron density in the plasma region is increased by adding a rare gas to the reactive gas, so that crystallinity of the microcrystalline semiconductor film is improved.

3. The method for manufacturing a microcrystalline semiconductor film according to claim 1, further comprising the steps of:
    forming a gate electrode over the substrate;
    forming a gate insulating layer over the gate electrode;
    forming the microcrystalline semiconductor layer over the gate insulating layer; and
    forming a wiring electrically connected to the microcrystalline semiconductor layer.

4. A method for manufacturing a microcrystalline semiconductor film, using a plasma CVD apparatus provided with a first electrode and a second electrode in a reaction chamber, comprising the steps of:
    introducing a reactive gas into the reaction chamber through a gas supply port in the first electrode provided with a plurality of projected portions;
    setting a pressure of the reaction chamber to greater than or equal to 450 Pa and less than or equal to 13332 Pa;
    setting a distance between the first electrode and the second electrode to greater than or equal to 1 mm and less than or equal to 20 mm;

forming a plasma region between the first electrode and the second electrode by supplying high-frequency power of 60 MHz or less to the first electrode;

forming crystalline deposition precursors including a semiconductor in a gas phase including the plasma region;

forming a crystal nucleus of greater than or equal to 5 nm and less than or equal to 15 nm by depositing the crystalline deposition precursors over a substrate; and forming a microcrystalline semiconductor film by growing a crystal from the crystal nucleus.

5. The method for manufacturing a microcrystalline semiconductor film according to claim 4, wherein the gas supply port is provided between the plurality of projected portions.

6. The method for manufacturing a microcrystalline semiconductor film according to claim 4, wherein the gas supply port is provided on an apex of the plurality of projected portions.

7. The method for manufacturing a microcrystalline semiconductor film according to claim 4, wherein an electron temperature in the plasma region is reduced and an electron density in the plasma region is increased by adding a rare gas to the reactive gas, so that crystallinity of the microcrystalline semiconductor film is improved.

8. The method for manufacturing a microcrystalline semiconductor film according to claim 4, further comprising the steps of:
   forming a gate electrode over the substrate;
   forming a gate insulating layer over the gate electrode;
   forming the microcrystalline semiconductor layer over the gate insulating layer; and
   forming a wiring electrically connected to the microcrystalline semiconductor layer.

9. A method for manufacturing a microcrystalline semiconductor film, using a plasma CVD apparatus provided with an upper electrode and a lower electrode in a reaction chamber, comprising the steps of:
   introducing a reactive gas into the reaction chamber;
   setting a pressure of the reaction chamber to greater than or equal to 450 Pa and less than or equal to 13332 Pa;
   forming a plasma region between the upper electrode and the lower electrode by supplying high-frequency power of 60 MHz or less to the upper electrode;
   forming crystalline deposition precursors in a gas phase including the plasma region;
   forming a crystal nucleus of greater than or equal to 5 nm and less than or equal to 15 nm by depositing the crystalline deposition precursors over a substrate; and
   growing a crystal from the crystal nucleus,
   wherein the upper electrode comprises:
      a plurality of projected portions for forming glow discharge plasma in the reaction chamber by supplying the high-frequency power;
      a first gas supply port provided on an apex of the plurality of projected portions; and
      a second gas supply port provided between the plurality of projected portions,
      wherein the plurality of projected portions have a tapered shape and are chamfered, and
   wherein a distance between the upper electrode and the lower electrode is greater than or equal to 1 mm and less than or equal to 20 mm.

10. The method for manufacturing a microcrystalline semiconductor film according to claim 9, wherein an electron temperature in the glow discharge plasma is reduced and an electron density in the glow discharge plasma is increased by adding a rare gas to the reactive gas, so that crystallinity of the microcrystalline semiconductor film is improved.

11. The method for manufacturing a microcrystalline semiconductor film according to claim 9, further comprising the steps of:
   forming a gate electrode over the substrate;
   forming a gate insulating layer over the gate electrode;
   forming the microcrystalline semiconductor layer over the gate insulating layer; and
   forming a wiring electrically connected to the microcrystalline semiconductor layer.

* * * * *